US011853520B2

(12) United States Patent
Seo et al.

(10) Patent No.: US 11,853,520 B2
(45) Date of Patent: Dec. 26, 2023

(54) ELECTRONIC DEVICE

(71) Applicant: SAMSUNG DISPLAY CO., LTD., Yongin-si (KR)

(72) Inventors: Eunsol Seo, Yongin-si (KR); Hyun-Wook Cho, Seongnam-si (KR); Jaewoo Choi, Seoul (KR); Taejoon Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/751,515

(22) Filed: May 23, 2022

(65) Prior Publication Data

US 2022/0283675 A1    Sep. 8, 2022

Related U.S. Application Data

(63) Continuation of application No. 17/140,993, filed on Jan. 4, 2021, now Pat. No. 11,340,746, which is a (Continued)

(30) Foreign Application Priority Data

Nov. 16, 2018    (KR) ........................ 10-2018-0142068

(51) Int. Cl.
*G06F 3/044* (2006.01)
*G06F 3/045* (2006.01)
*G06F 3/041* (2006.01)

(52) U.S. Cl.
CPC ............ *G06F 3/0446* (2019.05); *G06F 3/045* (2013.01); *G06F 3/0416* (2013.01); (Continued)

(58) Field of Classification Search
CPC .... G06F 3/0446; G06F 3/0443; G06F 3/0416; G06F 3/045; G06F 2203/04107; (Continued)

(56) References Cited

U.S. PATENT DOCUMENTS 8,633,915 B2    1/2014 Hotelling et al.
2015/0091859 A1    4/2015 Rosenberg et al.
(Continued)

FOREIGN PATENT DOCUMENTS

| KR | 10-1517458 B1 | 5/2015 |
| KR | 10-2016-0095594 A | 8/2016 |
| KR | 10-2017-0111827 A | 10/2017 |

OTHER PUBLICATIONS

EPO Partial Search Report dated Apr. 17, 2020, for corresponding European Patent Application No. 19208669.2 (9 pages).
(Continued)

*Primary Examiner* — Abdul-Samad A Adediran
(74) *Attorney, Agent, or Firm* — Lewis Roca Rothgerber Christie LLP

(57) ABSTRACT

An electronic device includes a display unit including an active area configured to display an image, a peripheral area adjacent to the active area, and an input sensing unit disposed on the display unit within the active area. The input sensing unit includes a first sensing electrode disposed in the active area and a second sensing electrode spaced apart from the first sensing electrode and disposed in the active area.

15 Claims, 34 Drawing Sheets

Related U.S. Application Data continuation of application No. 16/576,609, filed on Sep. 19, 2019, now Pat. No. 10,884,568.

(52) U.S. Cl.
CPC .. *G06F 3/0443* (2019.05); *G06F 2203/04107* (2013.01); *G06F 2203/04111* (2013.01); *G06F 2203/04112* (2013.01)

(58) Field of Classification Search
CPC .. G06F 2203/04111; G06F 2203/04112; G06F 3/0412; G06F 3/0445
See application file for complete search history.

(56) References Cited

U.S. PATENT DOCUMENTS

| | | |
|---|---|---|
| 2015/0160758 A1 | 6/2015 | Chen |
| 2016/0216838 A1 | 7/2016 | Aina et al. |
| 2016/0291780 A1 | 10/2016 | Namkung |
| 2017/0185224 A1 | 6/2017 | Nagata et al. |
| 2017/0287992 A1 | 10/2017 | Kwak et al. |
| 2017/0293378 A1* | 10/2017 | Ahn ............... G06F 3/0445 |
| 2018/0032196 A1 | 2/2018 | Lin et al. |
| 2018/0081219 A1 | 3/2018 | Kim |
| 2018/0107330 A1 | 4/2018 | Meng |
| 2018/0173349 A1 | 6/2018 | Cho et al. |
| 2018/0190734 A1 | 7/2018 | Kang et al. |
| 2018/0196564 A1 | 7/2018 | Lin et al. |
| 2018/0315357 A1 | 11/2018 | Nam et al. |
| 2019/0018257 A1 | 1/2019 | Namkung |
| 2019/0079622 A1* | 3/2019 | Choi ............... G06F 3/0412 |
| 2019/0235265 A1 | 8/2019 | Namkung |
| 2019/0339816 A1 | 11/2019 | Hsu et al. |
| 2020/0159369 A1 | 5/2020 | Seo et al. |
| 2020/0167041 A1 | 5/2020 | Jeong et al. |
| 2021/0026498 A1 | 1/2021 | Moy et al. |
| 2021/0132740 A1 | 5/2021 | Seo et al. |
| 2023/0091647 A1 | 3/2023 | Park et al. |

OTHER PUBLICATIONS

U.S. Office Action dated Sep. 1, 2021, issued in U.S. Appl. No. 16/667,785 (17 pages).

U.S. Office Action dated May 11, 2023, issued in U.S. Appl. No. 18/062,003 (10 pages).

* cited by examiner

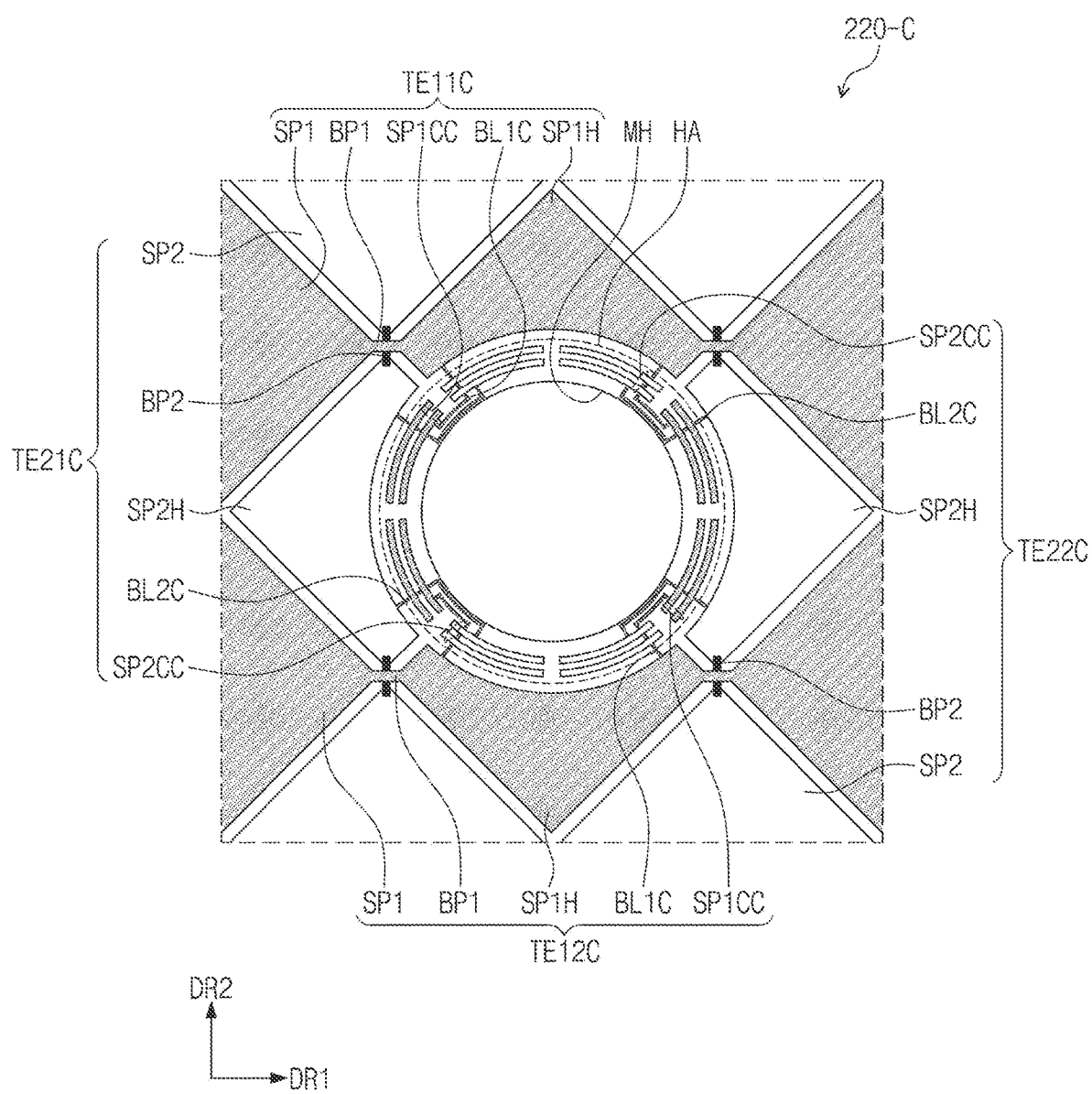

ELECTRONIC DEVICE

CROSS-REFERENCE TO RELATED APPLICATIONS

This application is a continuation of U.S. patent application Ser. No. 17/140,993, filed Jan. 4, 2021, which is a continuation of U.S. patent application Ser. No. 16/576,609, filed Sep. 19, 2019, now U.S. Pat. No. 10,884,568, which claims priority to and the benefit of Korean Patent Application No. 10-2018-0142068, filed Nov. 16, 2018, the entire content of all of which is incorporated herein by reference.

BACKGROUND

One or more aspects of the present disclosure herein are related to an electronic device, for example, to an electronic device that detects an external input, and in which a through hole is defined.

An electronic device is activated (e.g., powered and/or controlled) by an electrical signal. An electronic device may include various electronic components, such as a display unit displaying an image, or a detection unit detecting an external input. The electronic components may be electrically interconnected by variously arranged signal lines.

A display unit may include a light emitting element for generating an image. The detection unit may include sensing electrodes for detecting an external input. The sensing electrodes may be disposed in a region referred to as an active area. The detection unit may be designed to provide substantially even (e.g., substantially uniform) sensitivity to the entire active area.

SUMMARY

One or more embodiments of the present disclosure are directed toward an electronic device capable of providing substantially even (e.g., substantially uniform) sensitivity to external inputs over the area within the active area.

One or more example embodiments of the present disclosure provide an electronic device including: a display unit including an active area configured to display an image and a peripheral area adjacent to the active area; and an input sensing unit disposed (e.g., positioned) on the display unit and including a first sensing electrode disposed in the active area and a second sensing electrode spaced apart from the first sensing electrode and disposed in the active area, wherein a hole penetrating the display unit and the input sensing unit is defined in the active area, wherein the first sensing electrode includes a first main pattern, a first adjacent pattern adjacent to the hole and having an area smaller than that of the first main pattern, a first connection pattern connected to the first main pattern, and a first compensation pattern adjacent to the hole and electrically connected to the first adjacent pattern, wherein the second sensing electrode includes a second main pattern spaced apart from the first main pattern, a second adjacent pattern adjacent to the hole and having an area smaller than that of the second main pattern, a second connection pattern connected to the second main pattern and disposed on a layer different from the first connection pattern and a second compensation pattern adjacent to the hole and spaced from the first compensation pattern and electrically connected to the second adjacent pattern, wherein the first compensation pattern is disposed between the second adjacent pattern and the hole and the second compensation pattern is disposed between the first adjacent pattern and the hole.

In an embodiment, each of the first compensation pattern and the second compensation pattern may include: a first part extending along an edge of the hole; and a second part bent from the first part and connected to a corresponding pattern selected from the first adjacent pattern or the second adjacent pattern.

In an embodiment, the second part may be integrally provided with the corresponding first or second adjacent pattern connected to the second part.

In an embodiment, the first sensing electrode may further include a first connection line connecting the first compensation pattern and the first adjacent pattern, wherein the second sensing electrode may further include a second connection line connecting the second compensation pattern and the second adjacent pattern.

In an embodiment, the first connection line and the second connection line may be disposed spaced apart from each other on the same layer.

In an embodiment, the first connection line and the second connection line may be disposed on the same layer as the first compensation pattern and the second compensation pattern.

In an embodiment, the first connection line may include a plurality of first lines spaced apart from each other with the second compensation pattern therebetween and a first connection pattern disposed on a layer different from the first lines and overlapping the second compensation pattern in a plan view, wherein the first lines may be electrically connected to each other through the first connection pattern.

In an embodiment, the first connection pattern may extend along a direction crossing the second compensation pattern In an embodiment, the first connection pattern may be disposed on the same layer as any one of the first connection pattern and the second connection pattern.

In an embodiment, at least a portion of the first connection line may pass between the first compensation pattern and the second compensation pattern.

In an embodiment, the first connection line and the second connection line may be disposed on a layer different from the first compensation pattern and the second compensation pattern, wherein the first compensation pattern and the first adjacent pattern may be connected to the first connection line through an insulating layer, wherein the second compensation pattern and the second adjacent pattern may be connected to the second connection line through the insulating layer.

In an embodiment, the first connection line and the second connection line may be disposed on a layer different from the first compensation pattern and the second compensation pattern and may be disposed on the same layer as any one of the first connection pattern and the second connection pattern.

In an embodiment, the first connection line may overlap the first compensation pattern in a plan view, wherein the second connection line may overlap the second compensation pattern in a plan view.

In an embodiment, the first adjacent pattern and the first compensation pattern may be connected to the first connection line through an insulating layer, wherein the second adjacent pattern and the second compensation pattern may be connected to the second connection line through the insulating layer.

In an embodiment, the first main pattern and the first adjacent pattern may be spaced apart with the hole therebetween, wherein the first compensation pattern may be connected to the first connection pattern.

In an embodiment, the second adjacent pattern may be provided in a plurality of second adjacent patterns spaced apart from each other with the hole therebetween, wherein the connection pattern connecting the plurality of second adjacent patterns may cross the first connection pattern in a plan view.

In an embodiment, the second compensation pattern may be disposed between the second adjacent patterns and is connected to the connection pattern.

In an embodiment, the first sensing electrodes may be provided as a plurality of first sensing electrodes, wherein the plurality of first sensing electrodes may include: a first column electrode extending along the first direction; and a second column electrode extending along the first direction and disposed spaced apart from the first column electrode in a second direction crossing with the first direction, wherein a first compensation pattern of the first column electrode and a first compensation pattern of the second column electrode may be disposed between the second adjacent pattern and the hole and are spaced apart from each other in the second direction.

In an embodiment, at least a portion of the first compensation pattern of the first column electrode may be disposed between the hole and a first adjacent pattern of the first column electrode.

In an embodiment, the first compensation pattern may have a smaller area than the second compensation pattern.

In an embodiment, the first compensation pattern may include a plurality of patterns spaced apart from each other along a direction crossing an extension direction of the first compensation pattern, wherein a first connection line may be connected to each of the patterns.

In an embodiment, a shape of the hole in a plan view may be a circular shape, an elliptical shape, or a polygonal shape.

In an embodiment, the input sensing unit may further include a light shielding pattern surrounding the hole in a plan view, wherein the first compensation pattern and the second compensation pattern may overlap the light-shielding pattern in a plan view.

In an embodiment, each of the first main pattern, the first adjacent pattern, the second main pattern, and the second adjacent pattern may have a mesh shape.

In an embodiment, each of the first compensation pattern and the second compensation pattern may have a bar shape extending along at least a portion of an edge of the hole.

In an embodiment, the electronic device may further include an electronic module that overlaps the hole, wherein the electronic module may include at least one selected from an image input module, an image output module, an optical detection module, and an optical output module.

In an embodiment of the present disclosure, an electronic device includes: an input sensing unit divided into an active area and a peripheral area and including a first sensing electrode in the active area and a second sensing electrode spaced apart from the first sensing electrode and disposed in the active area; and an electronic module disposed overlapping the active area, wherein a hole penetrating the input sensing unit is defined in the active area, wherein the electronic module is disposed overlapping the hole, wherein each of the first sensing electrode and the second sensing electrode includes: a main pattern; an adjacent pattern having one side facing (adjacent to) the hole and having a smaller area than the main pattern; a connection pattern connecting the main pattern and the adjacent pattern; and a compensation pattern adjacent to the hole and electrically connected to the adjacent pattern, wherein a compensation pattern of the first sensing electrode is disposed between an adjacent pattern of the second sensing electrode and the hole and faces an adjacent pattern of the second sensing electrode, wherein a compensation pattern of the second sensing electrode is disposed between an adjacent pattern of the first sensing electrode and the hole and faces an adjacent pattern of the first sensing electrode.

In an embodiment, the adjacent pattern may be directly (electrically) connected to the compensation pattern.

In an embodiment, the electronic device may further include a connection line or connection pattern connecting the compensation pattern and the adjacent pattern.

In an embodiment, a connection line of the first sensing electrode may include: a plurality of line patterns disposed on the same layer as a compensation pattern of the second sensing electrode and spaced apart from each other; and a connection pattern disposed on a layer different from a compensation pattern of the second sensing electrode and insulatingly crossing (intersecting) a compensation pattern of the second sensing electrode, wherein each of the line patterns may be connected to the connection pattern. As used herein, the terms "insulatingly crossing" and "insulatingly intersecting" may refer to a situation in which two elements cross or intersect each other in a plan view, but are electrically insulated from each, e.g., by one or more insulating layers therebetween.

In an embodiment, the connection line may be spaced apart from the compensation pattern in a plan view.

In an embodiment, the connection line and/or connection pattern may be disposed on a layer different from the compensation pattern.

In an embodiment, the electronic device may further include a light shielding layer disposed between the hole and the adjacent pattern, wherein the compensation pattern may overlap the light shielding layer in a plan view.

In an embodiment of the present disclosure, an electronic device includes: a display unit including an active area configured to display an image and a peripheral area adjacent to the active area; and an input sensing unit disposed in a hole or module area on the display unit and including a first sensing electrode disposed in the active area and a second sensing electrode receiving an independent electrical signal from the first sensing electrode and disposed in the active area, wherein the display unit includes a first area having a plurality of pixels configured to display the image and a second area adjacent to the first area and having a higher light transmittance than the first area, wherein the first sensing electrode includes a main pattern, an adjacent pattern adjacent to the first area and having an area smaller than that of the main pattern, a connection pattern connected to the main pattern, and a compensation pattern adjacent to the first area and electrically connected to the adjacent pattern, wherein a portion of the second sensing electrode is disposed in a plan view between the first adjacent pattern and the first area.

In an embodiment, a hole penetrating the display unit may be defined in the first area.

In an embodiment, the display unit may include a plurality of pixels disposed in the second area and at least one non-light emitting pixel disposed in the first area, wherein the non-light emitting pixel may be formed by removing at least a portion of configurations of each of the pixels.

In an embodiment, the pixels may not overlap the module area.

In an embodiment, the compensation pattern may include: a first part extending along an edge of the hole; and a second part bent from the first part and connected to the first adjacent pattern, wherein the first part and the second part may be disposed on the same layer as the compensation pattern.

In an embodiment, the first part may be integrally provided with the first adjacent pattern.

In an embodiment, the first sensing electrode may further include a connection line connecting the compensation pattern and the adjacent pattern, wherein the connection line may overlap a portion of the second sensing electrode in a plan view.

In an embodiment, a portion of the second sensing electrode and the adjacent pattern may be arranged along one direction from a center of the hole (e.g., radially), wherein the compensation pattern and another portion of the second sensing electrode may be arranged along a direction crossing the one direction from a center of the hole (e.g., along the circumference or perimeter).

BRIEF DESCRIPTION OF THE FIGURES

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings:

FIG. 9A is a plan view illustrating a portion of an electronic device according to an embodiment of the present disclosure;

DETAILED DESCRIPTION

Figure 1A:
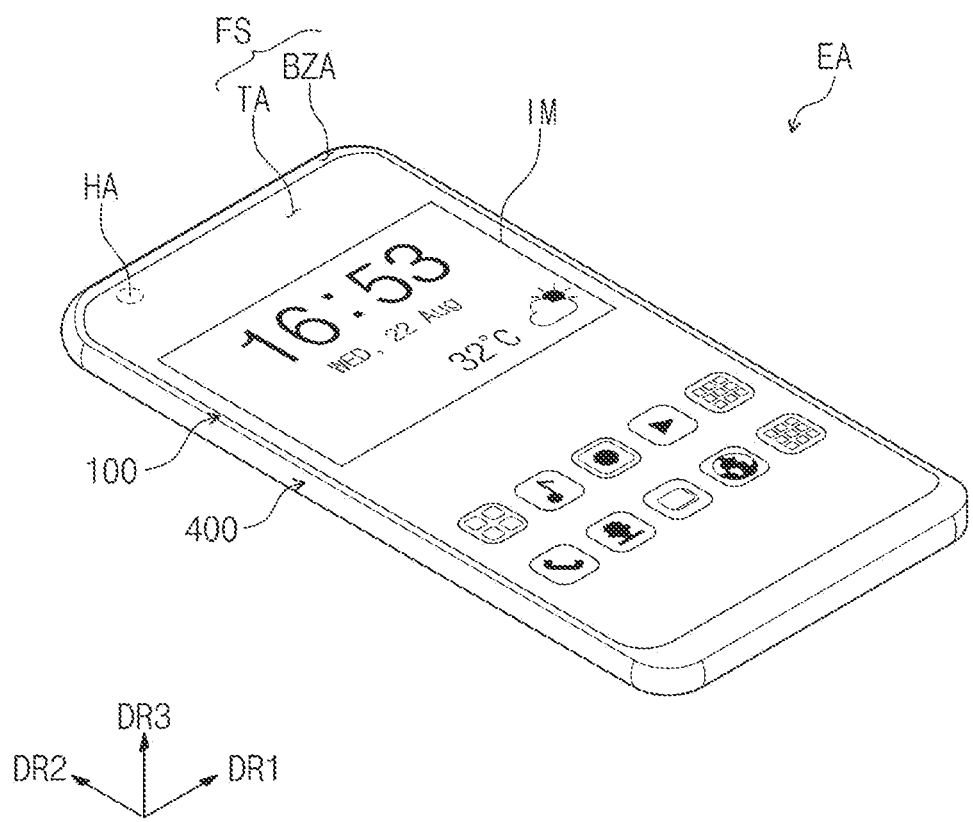
FIG. 1A is a perspective view of an assembled electronic device according to an embodiment of the present disclosure.

In this specification, when a component (or, an area, a layer, a part, etc.) is referred to as being "on", "connected to" or "combined to" another component, the component may be directly on, connected to, or combined to the other component, or a third component therebetween may be present. In contrast, when a component is referred to as being "directly on" another component, no intervening components are present.

Like reference numerals refer to like elements throughout, and duplicative descriptions thereof may not be provided. Additionally, in the drawings, the thicknesses, proportions, and dimensions of components may be exaggerated for ease of description and clarity.

"And/or" includes all of one or more combinations defined by related components. Expressions such as "at least one of", "one of", "selected from", "at least one selected from", and "one selected from", when preceding a list of elements, modify the entire list of elements and do not modify the individual elements of the list. Further, the use of "may" when describing embodiments of the present disclosure refers to "one or more embodiments of the present disclosure."

It will be understood that when the terms "first" and "second" are used herein to describe various components, these components should not be limited by these terms. The above terms are used only to distinguish one component from another. For example, a first component may be referred to as a second component and vice versa without departing from the scope of the present disclosure. Singular expressions and terms used herein also encompass or include plural expressions and terms, unless the context clearly indicates otherwise.

In addition, terms such as "below", "the lower side", "on", and "the upper side" are used to describe relationships or configurations of elements shown in the drawing. Such terms are understood to provide relative descriptions based on one or more directions shown in the drawing.

Unless otherwise defined, all terms (including technical and scientific terms) used herein have the same meaning as commonly understood by those skilled in the art to which this disclosure belongs. Also, terms should be interpreted as having meanings consistent with their meaning in the context of the related art or as defined in commonly used dictionaries, unless as explicitly defined here. Further, the terms should not be limited to being interpreted in an ideal or overly formal sense.

In various embodiments of the present disclosure, the terms "include," "comprise," "including," or "comprising," may refer to a property, a region, a fixed number, a step, a process, an element and/or a component, but do not exclude other properties, regions, fixed numbers, steps, processes, elements and/or components. By contrast, the term "consisting of" excludes such other properties, regions, fixed numbers, steps, processes, elements and components.

Hereinafter, embodiments of the present disclosure will be described with reference to the drawings.

Figure 1B:
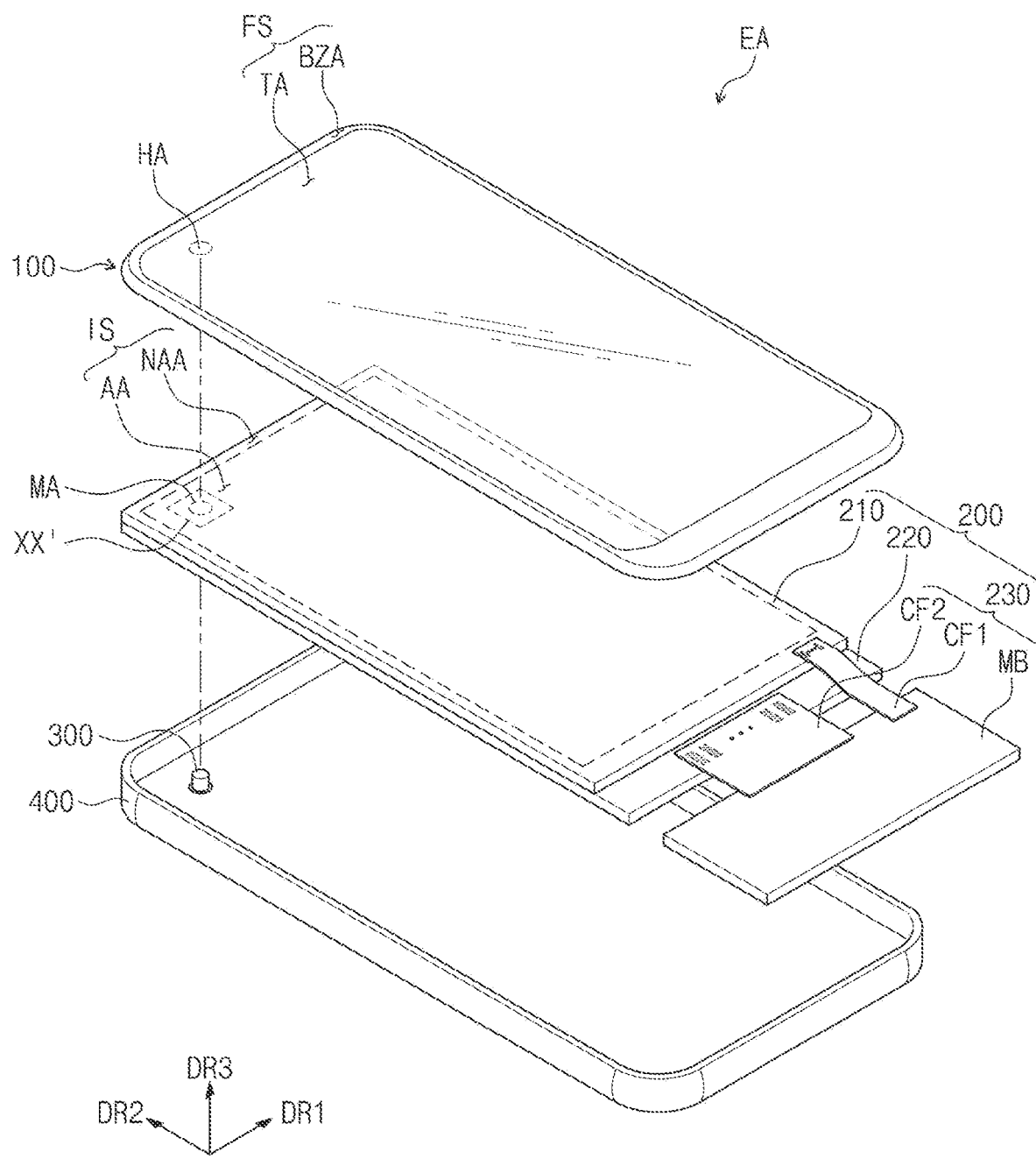
FIG. 1B is an exploded perspective view of the electronic device shown in FIG. 1A.
Figure 2:
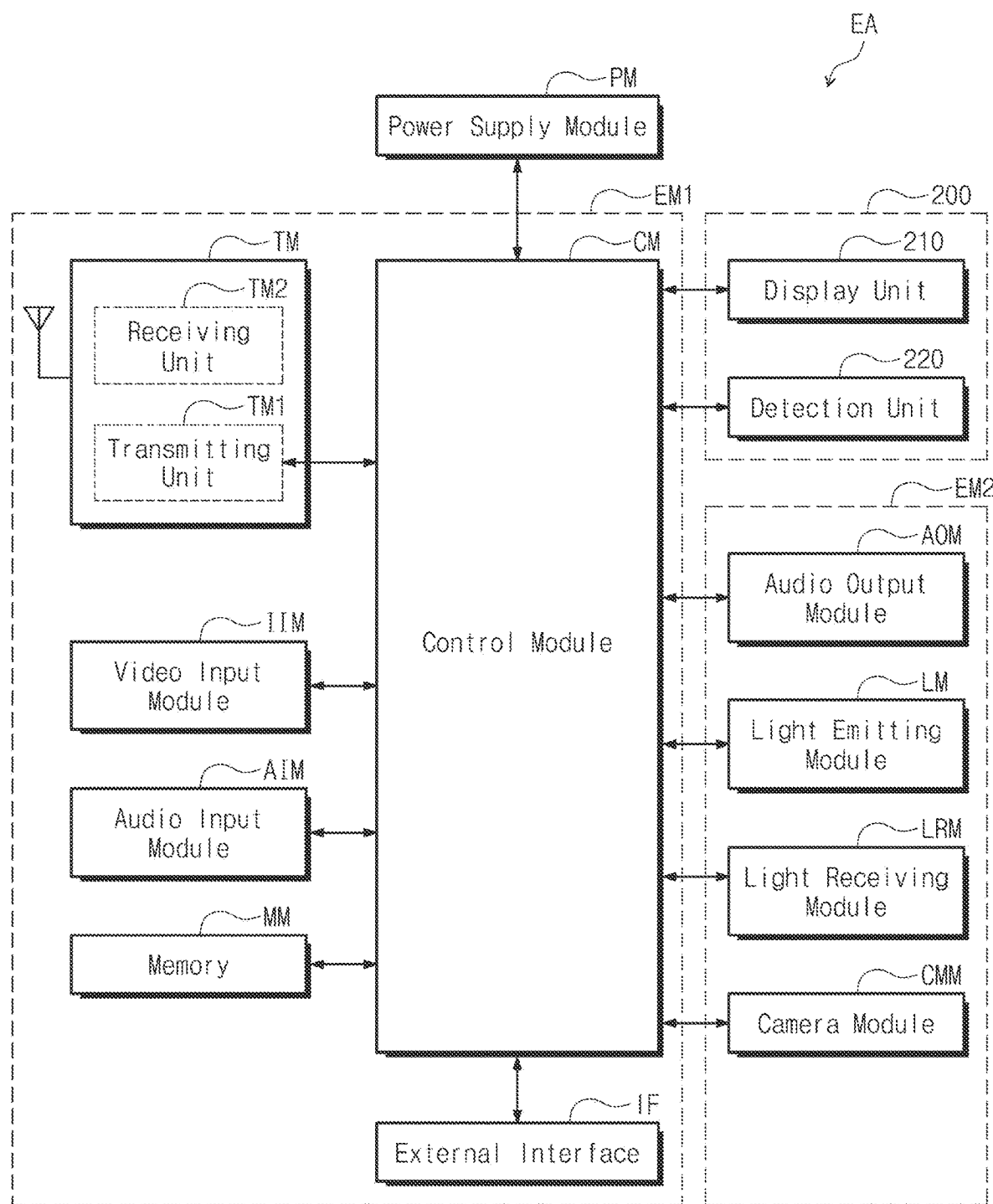
FIG. 2 is a block diagram of the electronic device shown in FIG. 1A.

FIG. 1A is a perspective view of an assembled electronic device according to an embodiment of the present disclosure. FIG. 1B is an exploded perspective view of FIG. 1A. FIG. 2 is a block diagram of the electronic device shown in FIG. 1A. Hereinafter, embodiments of the present disclosure will be described with reference to FIGS. 1A to 2.

An electronic device EA may be a device that is activated in response to an electrical signal. The electronic device EA may include or take the form of various suitable embodiments. For example, the electronic device EA may include a tablet, a notebook, a computer, a smart television, and/or the like. In this embodiment, a smart phone is illustrated as an example electronic device EA.

The electronic device EA may display an image IM toward (e.g., in the direction of) the third direction DR3, as shown on the display surface FS that lies parallel to (e.g., in the plane formed by) the first direction DR1 and the second direction DR2. The display surface FS on which the image IM is displayed may correspond to the front surface of the electronic device EA, and may correspond to the front surface FS of the window member 100. Hereinafter, the same reference numeral (FS) will be used for the display surface FS of the electronic device EA, and the front surface of the window member 100. The image IM may include still images as well as dynamic images. In FIG. 1A, a clock and a plurality of icons are shown as an example of the image IM.

In this embodiment, the front surface (or upper surface) and the rear surface (or lower surface) of each member within the electronic device EA are defined with reference to the direction in which the image IM is displayed (e.g., the third direction DR3). The front surface and the rear surface may oppose (e.g., face away from) each other in the third direction DR3, and the normal direction of each of the front surface and the rear surface may be parallel to the third direction DR3 in opposite directions. The separation distance between the front surface and the rear surface in the third direction DR3 may correspond to the thickness (in the third direction DR3) of the display panel DP. Moreover, the directions indicated by the first to third directions DR1, DR2, and DR3 may be converted to (e.g., interchangeable with) other directions as a relative concept. Hereinafter, the respective first to third directions DR1, DR2, and DR3 are indicated by the same reference numerals.

In some embodiments, the electronic device EA according to an embodiment of the present disclosure may detect an input TC of a user applied from the outside. The user's input TC may include one or more suitable types or kinds of external input, such as a portion of the user's body, light, heat, and/or pressure. In this embodiment, the user's input TC may be gathered from the user's hand applied to the front surface. However, embodiments of the present disclosure are not limited thereto, and the user's input TC may be provided in any suitable form. In some embodiments, the electronic device EA may also or alternatively detect a user's input TC as applied to the side surface or rear surface of the electronic device EA, depending on the structure of the electronic device EA.

In the present embodiment, the transmission area TA may include a set or predetermined hole area HA. The hole area HA may overlap a hole MH penetrating the electronic panel 200 within the module area MA, as described later, and may additionally overlap the electronic module 300. The electronic device EA may receive an external signal transmitted to the electronic module 300 through the hole area HA (see for example, FIG. 3B), and/or may provide a signal output from the electronic module 300 to the outside via the hole area HA. According to the present disclosure, when the hole area HA is provided overlapping with (e.g., within the same area as) the transmission area TA, a separate area provided for providing the hole area HA outside the transmission area TA may be omitted (e.g., does not need to be included). Thus, the area of the bezel area BZA may be reduced. Additional details will be described herein.

The electronic device EA includes a window member 100, an electronic panel 200, an electronic module 300, and a housing unit 400. In this embodiment, the window member 100 and the housing unit 400 are combined to form the appearance (e.g., outermost shell) of the electronic device EA.

The window member 100 may include an insulating panel. For example, the window member 100 may be composed of glass, plastic, or a combination thereof.

The front surface FS of the window member 100 defines the front surface of the electronic device EA, as described above. The transmission area TA may be an optically transparent area. For example, the transmission area TA may be an area having a visible light transmittance of about 90% or more.

The bezel area BZA may be an area with a lower light transmittance compared to the transmission area TA. The bezel area BZA defines the shape of (e.g., encloses the perimeter of) the transmission area TA. The bezel area BZA is adjacent to the transmission area TA, and may surround the transmission area TA.

The bezel area BZA may have a set or predetermined color. The bezel area BZA covers the peripheral area NAA of the electronic panel 200 so as to prevent or reduce the peripheral area NAA from being visually recognized from the outside. In some embodiments, the window member 100 according to an embodiment of the present disclosure may omit the bezel area BZA.

The electronic panel 200 may display the image IM and detect the external input TC. The electronic panel 200 includes a front surface IS including an active area AA and a peripheral area NAA. The active area AA may be an area activated according to an electrical signal.

In the present embodiment, the active area AA is an area where the image IM is displayed, and at the same time, an area where the external input TC is detected. The transmission area TA in the window member 100 may at least overlap the active area AA. For example, the transmission area TA may overlap the front surface or at least part of the active area AA. Accordingly, the user may view the image IM through the transmission area TA and/or provide an external input TC. However, the area in which the image IM is displayed in the active area AA and the area in which the external input TC is detected may be separated from each other, and embodiments of the present disclosure are not limited thereto.

The peripheral area NAA may be an area covered by the bezel area BZA. The peripheral area NAA is adjacent to the active area AA. The peripheral area NAA may surround the active area AA. A driving circuit, a driving wiring, and/or the like for driving the active area AA may be disposed (e.g., positioned) in the peripheral area NAA.

In this embodiment, the electronic panel 200 is assembled in a flat state, in which the active area AA and the peripheral area NAA face the window member 100. In some embodiments, and a portion of the peripheral area NAA of the electronic panel 200 may be bent. For example, a portion of the peripheral area NAA may be directed to the rear surface of the electronic device EA, so that the bezel area BZA at the front surface of the electronic device EA may be reduced. Alternatively, the electronic panel 200 may be assembled in a state where a portion of the active area AA is also bent. Alternatively, in the electronic panel 200 according to an embodiment of the present disclosure, the peripheral area NAA may be omitted.

The electronic panel 200 includes a display unit 210, a detection unit 220, and a drive circuit 230.

The display unit 210 may be configured to substantially generate an image IM. The image IM generated by the display unit 210 may be displayed on the display surface FS through the transmission area TA, and is visible to the user from outside.

The detection unit 220 detects an external input TC applied from the outside. As described above, the detection unit 220 may detect an external input TC provided to or through the window member 100.

The drive circuit 230 is electrically connected to the display unit 210 and the detection unit 220. The drive circuit 230 includes a main circuit board MB, a first circuit board CF1, and a second circuit board CF2.

The first circuit board CF1 is electrically connected to the display unit 210. The first circuit board CF1 may connect the display unit 210 and the main circuit board MB. In this embodiment, the first circuit board CF1 is shown as a flexible circuit film. However, embodiments of the present disclosure are not limited thereto. The first circuit board CF1 may not be connected to the main circuit board MB. The first circuit board CF1 may be a rigid substrate.

The first circuit board CF1 may be connected to the pads (e.g., display pads) of the display unit 210 disposed in the peripheral area NAA. The first circuit board CF1 may provide an electrical signal for driving the display unit 210 to the display unit 210. The electrical signal may be generated in the first circuit board CF1 or generated in the main circuit board MB.

The second circuit board CF2 is electrically connected to the detection unit 220. The second circuit board CF2 may connect the detection unit 220 and the main circuit board MB. In this embodiment, the second circuit board CF2 is shown as a flexible circuit film. However, embodiments of the present disclosure are not limited thereto. The second circuit board CF2 may not be connected to the main circuit board MB. The second circuit board CF2 may be a rigid substrate.

The second circuit board CF2 may be connected to the pads (e.g., sensing pads) of the detection unit 220 disposed in the peripheral area NAA. The second circuit board CF2 may provide an electrical signal for driving the detection unit 220 to the detection unit 220. The electrical signal may be generated in the second circuit board CF2 or generated in the main circuit board MB.

The main circuit board MB may include one or more drive circuits for driving the electronic panel 200, and/or connectors for power supply. Each of the first circuit board CF1 and the second circuit board CF2 may be connected to the main circuit board MB. According to embodiments of the present disclosure, the electronic panel 200 may be easily controlled through one main circuit board MB. However, embodiments of the present disclosure are not limited thereto. In the electronic panel 200 according to an embodiment of the present disclosure, the display unit 210 and the detection unit 220 may be connected to different main circuit boards. Either the first circuit board CF1 or the second circuit board CF2 may not be connected to the main circuit board MB. However, embodiments of the present disclosure are not limited thereto.

Meanwhile, a set or predetermined hole MH (hereinafter referred to as a hole) may be defined in the electronic panel 200 according to an embodiment of the present disclosure. The hole MH is defined in the active area AA and passes through the electronic panel 200. The display unit 210 and the detection unit 220 may each be penetrated by the hole MH. By defining the hole MH in the active area AA, the hole area HA may be provided in the transmission area TA.

The electronic module 300 may be disposed below the window member 100. The electronic module 300 may overlap the hole MH and the hole area HA in a plan view. The electronic module 300 may receive an external input transmitted through the hole area HA, and/or may provide an output through the hole area HA. At least a portion of the electronic module 300 may be received (positioned) in the hole MH. According to the present disclosure, the electronic module 300 may overlap (e.g., be positioned within) the active area AA, thereby avoiding an increase of the bezel area BZA.

Referring to FIG. 2, an electronic device EA may include an electronic panel 200, a power supply module PM, a first electronic module EM1, and a second electronic module EM2. The electronic panel 200, the power supply module PM, the first electronic module EM1, and the second electronic module EM2 may be electrically connected to each other. The display unit 210 and the detection unit 220 in the configuration of the electronic panel 200 are schematically shown in FIG. 2.

The power supply module PM supplies power necessary for the overall operation of the electronic device EA. For example, the power supply module PM may include a related art battery module.

The first electronic module EM1 and the second electronic module EM2 include various functional modules operating the electronic device EA. The first electronic module EM1 may be directly mounted on a motherboard electrically connected to the electronic panel 200, or may be mounted on a separate board and electrically connected to the motherboard through a connector and/or the like.

The first electronic module EM1 may include a control module CM, a wireless communication module TM, a video input module IIM, an audio input module AIM, a memory MM, and an external interface IF. Some of the modules may not be mounted on the motherboard, but may be electrically connected to the motherboard through a flexible circuit board.

The control module CM controls the overall operation of the electronic device EA. The control module CM may be a microprocessor. For example, the control module CM may activate and/or deactivate the electronic panel 200. The control module CM may control other modules such as the image input module IIM and/or the audio input module AIM based on the touch signal received from the electronic panel 200.

The wireless communication module TM may transmit/receive a wireless signal to/from another terminal using a Bluetooth or a Wi-Fi line. The wireless communication module TM may transmit/receive a voice signal using a general communication line. The wireless communication module TM includes a transmission unit TM1 for modulating and transmitting a signal to be transmitted, and a reception unit TM2 for demodulating the received signal.

The image input module IIM may be to process the image signal and convert it into image data that may be displayed on the electronic panel 200. The audio input module AIM may be to receive an external audio signal by a microphone in a recording mode, a voice recognition mode, etc., and convert it into electrical voice data.

The external interface IF may serve as an interface to an external charger, a wired/wireless data port, a card socket (e.g., a memory card, a SIM/UIM card), etc.

The second electronic module EM2 may include an audio output module AOM, a light emitting module LM, a light receiving module LRM, and a camera module CMM. The configurations may be directly mounted on the motherboard, mounted on a separate substrate and electrically connected to the electronic panel 200 through a connector, or electrically connected to the first electronic module EM1.

The audio output module AOM may be to convert sound data received from the wireless communication module TM and/or sound data stored in the memory MM, and may output the sound data to the outside.

The light emitting module LM may be to generate and output light. The light emitting module LM may be to output infrared rays. The light emitting module LM may include an LED element. The light receiving module LRM may detect infrared rays. The light receiving module LRM may be activated when an infrared ray of a set or predetermined level or higher is detected. The light receiving module LRM may include a CMOS sensor. After the infrared light generated by the light emitting module LM is outputted, the infrared light may be reflected by an external object (e.g., a user finger or a face), and the reflected infrared light may be incident on the light receiving module LRM. The camera module CMM may be to capture an image of the outside.

The electronic module 300 according to an embodiment of the present disclosure may include at least one of the configurations of the first electronic module EM1 and the second electronic module EM2. For example, the electronic module 300 may include at least one of a camera, a speaker, a light detection sensor, and a thermal detection sensor. The electronic module 300 may be to detect an external subject received through the hole area HA, or may be to provide a sound signal (such as a voice) to the outside through the hole area HA. In addition, the electronic module 300 may include a plurality of configurations, and is not limited to any one embodiment.

Referring again to FIGS. 1A and 1B, the housing unit 400 may be combined with the window member 100. The housing unit 400 may be combined with the window member 100 to provide a set or predetermined internal space. The electronic panel 200 and the electronic module 300 may be accommodated in the internal space.

The housing unit 400 may include a material having a relatively high stiffness. For example, the housing unit 400 may include a plurality of frames and/or plates including glass, plastic, metal, or a combination thereof. The housing unit 400 may stably protect the configurations of the internal space of the electronic device EA from external impacts.

According to embodiments of the present disclosure, a hole MH may be provided in the electronic panel 200 for the electronic module 300. Thus, an electronic device with reduced bezel area BZA may be provided.

Figure 3A:
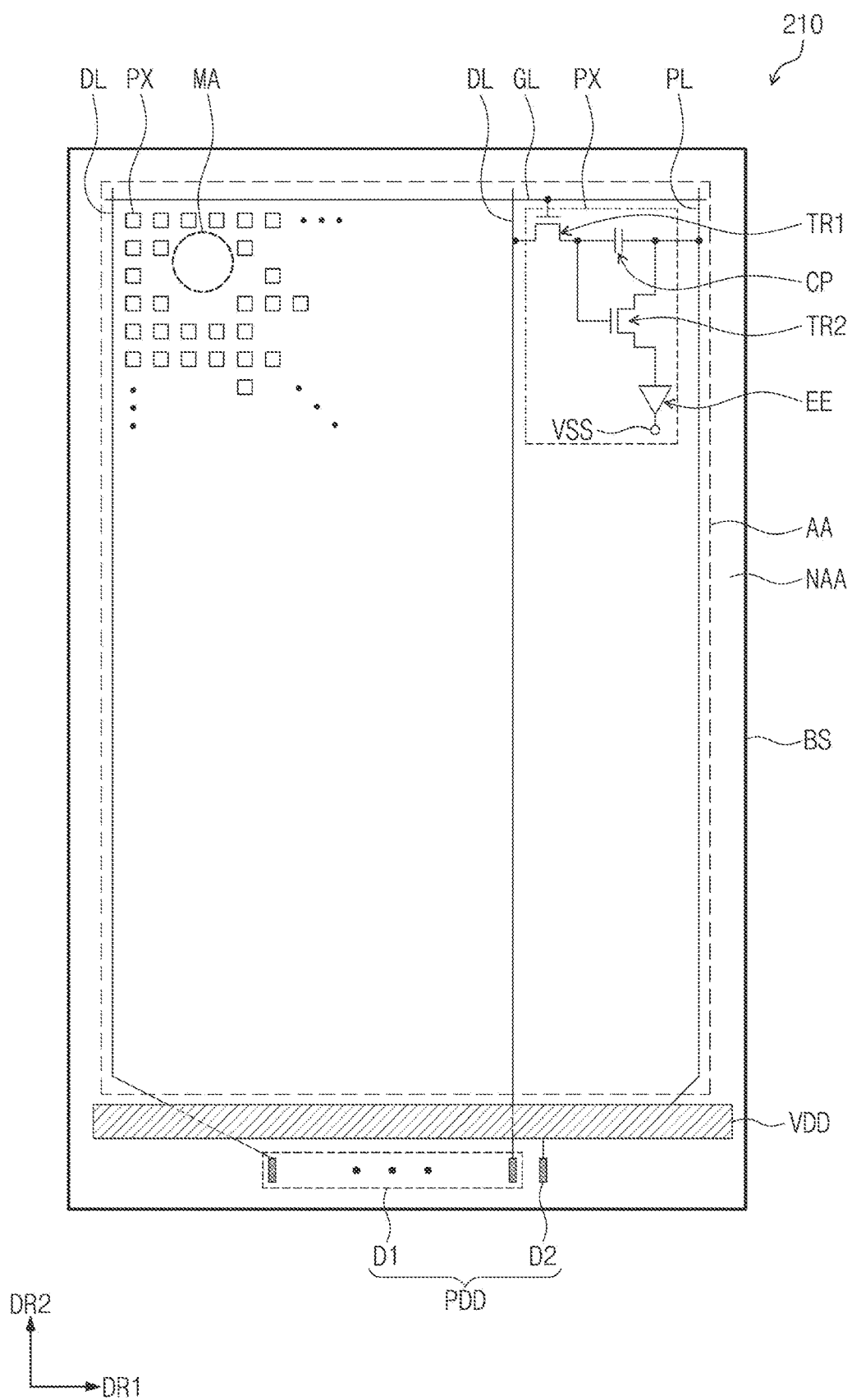
FIG. 3A is a plan view of a display unit according to an embodiment of the present disclosure.
Figure 3B:
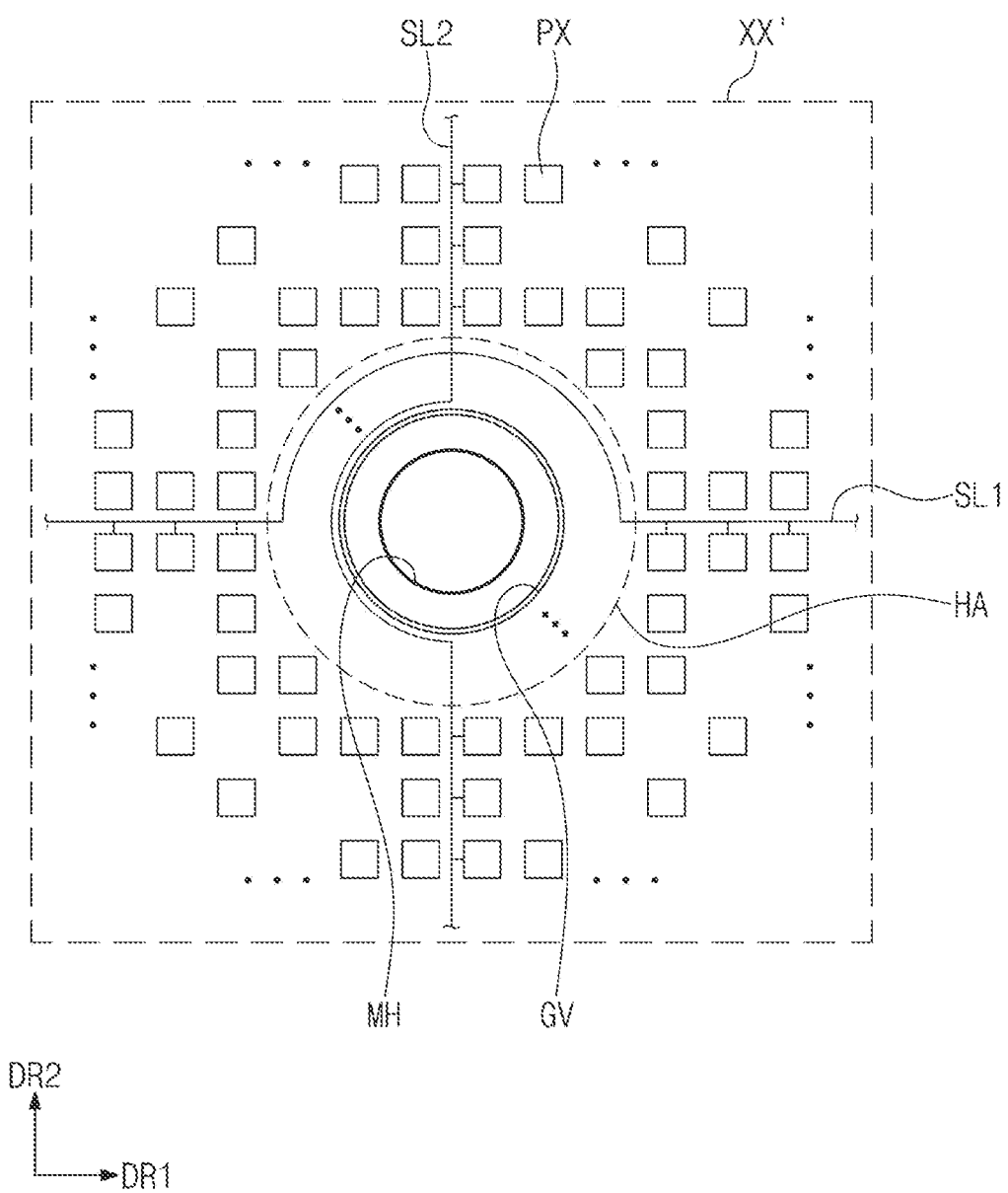
FIG. 3B is a plan view showing an enlarged partial area of FIG. 3A.
Figure 3C:
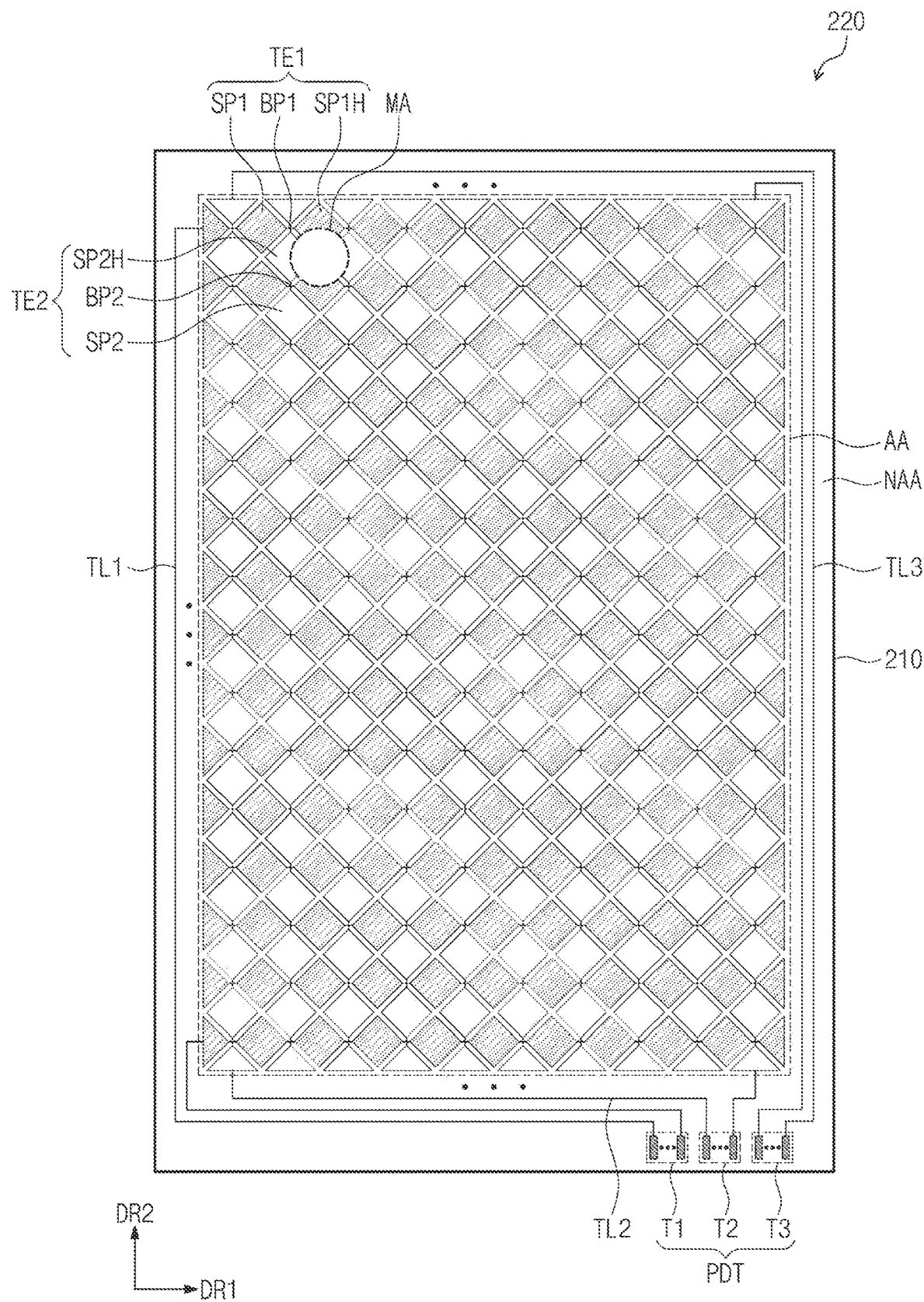
FIG. 3C is a plan view of a detection unit according to an embodiment of the present disclosure.

FIG. 3A is a plan view of a display unit according to an embodiment of the present disclosure. FIG. 3B is a plan view showing an enlarged partial area of FIG. 3A. FIG. 3C is a plan view of a detection unit according to an embodiment of the present disclosure. FIG. 3A schematically shows a signal circuit diagram, and FIG. 3B shows an enlarged view of the area XX' shown in FIG. 1B. Some components are omitted (not labeled) in FIGS. 3A to 3B for ease of explanation. Hereinafter, embodiments of the present disclosure will be described with reference to FIGS. 3A and 3B.

As shown in FIG. 3A, the display unit 210 includes a base substrate BS, a plurality of pixels PX, a plurality of signal lines GL, DL and PL, and a plurality of display pads PDD. The active area AA and the peripheral area NAA may be provided on the base substrate BS. The base substrate BS may include an insulating substrate. For example, the base substrate BS may be composed of a glass substrate, a plastic substrate, or a combination thereof.

The signal lines GL, DL and PL are connected to the pixels PX to transmit electrical signals to the pixels PX. A scan line GL, a data line DL, and a power supply line PL among the signal lines are included in the display unit 210. However, embodiments of the present disclosure are not limited thereto. The signal lines GL, DL, and PL may further include at least one of a power supply line, an initialization voltage line, and a light emission control line, but embodiments of the present disclosure are not limited thereto.

One or more pixels PX may be disposed in the active area AA. In this embodiment, a signal circuit diagram of one pixel PX among a plurality of pixels is enlarged and shown as an example. The pixel PX may include a first thin film transistor TR1, a capacitor CP, a second thin film transistor TR2, and a light emitting element EE. The first thin film transistor TR1 may be a switching element controlling ON-OFF of the pixel PX. The first thin film transistor TR1 may transmit or block a data signal transmitted through the data line DL in response to a scan signal transmitted through the scan line GL.

The capacitor CP is connected to the first thin film transistor TR1 and the power supply line PL. The capacitor CP may hold and release an amount of charge corresponding to the difference between the data signal transmitted from the first thin film transistor TR1 and the first power supply signal applied to the power supply line PL.

The second thin film transistor TR2 is connected to the first thin film transistor TR1, the capacitor CP, and the light emitting element EE. The second thin film transistor TR2 may control the driving current flowing to the light emitting element EE in accordance with the amount of charge stored in the capacitor CP. The turn-on time of the second thin film transistor TR2 may be determined by the amount of charge stored in the capacitor CP. The second thin film transistor TR2 may provide the first power supply signal to the light emitting element EE, which is transmitted via the power supply line PL during the turn-on time.

The light emitting element EE may generate light and/or control the amount of light according to an electrical signal.

For example, the light emitting element EE may include an organic light emitting element, a quantum dot light emitting element, an electrophoretic element, and/or an electrowetting element.

The light emitting device EE is connected to a power supply terminal VSS and is provided with a power supply signal (hereinafter referred to as a second power supply signal) different from the first power supply signal provided by the power supply line PL. A driving current corresponding to a difference between an electrical signal provided from the second thin film transistor TR2 and a second power supply signal flows through the light emitting element EE and the light emitting element EE generates light corresponding to the driving current. Meanwhile, this is illustrated by way of example, and the pixel PX may include electronic components having various configurations and arrangements, and is not limited to any one embodiment.

In FIG. 3B, the hole area HA of the window member 100 (see FIG. 1A) is shown by dotted lines for easy explanation. The area XX' includes an area where a hole MH is defined. Hereinafter, the display unit 210 in the area where the holes MH are disposed will be described with reference to FIG. 3B.

As described above, the hole MH may be defined in the active area AA. Thus, at least some of the pixels PX may be disposed adjacent to the holes MH. Some of the pixels PX may surround the hole MH.

A set or predetermined groove pattern GV may be defined in the hole area HA. In the present embodiment, the groove pattern GV is shown as a closed line surrounding the module hole MH and is shown in a circle shape similar to the shape of the module hole MH. However, embodiments of the present disclosure are not limited thereto. The groove pattern GV may have a different shape from the hole MH, for example, a polygon, an ellipse, or a closed line shape including at least a portion of the curve, or have a shape including a plurality of partially disconnected patterns, but embodiments of the present disclosure are not limited thereto.

The groove pattern GV may correspond to a depressed portion relative to the front surface of the display unit 210, and may cut off the path of moisture or oxygen that would otherwise permeate through the hole MH into the pixel PX. Additional details will be provided herein.

A plurality of signal lines SL1 and SL2 connected to the pixels PX may be disposed in the hole area HA. The signal lines SL1 and SL2 are connected to the pixels PX through the hole area HA. For ease of description, an example first signal line SL1 and an example second signal line SL2 among a plurality of signal lines connected to the pixels PX are shown in FIG. 3B.

The first signal line SL1 extends along the first direction DR1. The first signal line SL1 is connected to pixels in the same row arranged along the first direction DR1 of among the pixels PX. The first signal line SL1 is illustratively described as corresponding to the scan line GL.

Some of the pixels connected to the first signal line SL2 may be disposed on the left side of the hole MH, and other pixels may be disposed on the right side of the hole MH. Accordingly, even if some pixels in the same row connected to the first signal line SL1 are omitted from (e.g., separated by) the hole MH, they may be turned on/off by substantially the same gate signal.

The second signal line SL2 extends along the second direction DR2. The second signal line SL2 is connected to the pixels in the same column arranged along the second direction DR2 of the pixels PX. The second signal line SL2 is illustratively described as corresponding to the data line DL.

Some of the pixels connected to the second signal line SL1 may be disposed on the upper side of the hole MH, and the other pixels may be disposed on the lower side of the hole MH. Accordingly, even if some pixels around the hole MH are separated by the hole MH, the pixels in the same column connected to the second signal line SL2 may receive the data signal through the same line.

Meanwhile, the electronic panel 200 according to an embodiment of the present disclosure may further include a connection pattern disposed in the hole area HA. At this time, the first signal line SL1 may be disconnected in an area overlapping the hole area HA. The disconnected portions of the first signal line SL1 may be connected through a connection pattern. Similarly, the second signal line SL2 may be disconnected in the area overlapping the hole area HA, and a connection pattern connecting the disconnected portions of the second signal line SL2 may be further provided.

Again, referring to FIG. 3A, the power supply pattern VDD may be disposed in the peripheral area NAA. In this embodiment, the power supply pattern VDD may be connected to a plurality of power supply lines PL. Thus, the display unit 210 may include a power supply pattern VDD to provide the same first power supply signal to a plurality of pixels.

The display pads PDD may include a first pad D1 and a second pad D2. The plurality of first pads D1 may be connected to a plurality of data lines DL, respectively. The second pad D2 may be connected to the power supply pattern VDD and electrically connected to the power supply line PL. The display unit 210 may provide electrical signals to the pixels PX through the display pads PDD. The display pads PDD may further include pads receiving electrical signals other than the first pads D1 and the second pads D2, and are not limited to any one embodiment. Referring to FIG. 3C, the detection unit 220 may be disposed on the display unit 210. The detection unit 220 may detect the external input TC (see FIG. 1A) and obtain the position and intensity information of the external input TC. The detection unit 220 includes a plurality of first sensing electrodes TE1, a plurality of second sensing electrodes TE2, a plurality of sensing lines TL1, TL2, and TL3, and a plurality of sensing pads PDT.

The first sensing electrodes TE1 and the second sensing electrodes TE2 are disposed in the active area AA. The detection unit 220 may obtain information regarding the external input TC through a change in capacitance between the first sensing electrodes TE1 and the second sensing electrodes TE2.

Each of the first sensing electrodes TE1 extends along the first direction DR1, and a plurality of first sensing electrodes TE1 are duplicatively spaced along the second direction DR2. Each of the first sensing electrodes TE1 may include a first main pattern SP1, a first adjacent pattern SP1H, and a first connection pattern BP1.

The first main pattern SP1 is disposed in the active area AA. The first main pattern SP1 is disposed apart (e.g., separated) from the hole MH. The first main pattern SP1 has a set or predetermined shape and has a first area. In this embodiment, the first main pattern SP1 may have a rhombic shape. However, this is an example illustration, and the first main pattern SP1 may have any suitable shape and is not limited to any one embodiment.

The first adjacent pattern SP1H is disposed adjacent to the hole MH. The first adjacent pattern SP1H has a second area smaller than the first area of the first main pattern SP1. The first adjacent pattern SP1H may have the same rhombic shape as the first main pattern SP1 except that the area overlapping the hole MH is removed.

In this embodiment, the first connection pattern BP1 extends along the first direction DR1. The first connection pattern BP1 may be connected to the first main pattern SP1. The first connection pattern BP1 may be disposed between the two first main patterns to connect the two first main patterns (e.g., SP1 and SP1). Alternatively, the first connection pattern BP1 is disposed between the first main pattern SP1 and the first adjacent pattern SP1H and connects the first main pattern SP1 and the first adjacent pattern SP1H.

Each of the second sensing electrodes TE2 extends along the second direction DR2, and a plurality of second sensing electrodes TE2 are duplicatively spaced along the first direction DR1. Each of the second sensing electrodes TE2 may include a second main pattern SP2, a second adjacent pattern SP2H, and a second connection pattern BP2.

The second main pattern SP2 is spaced apart from the hole MH. The second main pattern SP2 may be spaced apart from the first main pattern SP1. In this embodiment, the first main pattern SP1 and the second main pattern SP2 may be separated when viewed on the cross section. The first main pattern SP1 and the second main pattern SP2 are not in contact with each other, and may transmit and receive independent electrical signals.

In this embodiment, the second main pattern SP2 may have the same shape as the first main pattern SP1. For example, the second main pattern SP2 may have a rhombic shape. However, this is an example illustration, and the second main pattern SP2 may have any suitable shape and is not limited to any one embodiment.

The second adjacent pattern SP2H is disposed adjacent to the hole MH. The second adjacent pattern SP2H has an area smaller than that of the second main pattern SP2. The second adjacent pattern SP2H may have the same rhombic shape as the second main pattern SP2 except that the area overlapping the hole MH is removed.

In this embodiment, the second connection pattern BP2 extends along the second direction DR2. The second connection pattern BP2 is connected to the second main pattern SP2. The second connection pattern BP2 may be disposed between the two second main patterns to connect the two second main patterns (e.g., SP2 and SP2). Alternatively, the second connection pattern BP2 may be disposed between the second main pattern SP2 and the second adjacent pattern SP2H and connects the second main pattern SP2 and the second adjacent pattern SP2H.

The sensing lines TL1, TL2 and TL3 are disposed in the peripheral area NAA. The sensing lines TL1, TL2, and TL3 may include first sensing lines TL1, second sensing lines TL2, and third sensing lines TL3. The first sensing lines TL1 are connected to the first sensing electrodes TE1, respectively. The second sensing lines TL2 are connected to one set of ends of the second sensing electrodes TE2, respectively.

The third sensing lines TL3 are connected to the other set of ends of the second sensing electrodes TE2, respectively. The other set of ends of the second sensing electrodes TE2 may be opposite the first ends of the second sensing electrodes TE2. According to embodiments of the present disclosure, the second sensing electrodes TE2 may be connected to the second sensing lines TL2 and the third sensing lines TL3. Accordingly, for the second sensing electrodes TE2 having a relatively longer length than the first sensing electrodes TE1, the sensitivity according to an area may be maintained uniformly. However, embodiments of the present disclosure are not limited thereto, and in some embodiments, the third sensing lines TL3 may be omitted.

The sensing pads PDT are disposed in the peripheral area NAA. The sensing pads PDT may include first sensing pads T1, second sensing pads T2, and third sensing pads T3. The first sensing pads T1 are respectively connected to the first sensing lines TL1 to provide an external signal to the first sensing electrodes TE1. The second sensing pads T2 are respectively connected to the second sensing lines TL2, and the third sensing pads T3 are respectively connected to the third sensing lines TL3 to be electrically connected to the second sensing electrodes TE2.

The hole MH may be defined in the detection unit 220. The hole MH is defined in the active area AA so that a portion of the first sensing electrodes TE1 overlapping the hole MH and a portion of the second sensing electrodes TE2 overlapping the hole MH may be disconnected and removed. Thus, the hole MH may not be blocked by the first sensing electrode TE1 or the second sensing electrode TE2.

Figure 4A:
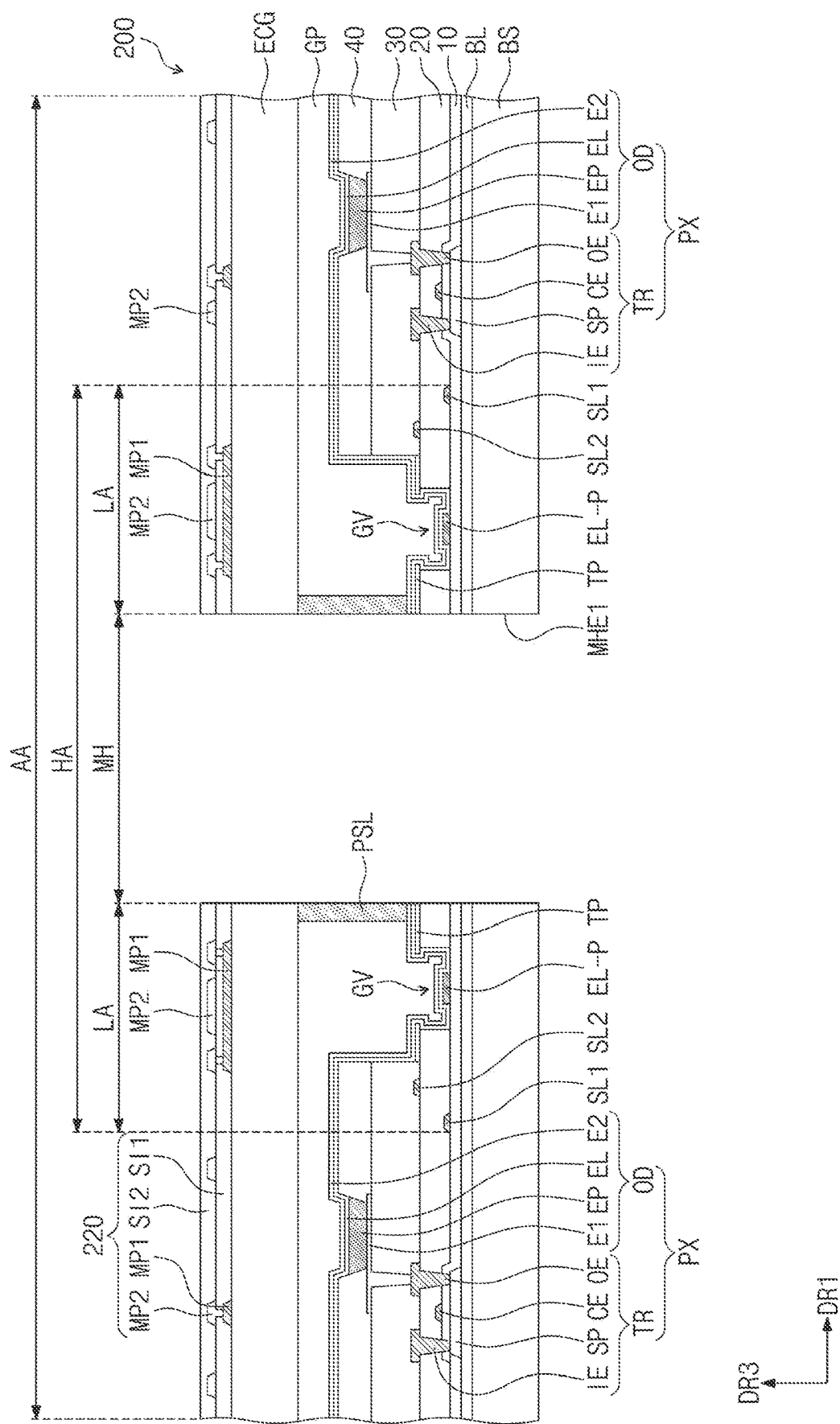
FIGS. 4A and 4B are cross-sectional views illustrating a portion of an electronic device according to an embodiment of the present disclosure.
Figure 4B:
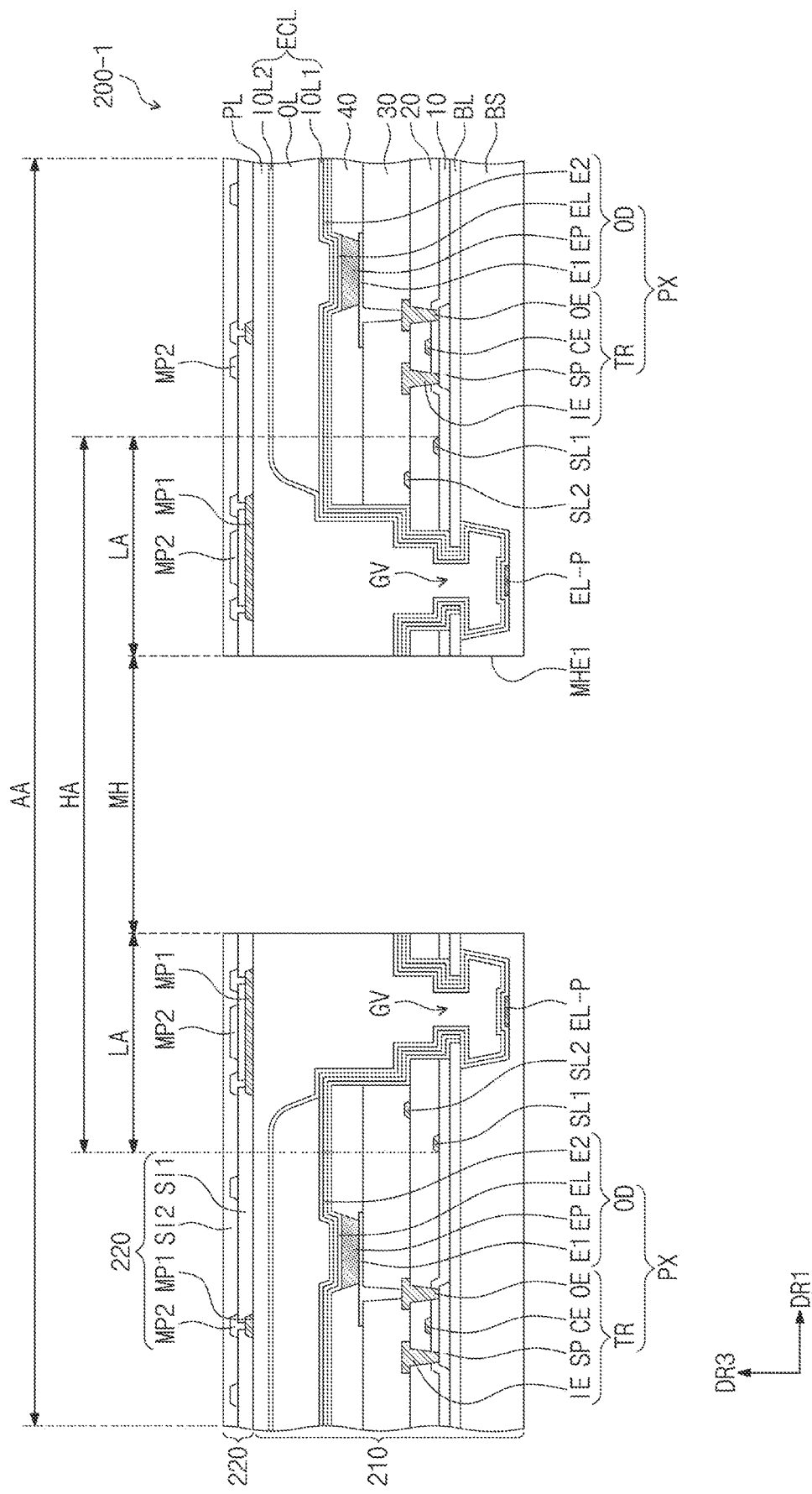

FIGS. 4A and 4B are cross-sectional views illustrating a portion of an electronic device according to an embodiment of the present disclosure. FIG. 4A shows a cross-sectional view of an area where the hole MH of the electronic panel 200 shown in FIG. 1B is defined, and FIG. 4B shows a cross-sectional view of an electronic panel 200-1 according to an embodiment of the present disclosure. For ease of description, FIG. 4B shows the same area as FIG. 4A. Hereinafter, the present disclosure will be described with reference to FIGS. 4A and 4B. Moreover, components similar to those described in FIGS. 1A to 3C are given the same reference numerals and will be understood to have similar descriptions.

As shown in FIG. 4A, a cross-sectional view of the electronic panel 200 includes a base substrate BS, an auxiliary layer BL, a pixel PX, a plurality of insulating layers 10, 20, 30 and 40, a sealing substrate ECG, and a detection unit 220.

The base substrate BS may be an insulating substrate. For example, the base substrate BS may include a plastic substrate or a glass substrate. The auxiliary layer BL is disposed on the base substrate BS to cover the front surface of the base substrate BS. The auxiliary layer BL may include an inorganic material. The auxiliary layer BL may include a barrier layer and/or a buffer layer. Accordingly, the auxiliary layer BL may prevent or reduce oxygen and/or moisture in the base substrate BS from penetrating the pixel PX, and/or may reduce the surface energy of the base substrate BS so that the pixels PX are stably formed on the base substrate BS.

The pixel PX may be disposed in the active area AA. In this example embodiment, the pixel PX includes a second thin film transistor TR2 (hereinafter referred to as a thin film transistor TR) and a light emitting element EE (hereinafter referred to as OD) as shown in the equivalent circuit diagram of the pixel PX shown in FIG. 3A. Each of the first to fourth insulating layers 10, 20, 30, and 40 may include an organic material and/or an inorganic material, and may have a single layer or a laminated structure.

The thin film transistor TR includes a semiconductor pattern SP, a control electrode CE, an input electrode IE, and an output electrode OE. The semiconductor pattern SP is disposed on the auxiliary layer BL. The semiconductor pattern SP may include a semiconductor material. The control electrode CE is spaced apart from the semiconductor pattern SP with the first insulating layer 10 therebetween.

The control electrode CE may be connected to one electrode of the first thin film transistor TR1 (see FIG. 3A) and the capacitor CP (see FIG. 3A).

The input electrode IE and the output electrode OE are spaced apart from the control electrode CE with the second insulating layer 20 therebetween. The input electrode IE and the output electrode OE of the thin film transistor TR pass through the first insulating layer 10 and the second insulating layer 20 and are electrically connected to one side and the other side of the semiconductor pattern SP, respectively.

The third insulating layer 30 is disposed on the second insulating layer 20 to cover the input electrode IE and the output electrode OE. In the thin film transistor TR, the semiconductor pattern SP may be disposed on the control electrode CE. Alternatively, the semiconductor pattern SP may be disposed on the input electrode IE and the output electrode OE. Alternatively, the input electrode IE and the output electrode OE may be disposed on the same layer as the semiconductor pattern SP and directly connected to the semiconductor pattern SP. The thin film transistor TR according to an embodiment of the present disclosure may be formed in any suitable structure, and is not limited to any one embodiment.

The light emitting element OD is disposed on the third insulating layer 30. The light emitting element OD includes a first electrode E1, a light emitting pattern EP, a control layer EL, and a second electrode E2.

The first electrode E1 may be connected to the thin film transistor TR through the third insulating layer 30. The electronic panel 200 may further include a separate connection electrode disposed between the first electrode E1 and the thin film transistor TR, and the first electrode E1 may be electrically connected to the thin film transistor TR through the connection electrode.

A fourth insulating layer 40 is disposed on the third insulating layer 30. The fourth insulating layer 40 may include an organic material and/or an inorganic material, and may have a single layer or a laminated structure. An opening part may be defined in the fourth insulating layer 40. The opening part may expose at least a portion of the first electrode E1. The fourth insulating layer 40 may be a pixel definition layer.

The light emitting pattern EP is disposed in the opening part and disposed on the first electrode E1 exposed by the opening part. The light emitting pattern EP may include a luminescent material. For example, the light emitting pattern EP may include at least one material for emitting red, green, or blue light, and may include a fluorescent material or a phosphorescent material. The light emitting pattern EP may include an organic light emitting material or an inorganic light emitting material. The light emitting pattern EP may emit light in response to a potential difference between the first electrode E1 and the second electrode E2.

The control layer EL is disposed between the first electrode E1 and the second electrode E2. The control layer EL is disposed adjacent to the light emitting pattern EP. The control layer EL controls the movement of charges to improve the luminous efficiency and lifetime of the light emitting element OD. The control layer EL may include at least one of a hole transporting material, a hole injecting material, an electron transporting material, and an electron injecting material.

In this embodiment, the control layer EL is shown as being disposed between the light emitting pattern EP and the second electrode E2. However, this is an example illustration. In some embodiments, the control layer EL may be disposed between the light emitting pattern EP and the first electrode E1, and may be provided in a plurality of layers stacked along the third direction DR3 with the light emitting pattern EP therebetween.

The control layer EL may have an integral shape extending from the active area AA to the peripheral area NAA. The control layer EL may be provided in common to a plurality of pixels.

The second electrode E2 is disposed on the light emitting pattern EP. The second electrode E2 may be opposed to the first electrode E1. The second electrode E2 may have an integral shape extending from the active area AA to the peripheral area NAA. The second electrode E2 may be provided in common to a plurality of pixels. Each light emitting element OD disposed in each of the pixels may receive a common power voltage (hereinafter referred to as a second power voltage) through the second electrode E2.

The second electrode E2 may include a transmissive conductive material or a semi-transparent conductive material. Accordingly, light generated in the light emitting pattern EP may be easily emitted toward the third direction DR3 through the second electrode E2. However, embodiments of the present disclosure are not limited thereto. Depending on the design, the light emitting element OD according to an embodiment of the present disclosure may be driven according to a rear surface light-emission system (in which the first electrode E1 includes a transparent or semi-transparent material), or may be driven in a double-sided light-emission system (in which light is emitted towards both front and rear surfaces), but is not limited to any one embodiment.

The sealing substrate ECG may include an insulating material. For example, a sealing substrate ECG may include a glass substrate or a plastic substrate. The optical member OP described above may be disposed on the sealing substrate ECG. The display unit 210 according to an embodiment of the present disclosure includes a sealing substrate ECG so that it may have improved reliability against an external impact.

The sealing substrate ECG may be spaced a set or predetermined interval apart from the second electrode E2 in the third direction DR3. The space GP between the sealing substrate ECG and the second electrode E2 may be filled with air and/or an inert gas.

The sealing substrate ECG is combined with the base substrate BS through a sealing member PSL and seals the pixel PX. The sealing substrate ECG may be disposed on the base substrate BS while maintaining a set or predetermined interval through the sealing member PSL.

The sealing member PSL may be a configuration that defines the inner surface of the hole MH. The sealing member PSL may include an organic material (such as a photocurable resin and/or a photopolymerizable resin), or may include an inorganic material (such as a frit seal), and is not limited to any one embodiment.

The detection unit 220 is disposed on the sealing substrate ECG. The detection unit 220 includes a first conductive pattern MP1, a second conductive pattern MP2, a first detection insulating layer SI1, and a second detection insulating layer SI2.

The first conductive pattern MP1 is disposed on the sealing substrate ECG. The first conductive pattern MP1 may be formed directly on the sealing substrate ECG. In some embodiments, an additional protective layer may be disposed between the first conductive pattern MP1 and the sealing substrate ECG.

The first conductive pattern MP1 includes a conductive material. For example, the first conductive pattern MP1 may include a metal, a conductive oxide, a conductive polymer, or a combination thereof.

The second conductive pattern MP2 is disposed on the first conductive pattern MP1. The second conductive pattern MP2 includes a conductive material. For example, the second conductive pattern MP2 may include a metal, a conductive oxide, a conductive polymer, or a combination thereof.

The first detection insulating layer SI1 is disposed between the first conductive pattern MP1 and the second conductive pattern MP2. The second detection insulating layer SI2 is disposed on the first detection insulating layer SI1 to cover the second conductive pattern MP2. In this embodiment, a portion of the second conductive pattern MP2 may be connected to a portion of the first conductive pattern MP1 through the first detection insulating layer SI1.

The first conductive pattern MP1 and the second conductive pattern MP2 constitute the first sensing electrodes TE1 (see FIG. 3C) and the second sensing electrodes TE2 (see FIG. 3C). For example, the first conductive pattern MP1 may constitute a second connection pattern BP2 (see FIG. 3C), and the second conductive pattern MP2 may constitute first sensing electrodes TE1 (see FIG. 3C) and a second main pattern SP2 (see FIG. 3C). However, this is an example illustration. The first conductive pattern MP1 may constitute the first sensing electrodes TE1, and the second conductive pattern MP2 may constitute the second sensing electrodes TE2. Alternatively, the first conductive pattern MP1 may constitute the first sensing electrodes TE1 and the second main pattern SP2, and the second conductive pattern MP2 may constitute the second connection pattern BP2. However, embodiments of the present disclosure are not limited thereto. Some portions of the conductive patterns MP1 and MP2 may be disposed in the hole area HA. Configurations disposed in the hole area HA of the conductive patterns MP1 and MP2 may constitute compensation patterns and connection lines, as will be later described in more detail.

The hole MH penetrates the electronic panel 200 and is surrounded by the wiring area LA, to be later described in more detail. In this embodiment, the inner surface MHE1 of the hole MH may be defined by the cross-section of a base substrate BS, an auxiliary layer BL, a first insulating layer 10, a sealing member PSL, a sealing substrate ECG, a first detection insulating layer SI1, and a second detection insulating layer SI2.

As shown in FIG. 4B, the electronic panel 200-1 may include a sealing layer ECL. The sealing layer ECL is disposed on the light emitting element OD to seal the light emitting element OD. The sealing layer ECL may be provided in common to a plurality of pixels. In some embodiments, an additional capping layer covering the second electrode E2 may be disposed between the second electrode E2 and the sealing layer ECL.

The sealing layer ECL may include a first inorganic layer IOL1, an organic layer OL, and a second inorganic layer IOL2, which may be sequentially stacked along a third direction DR3. However, embodiments of the present disclosure are not limited thereto, and the sealing layer ECL may further include a plurality of inorganic layers and organic layers.

The first inorganic layer IOL1 may cover the second electrode E2. The first inorganic layer IOL1 may prevent or reduce external moisture and/or oxygen from penetrating the light emitting element OD. For example, the first inorganic layer IOL1 may include a silicon nitride, a silicon oxide, or a combination thereof. The first inorganic layer IOL1 may be formed through a deposition process.

The organic layer OL may be disposed on the first inorganic layer IOL1 and may contact the first inorganic layer IOL1. The organic layer OL may provide a flat surface on the first inorganic layer IOL1. The curve formed on the upper surface of the first inorganic layer IOL1 and the particles existing on the first inorganic layer IOL1 are covered by the organic layer OL to thereby reduce the influence of surface states of the upper surface of the first inorganic layer IOL1 on the structures formed on the organic layer OL. Further, the organic layer OL may reduce stress between adjacent layers. The organic layer OL may include an organic material, and may be formed through any suitable solution process (such as a spin coating process, a slit coating process, and/or an ink jet process).

The second inorganic layer IOL2 is disposed on the organic layer OL to cover the organic layer OL. The second inorganic layer IOL2 may be stably formed on a relatively flat surface, for example, on the organic layer OL disposed on the first inorganic layer IOL1. The second inorganic layer IOL2 may seal moisture and/or the like emitted by the organic layer OL, thereby reducing introduction of such moisture to the outside. The second inorganic layer IOL2 may include silicon nitride, silicon oxide, or a combination thereof. The second inorganic layer IOL2 may be formed through a deposition process.

The cover layer PL may be disposed on the sealing layer ECL. At least a portion of the sealing layer ECL may be covered. The cover layer PL may function as a planarization layer that provides a flat surface on the upper side, and/or may function as a protective layer that protects the sealing layer ECL. The detection unit 220 may be disposed on the cover layer PL. In this embodiment, the inner surface MHE1 of the hole MH may be defined by the cross-section of a first insulating layer 10, a second insulating layer 20, a first inorganic layer IOL1, a second inorganic layer IOL2, a cover layer PL, a first detection insulating layer SI1, and a second detection insulating layer SI2.

In some embodiments, in the electronic panel according to an embodiment of the present disclosure, the cover layer PL may be omitted. For example, the detection unit 220 may be disposed directly on the sealing layer ECL, but embodiments of the present disclosure are not limited thereto.

In the electronic panels 200 and 200-1 according to the present embodiment, a groove pattern GV may be formed in the hole area HA. The groove pattern GV is a depressed pattern from the front surface of the electronic panels 200 and 200-1, and may be formed by removing some of the configurations of the electronic panels 200 and 200-1. The groove pattern GV may not pass through the electronic panels 200 and 200-1 unlike the hole MH. Accordingly, the rear surface of the base substrate BS overlapping the groove pattern GV is not opened by the groove pattern GV.

In this embodiment, the base substrate BS may have flexibility. For example, the base substrate BS may include a resin such as polyimide.

In the electronic panel 200-1, the groove pattern GV may be formed to penetrate a portion of the base substrate BS adjacent to the hole MH and below the sealing layer ECL. In this embodiment, the groove pattern GV may be formed by connecting the penetration part formed in the auxiliary layer BL and the recessed part formed in the base substrate BS. The inner surface of the groove pattern GV may correspond to the penetration part formed in the auxiliary layer BL, and the recessed part formed in the base substrate BS may be covered by the first inorganic layer IOL1 and the second inorganic layer IOL2. In this embodiment, the inner surface of the groove pattern GV may be provided (e.g., covered) by the second inorganic layer IOL2.

The groove pattern GV may have an undercut shape including a tip part TP protruding inwards, for example, similar to that labeled in FIG. 4A. In the embodiment of FIG. 4B, the tip part TP may be formed as a portion of the auxiliary layer BL, and may protrude further toward the inner side of the groove pattern GV than the base substrate BS. Here, the tip part TP is formed in the groove pattern GV of the electronic panel 200-1. However, embodiments of the present disclosure may have various layer structures and are not limited hereto.

In an embodiment, the electronic panel 200-1 may further include a set or predetermined organic pattern EL-P disposed in the groove pattern GV. In some embodiments, the organic pattern EL-P may include the same material as the control layer EL. In some embodiments, the organic pattern EL-P may include the same material as the second electrode E2 or the capping layer PL. The organic pattern EL-P may have a single layer structure or a multilayer structure.

The organic pattern EL-P may be disposed within the groove pattern GV, spaced away (apart) from the control layer EL and the second electrode E2. It may be covered by the first inorganic layer IOL1, and may not be exposed to the outside.

According to embodiments of the present disclosure, the groove pattern GV may block continuity in the control layer EL that would otherwise connect the side surface of the hole MH to the active area AA. For example, the control layer EL may be disconnected in the area overlapping the groove pattern GV. The control layer EL may be or provide a path for movement of external pollutants (such as moisture or air). When moisture or air is introduced via a layer exposed by the module hole MH, for example, via the control layer EL, entry such pollutants to the pixel PX may be physically blocked by the groove pattern GV. As such, the reliability of the electronic panel 200-1 in which the hole MH is formed may be improved.

In the electronic panel 200-1 according to embodiments of the present disclosure, a plurality of groove patterns GV disposed apart from each other in the wiring area LA may be provided. In some embodiments, the groove pattern GV may be filled by a portion of the organic layer OL. In some embodiments, in the electronic panel DP according to an embodiment of the present disclosure, the groove pattern GV may be omitted.

Figure 5A:
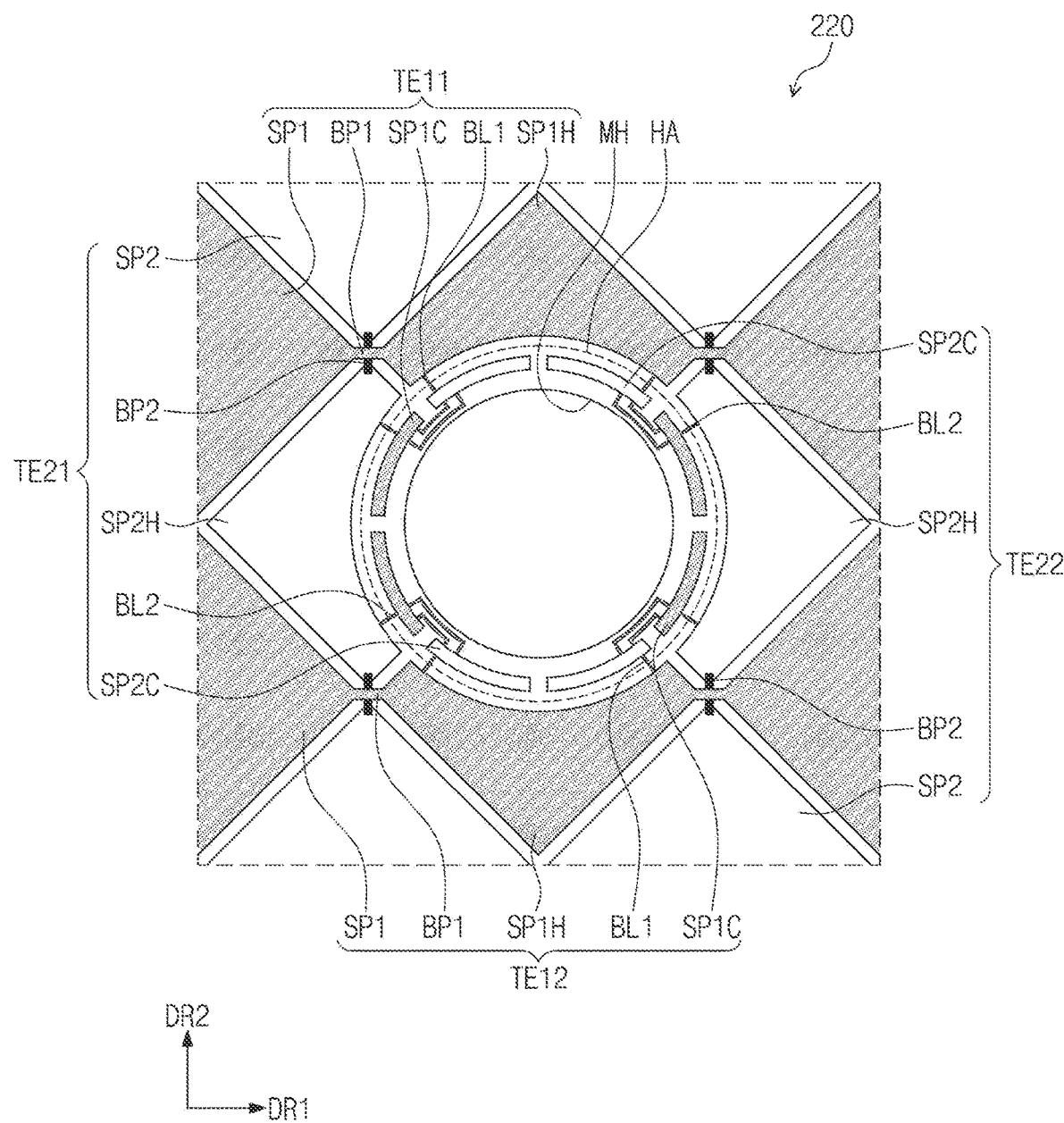
FIG. 5A is a plan view illustrating a portion of an electronic device according to an embodiment of the present disclosure.
Figure 5B:
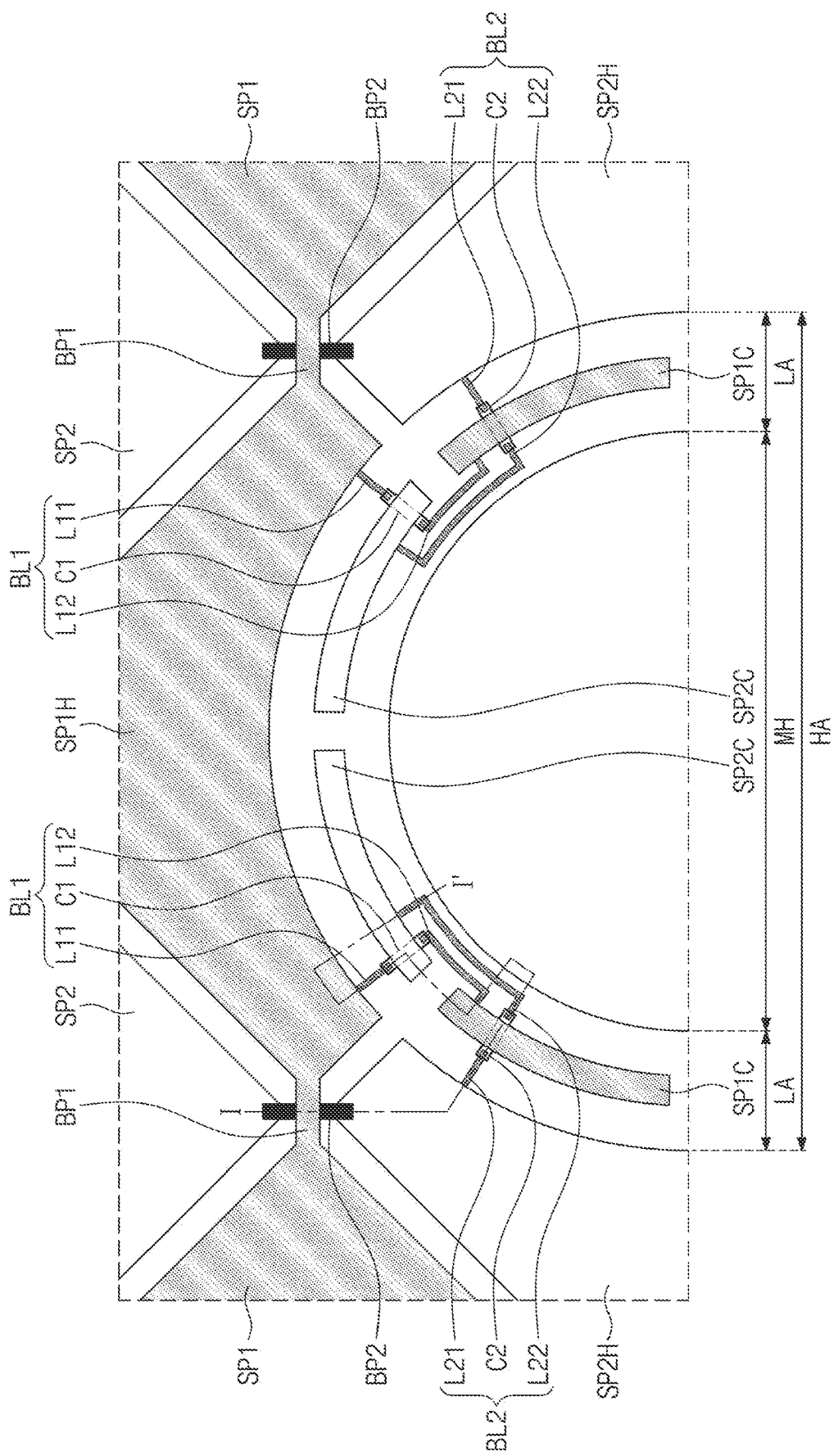
FIG. 5B is a plan view showing an enlarged partial area of FIG. 5A.
Figure 5C:
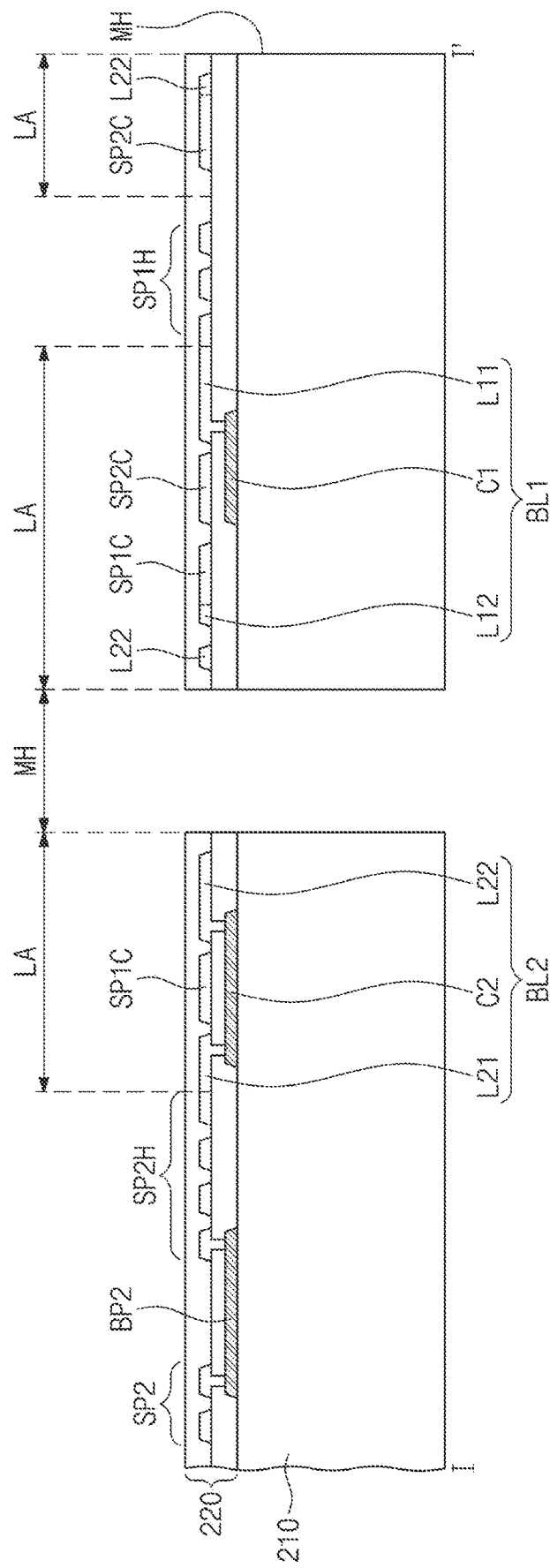
FIG. 5C is a cross-sectional view taken along a line I-I' shown in FIG. 5A.

FIG. 5A is a plan view illustrating a portion of an electronic device according to an embodiment of the present disclosure. FIG. 5B is a plan view showing an enlarged partial area of FIG. 5A. FIG. 5C is a cross-sectional view taken along a line I-I' shown in FIG. 5A. FIGS. 5A and 5B show only the configurations of the input sensing unit for ease explanation. Hereinafter, the present disclosure will be described with reference to FIGS. 5A to 5C. Moreover, components similar to those described in FIGS. 1A to 4B are denoted by the same or similar reference numerals and will be understood to have similar descriptions.

As shown in FIG. 5A, the hole MH may be surrounded by some of the sensing electrodes. Some of the sensing electrodes adjacent to the hole MH may have a shape partially cut off by the hole MH.

A first row sensing electrode TE11 and a second row sensing electrode TE12 among the first sensing electrodes TE1 (see FIG. 3C) and a first column sensing electrode TE21 and a second column sensing electrode TE22 among the second sensing electrodes TE2 (see FIG. 3C) are shown and described in FIG. 5A by way of example.

The first row sensing electrode TE11 and the second row sensing electrode TE12 are arranged apart from each other in the second direction DR2. Each of the first row sensing electrode TE11 and the second row sensing electrode TE12 includes a first main pattern SP1, a first adjacent pattern SP1H, a first compensation pattern SP1C, a first connection pattern BP1, and a first connection line BL1. The first main pattern SP1, the first connection pattern BP1, the first adjacent pattern SP1H, the first compensation pattern SP1C, and the first connection line BL1 are electrically connected to receive a common signal.

The first compensation pattern SP1C is disposed in the hole area HA. Specifically, the first compensation pattern SP1C may be disposed in the wiring area LA of the hole area HA.

The first connection pattern BP1 is connected to the first main pattern SP1. The first connection pattern BP1 may electrically connect the first main pattern SP1 and the first adjacent pattern SP1H. In addition, as described above, the first connection pattern BP1 connects the first main patterns SP1.

The first connection line BL1 is disposed in the hole area HA. For example, the first connection line BL1 may be disposed in the wiring area LA of the hole area HA. The first connection line BL1 is connected to the first adjacent pattern SP1H. The first connection line BL1 connects the first adjacent pattern SP1H and the first compensation pattern SP1C.

The first column sensing electrode TE21 and the second column sensing electrode TE22 are disposed (e.g., arranged) apart from each other in the first direction DR1. Each of the first column sensing electrode TE21 and the second column sensing electrode TE22 includes a second main pattern SP2, a second adjacent pattern SP2H, a second compensation pattern SP2C, a second connection pattern BP2, and a second connection line BL2. The second main pattern SP2, the second connection pattern BP2, the second adjacent pattern SP2H, the second compensation pattern SP2C, and the second connection line BL2 are electrically connected to receive a common signal.

The second compensation pattern SP2C is disposed in the hole area HA. Specifically, the second compensation pattern SP2C may be disposed in the wiring area LA of the hole area HA.

The second connection pattern BP2 is connected to the second main pattern SP2. The second connection pattern BP2 may electrically connect the second main pattern SP2 and the second adjacent pattern SP2H. In addition, as described above, the second connection pattern BP2 connects the second main patterns SP2.

In this embodiment, the second connection pattern BP2 may cross or intersect the first connection pattern BP1 in a plan view. The second connection pattern BP2 is disposed on a different layer from the first connection pattern BP1. For example, the first connection pattern BP1 may be disposed on the same layer as the first main pattern SP1 or the first adjacent pattern SP1H, and the second connection pattern BP2 may be disposed on a layer different from the first connection pattern BP1, the second main pattern SP2, or the second adjacent pattern SP2H.

Accordingly, the first connection pattern BP1 may have an integral shape connected to the first main pattern SP1. The second connection pattern BP2 may be connected to the second main pattern SP2 through the first detecting insulating layer SI1. However, embodiments of the present disclosure are not limited thereto. In the detection unit 220 according to an embodiment of the present disclosure, the first connection pattern BP1 and the second connection pattern BP2 may be disposed on various layers as long as they are insulated from each other.

The second connection line BL2 is disposed in the hole area HA. Specifically, the second connection line BL2 may be disposed in the wiring area LA of the hole area HA. The second connection line BL2 is connected to the second adjacent pattern SP2H. The second connection line BL2 connects the second adjacent pattern SP2H and the second compensation pattern SP2C.

The first compensation pattern SP1C may be disposed between the second adjacent pattern SP2H and the hole MH. The first compensation pattern SP1C may be spaced apart from the second adjacent pattern SP2H and may face a portion of the second adjacent pattern SP2H.

The first compensation pattern SP1C may be electrically connected to the first adjacent pattern SP1H through the first connection line BL1 and may be provided with substantially the same signal as the first main pattern SP1. Accordingly, a capacitance may be formed between the first compensation pattern SP1C and the second adjacent pattern SP2H.

The second compensation pattern SP2C may be electrically connected to the second adjacent pattern SP2H through the second connection line BL2 and may be provided with substantially the same signal as the second main pattern SP2. The second compensation pattern SP2C may be disposed between the first adjacent pattern SP1H and the hole MH. Accordingly, a capacitance may be formed between the second compensation pattern SP2C and the first adjacent pattern SP1H.

According to embodiments of the present disclosure, the input sensing unit 220 further includes a first compensation pattern SP1C and a second compensation pattern SP2C in order to easily detect external input even in the hole area HA containing the hole MH. Accordingly, a detection area for detecting an external input may be substantially extended to the inside of the hole area HA.

Also, by arranging the first and second compensation patterns SP1C and SP2C in the hole area HA facing the first and second adjacent patterns SP1H and SP2H having areas relatively smaller than the first and second main patterns SP1 and SP2, the sensitivity of the first and second adjacent patterns SP1H and SP2H may be compensated for, and uniform sensitivity in the active area AA may be maintained. The first and second compensation patterns SP1C and SP2C and the first and second connection lines BL1 and BL2 will be described in more detail with reference to FIGS. 5B and 5C.

In the present embodiment, the first compensation pattern SP1C and the second compensation pattern SP2C are disposed on the same layer as the first adjacent pattern SP1H and the second adjacent pattern SP2H. Specifically, the first compensation pattern SP1C, the second compensation pattern SP2C, the first adjacent pattern SP1H, and the second adjacent pattern SP2H may be disposed between the first detection insulating layer SI1 and the second detection insulating layer SI2.

The first connection pattern BP1 and the second connection pattern BP2 may be disposed on different layers. The first connection pattern BP1 and the second connection pattern BP2 may cross in a plan view. In this embodiment, the first connection pattern BP1 and the second connection pattern BP2 may be electrically insulated from each other with the first detection insulating layer SI1 therebetween.

The first connection line BL1 may include a plurality of first line patterns L11 and L12 and a first connection pattern C1. Although the first line patterns L11 and L12 are shown as shaded in FIG. 5B for ease of explanation (distinction), the first line patterns L11 and L12 are disposed on the same layer as the first compensation pattern SP1C and the first adjacent pattern SP1H. For example, the first line patterns L11 and L12, the first compensation pattern SP1C, and the first adjacent pattern SP1H may be disposed between the first detection insulating layer SI1 and the second detection insulating layer SI2.

The first line patterns L11 and L12 may be spaced from each other in a plan view. Any one of the first line patterns L11 and L12 (hereafter referred to as a first adjacent line) may be connected to the first adjacent pattern SP1H, and the other one of the first line patterns L11 and L12 (L12, hereinafter referred to as a first compensation line) may be connected to the first compensation pattern SP1C.

The first adjacent line L11 is connected to the first adjacent pattern SP1H and the first compensation line L12 is connected to the first compensation pattern SP1C. In this embodiment, the first line patterns L11 and L12 may be formed integrally with the first compensation pattern SP1C and the first adjacent pattern SP1H. For example, the first adjacent line L11 may have an integral shape connected to the first adjacent pattern SP1H. In addition, the first compensation line L12 may have an integral shape connected to the first compensation pattern SP1C.

In some embodiments, when the first adjacent line L11 contacts the upper surface or the lower surface of the first adjacent pattern SP1H, it may be connected to the first adjacent pattern SP1H. In some embodiments, when the first compensation line L12 contacts the upper surface or the lower surface of the first compensation pattern SP1C, it may be connected to the first compensation pattern SP1C. The first line patterns L11 and L12 may be connected to the first compensation pattern SP1C and the first adjacent pattern SP1H in any suitable manner, and are not limited to any one embodiment.

The first connection pattern C1 overlaps the second compensation pattern SP2C in a plan view. The first connection pattern C1 is disposed on a layer different from the second compensation pattern SP2C. The first connection pattern C1 may be disposed on the same layer as the second connection pattern BP2. For example, the first connection pattern C1 may be disposed between the display unit 210 and the first detection insulating layer SI1. The first connection pattern C1 may extend along a direction crossing the second compensation pattern SP2C.

The first connection pattern C1 connects the first line patterns L11 and L12. The first connection pattern C1 may be disposed on a different layer from the first line patterns L11 and L12. Each of the first adjacent line L11 and the first compensation line L12 is connected to the first connection pattern C1 through the first detection insulating layer SI1.

According to the present disclosure, even if the first line patterns L11 and L12 are disposed on the same layer as the second compensation pattern SP2C, they may be electrically connected through the first connection pattern C1. Accordingly, an electrical failure due to a short circuit between the first connection line BL1 and the second compensation pattern SP2C in the hole area HA may be prevented or reduced, so that the electrical reliability of the input sensing unit 220 may be improved.

The second connection line BL2 may include a plurality of second line patterns L21 and L22 and a second connection pattern C2. Although the second line patterns L21 and L22 are shown as shaded in FIG. 5B for ease explanation, the second line patterns L21 and L22 are disposed on the same layer as the second compensation pattern SP2C and the second adjacent pattern SP2H. Specifically, the second line patterns L21 and L22, the second compensation pattern SP2C, and the second adjacent pattern SP2H are disposed between the first detection insulating layer SI1 and the second detection insulating layer SI2.

The second line patterns L21 and L22 are spaced apart from each other in a plan view in a direction crossing the extension directions of the first and second compensation patterns SP1C and SP2C. Any one of the second line patterns L21 and L22 (hereafter referred to as a second adjacent line) may be connected to the second adjacent pattern SP2H, and the other one of the second line patterns L21 and L22 (L22, hereinafter referred to as a second compensation line) may be connected to the second compensation pattern SP2C.

The second adjacent line L21 is connected to the second adjacent pattern SP2H and the second compensation line L22 is connected to the second compensation pattern SP2C. In this embodiment, the second line patterns L21 and L22 may be formed integrally with the second compensation pattern SP2C and the second adjacent pattern SP2H. For example, the second adjacent line L21 may have an integral shape connected to the second adjacent pattern SP2H. Also, the second compensation line L22 may have an integral shape connected to the second compensation pattern SP2C.

In some embodiments, when the second adjacent line L21 contacts the upper surface or the lower surface of the second adjacent pattern SP2H, it may be connected to the second adjacent pattern SP2H. In some embodiments, when the second compensation line L22 contacts the upper surface or the lower surface of the second compensation pattern SP2C, it may be connected to the second compensation pattern SP2C. The second line patterns L21 and L22 may be connected to the second compensation pattern SP2C and the second adjacent pattern SP2H in any suitable manner, and are not limited to any one embodiment.

The second connection pattern C2 overlaps the first compensation pattern SP1C in a plan view. The second connection pattern C2 is disposed on a layer different from the first compensation pattern SP1C. The second connection pattern C2 may extend along the direction crossing the first compensation pattern SP1C.

The second connection pattern C2 connects the second line patterns L21 and L22. The second connection pattern C2 may be disposed on a different layer from the second line patterns L21 and L22. The second connection pattern C2 is disposed on the same layer as the first connection pattern C1. Specifically, the second connection pattern C2 may be disposed between the display unit 210 and the first detection insulating layer SI1. Each of the second adjacent line L21 and the second compensation line L22 is connected to the second connection pattern C2 through the first detection insulating layer SI1.

According to the present disclosure, even if the second line patterns L21 and L22 are disposed on the same layer as the first compensation pattern SP1C, they may be electrically connected through the second connection pattern C2. Accordingly, an electrical failure due to a short circuit between the second connection line BL2 and the first compensation pattern SP1C in the hole area HA may be prevented or reduced, so that the electrical reliability of the input sensing unit 220 may be improved.

Figure 6A:
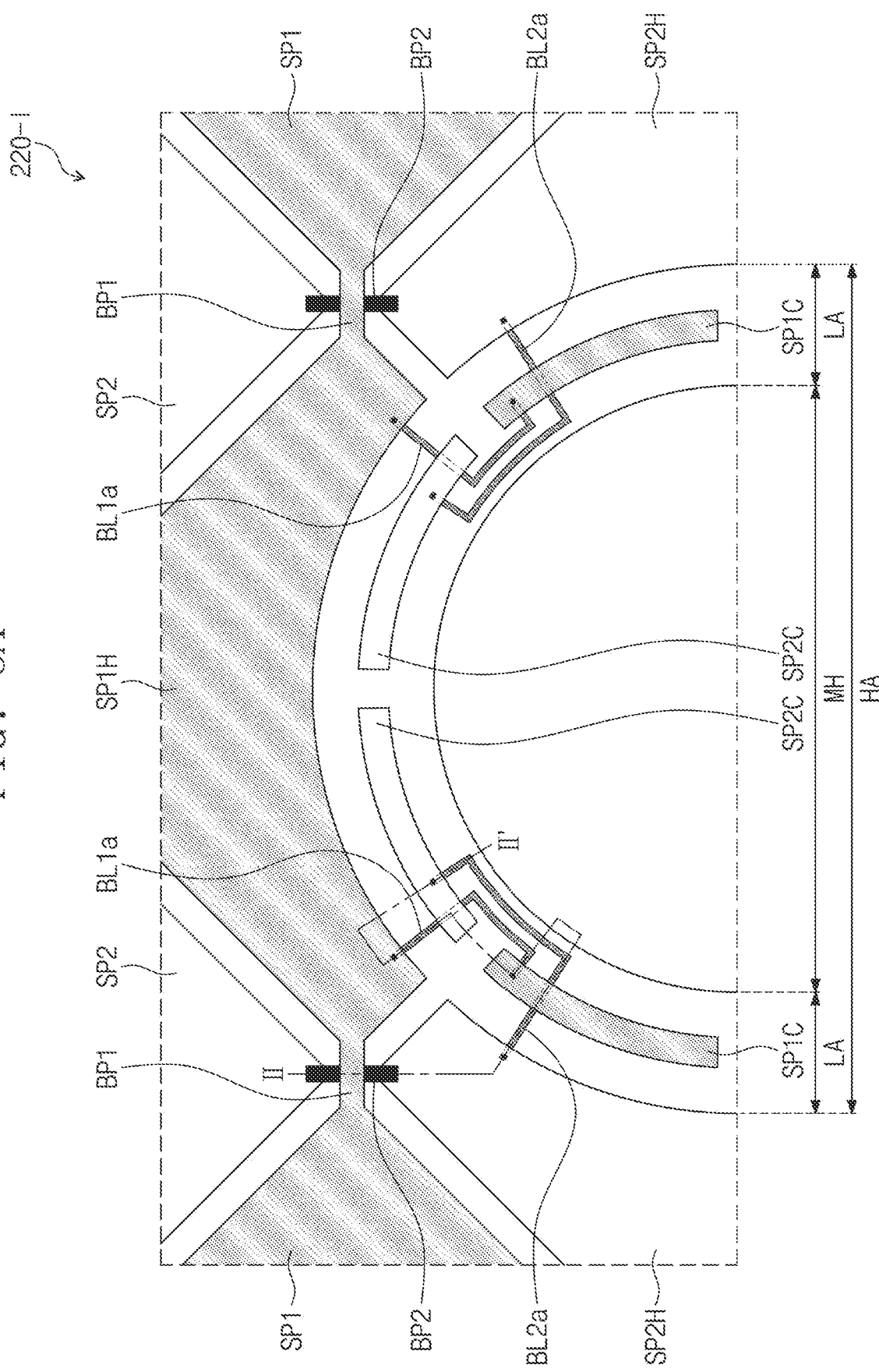
FIG. 6A is an enlarged plan view of a portion of an electronic device according to an embodiment of the present disclosure.
Figure 6B:
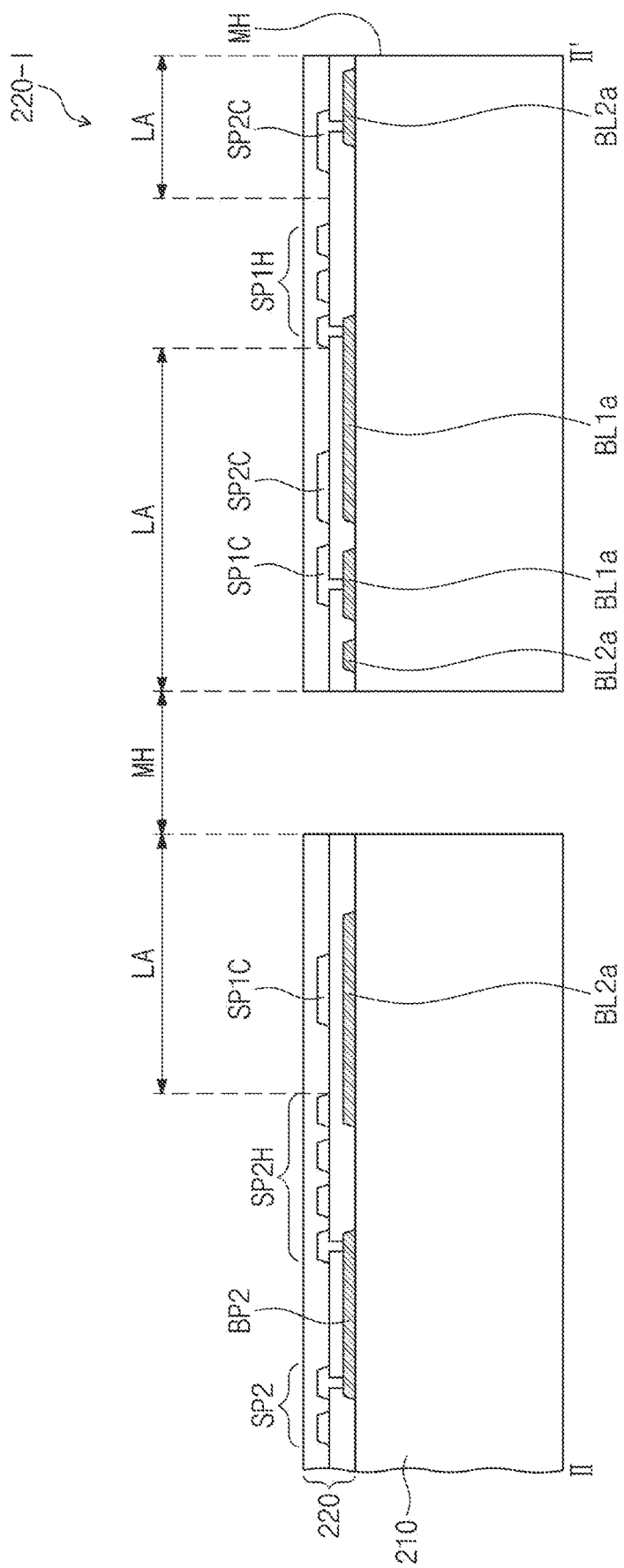
FIG. 6B is a cross-sectional view taken along the line II-II' shown in FIG. 6A.

FIG. 6A is an enlarged plan view of a portion of an electronic device according to an embodiment of the present disclosure. FIG. 6B is a cross-sectional view taken along the line II-II' shown in FIG. 6A. FIG. 6A shows an area corresponding to FIG. 5B, and FIG. 6B shows an area substantially corresponding to FIG. 5C. Hereinafter, embodiments of the present disclosure will be described with reference to FIGS. 6A and 6B. Moreover, components similar to those described in FIGS. 1A to 5C are given the same reference numerals and will be understood to have similar descriptions.

As shown in FIGS. 6A and 6B, in the input sensing unit 200-I, the first connection line BL1a and the second connection line BL2a may be disposed on a different layer from the first and second compensation patterns SP1C and SP2C. For example, the first connection line BL1a and the second connection line BL2a are disposed between the display unit 210 and the first detection insulating layer SI1. The first connection line BL1a and the second connection line BL2a are disposed on the same layer as the second connection pattern BP2.

The first connection line BL1a connects the first adjacent pattern SP1H and the first compensation pattern SP1C through the second compensation pattern SP2C. The first connection line BL1a overlaps the second compensation pattern SP2C in a plan view. The first connection line BL1a may insulatingly cross (e.g., be insulated from) the second compensation pattern SP2C. Each of the first adjacent pattern SP1H and the first compensation pattern SP1C may be connected to the first connection line BL1a through the first detection insulating layer SI1.

The second connection line BL2a connects the second adjacent pattern SP2H and the second compensation pattern SP2C through the first compensation pattern SP1C. The second connection line BL2a overlaps the first compensation pattern SP1C in a plan view. The second connection line BL2a may insulatingly cross (e.g., be insulated from) the first compensation pattern SP1C. Each of the second adjacent pattern SP2H and the second compensation pattern SP2C may be connected to the second connection line BL2a through the first detection insulating layer SI1.

The input sensing unit 200-I according to the present disclosure may include connection lines BL1a and BL2a disposed on different layers from the compensation patterns SP1C and SP2C. Accordingly, an electrical short between the compensation patterns SP1C and SP2C and the connection lines BL1a and BL2a may be prevented or reduced so that the degree of freedom of arranging the compensation patterns SP1C and SP2C and the connection lines BL1a and BL2a may be improved.

Figure 7A:
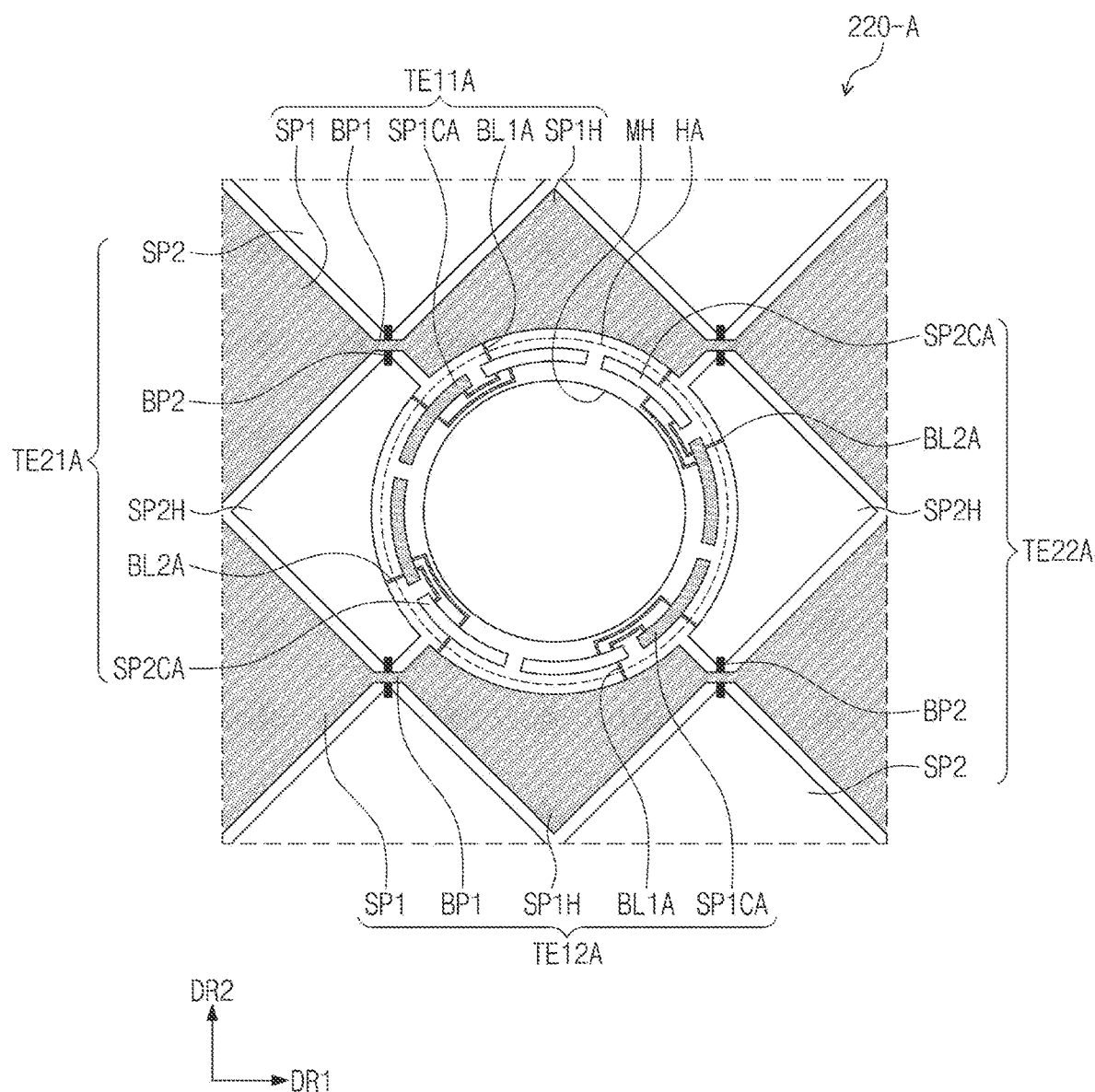
FIG. 7A is a plan view illustrating a portion of an electronic device according to an embodiment of the present disclosure.
Figure 7B:
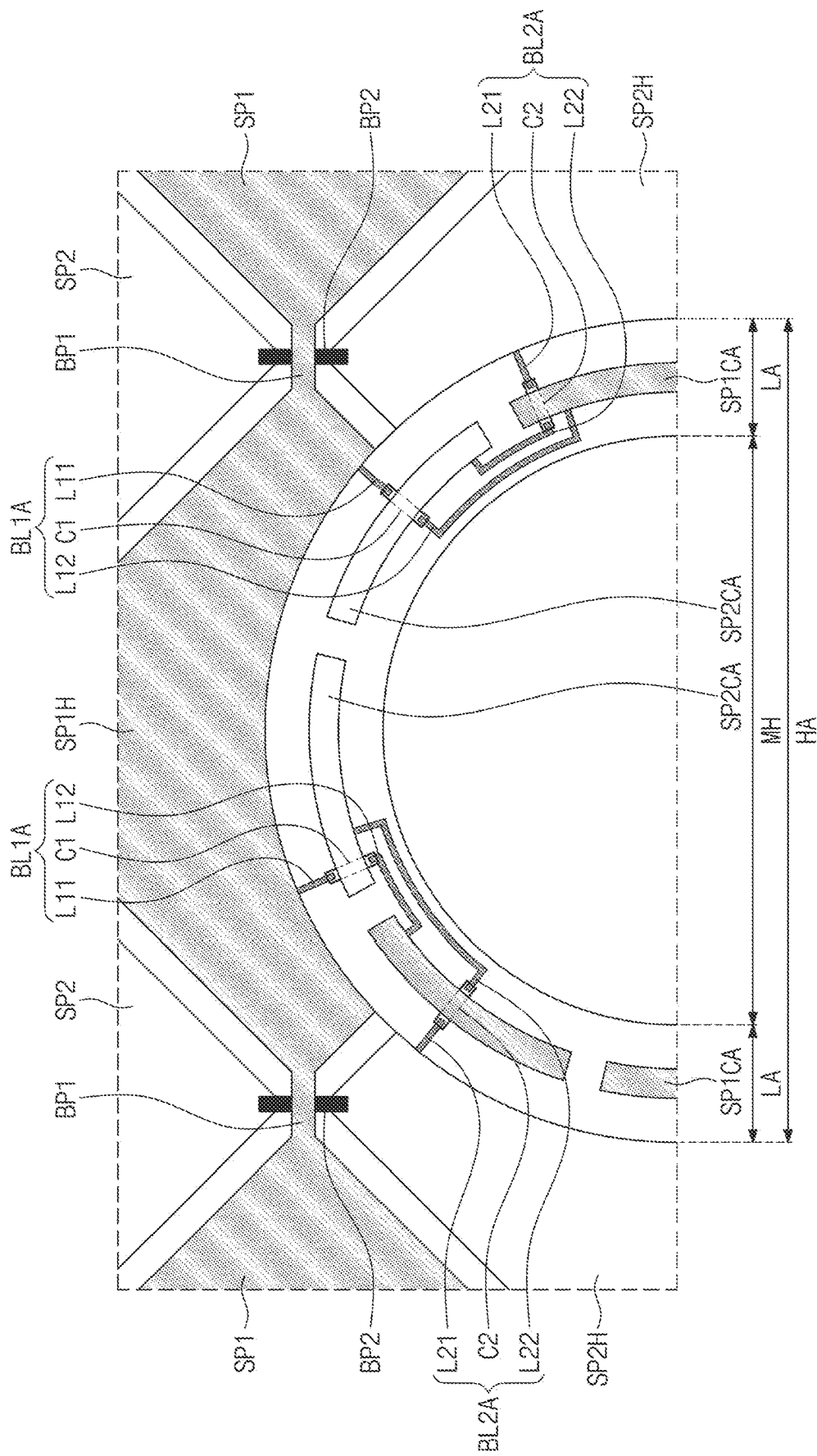
FIG. 7B is a plan view showing an enlarged partial area of FIG. 7A.

FIG. 7A is a plan view illustrating a portion of an electronic device according to an embodiment of the present disclosure. FIG. 7B is a plan view showing an enlarged partial area of FIG. 7A. For ease of explanation, FIG. 7A shows the area corresponding to FIG. 5A, and FIG. 7B shows the area corresponding to FIG. 5B.

FIG. 7A shows an input sensing unit 220-A including a first row sensing electrode TE11A and a second row sensing electrode TE12A spaced apart from each other in the second direction DR2, and a first column sensing electrode TE21A and a second column sensing electrode TE22A spaced from each other in the first direction DR1. Hereinafter, the present disclosure will be described with reference to FIGS. 7A and 7B. Moreover, components similar to those described in FIGS. 1A to 5C are given the same reference numerals and will be understood to have similar descriptions.

In this embodiment, the first compensation pattern SP1CA and the second compensation pattern SP2CA may be partially adjacent to (e.g., positioned within the area of) the first adjacent pattern SP1H or the second adjacent pattern SP2H. For example, the first compensation pattern SP1 CA may be partially adjacent to the first adjacent pattern SP1H. The first compensation pattern SP1 CA is connected to the first adjacent pattern SP1H through the first connection line BL1A. The first compensation pattern SP1 CA may face (e.g., be partially adjacent to) the second adjacent pattern SP2H forming the electrostatic capacitance, and also face (e.g., be partially adjacent to) the first adjacent pattern SP1H receiving the same signal.

In the same manner, the second compensation pattern SP2CA may be partially adjacent to (e.g., positioned within the area of) the second adjacent pattern SP2H. Some of the second compensation patterns SP2CA may face (e.g., be partially adjacent to) the first adjacent pattern SP1H and the second adjacent pattern SP2H, respectively. The second compensation pattern SP2CA may face (e.g., be partially adjacent to) the first adjacent pattern SP1H forming the electrostatic capacitance, and also face (e.g., be partially adjacent to) the second adjacent pattern SP2H receiving the same signal.

The first compensation pattern SP1CA is connected to the first adjacent pattern SP1H through the first connection line BL1A. The first connection line BL1A includes first line patterns L11 and L12 and a first connection pattern C1 connecting the first line patterns L11 and L12.

The second compensation pattern SP2CA is connected to the second adjacent pattern SP2H through the second connection line BL2A. The second connection line BL2A includes the second line patterns L21 and L22 and the second connection pattern C2 connecting the second line patterns L21 and L22.

The positions where the first and second compensation patterns SP1 CA and SP2CA are disposed may substantially correspond to positions in which the first and second compensation patterns SP1C and SP2C shown in FIG. 5 are rotated by a set or predetermined angle in the clockwise direction. According to embodiments of the present disclosure, the positions of the first and second compensation patterns SP1 CA and SP2CA may be variously changed within the hole area HA. The input sensing unit 220-A according to an embodiment of the present disclosure connects the first and second compensation patterns SP1CA and SP2CA to the first and the second adjacent patterns SP1H and SP2H through the first and second connection lines BL1A and BL2A, respectively, so that it may easily provide for a detection area in the hole area HA regardless of the positions of the first and second compensation patterns SP1CA and SP2CA.

Figure 8A:
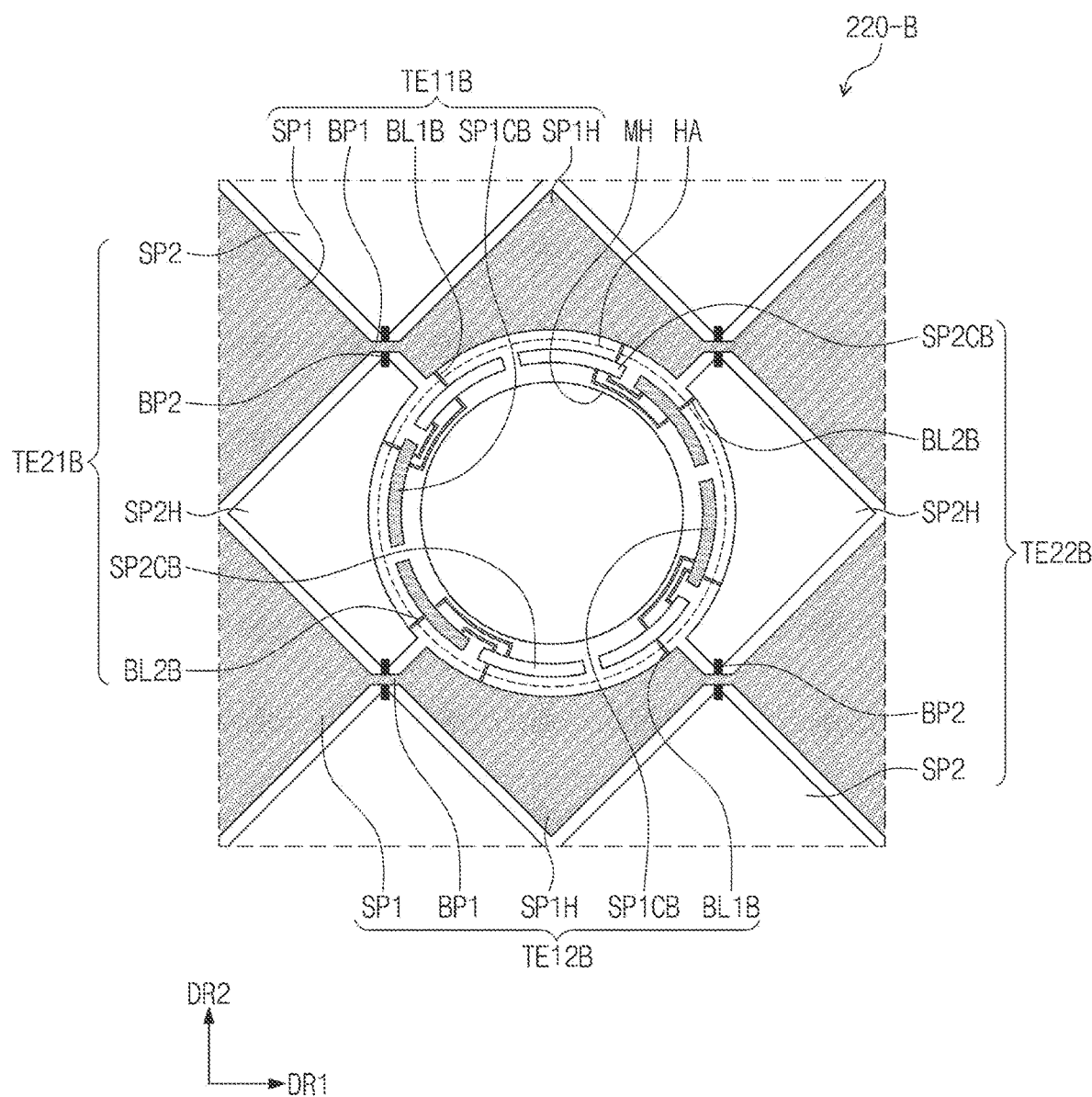
FIG. 8A is a plan view illustrating a portion of an electronic device according to an embodiment of the present disclosure.
Figure 8B:
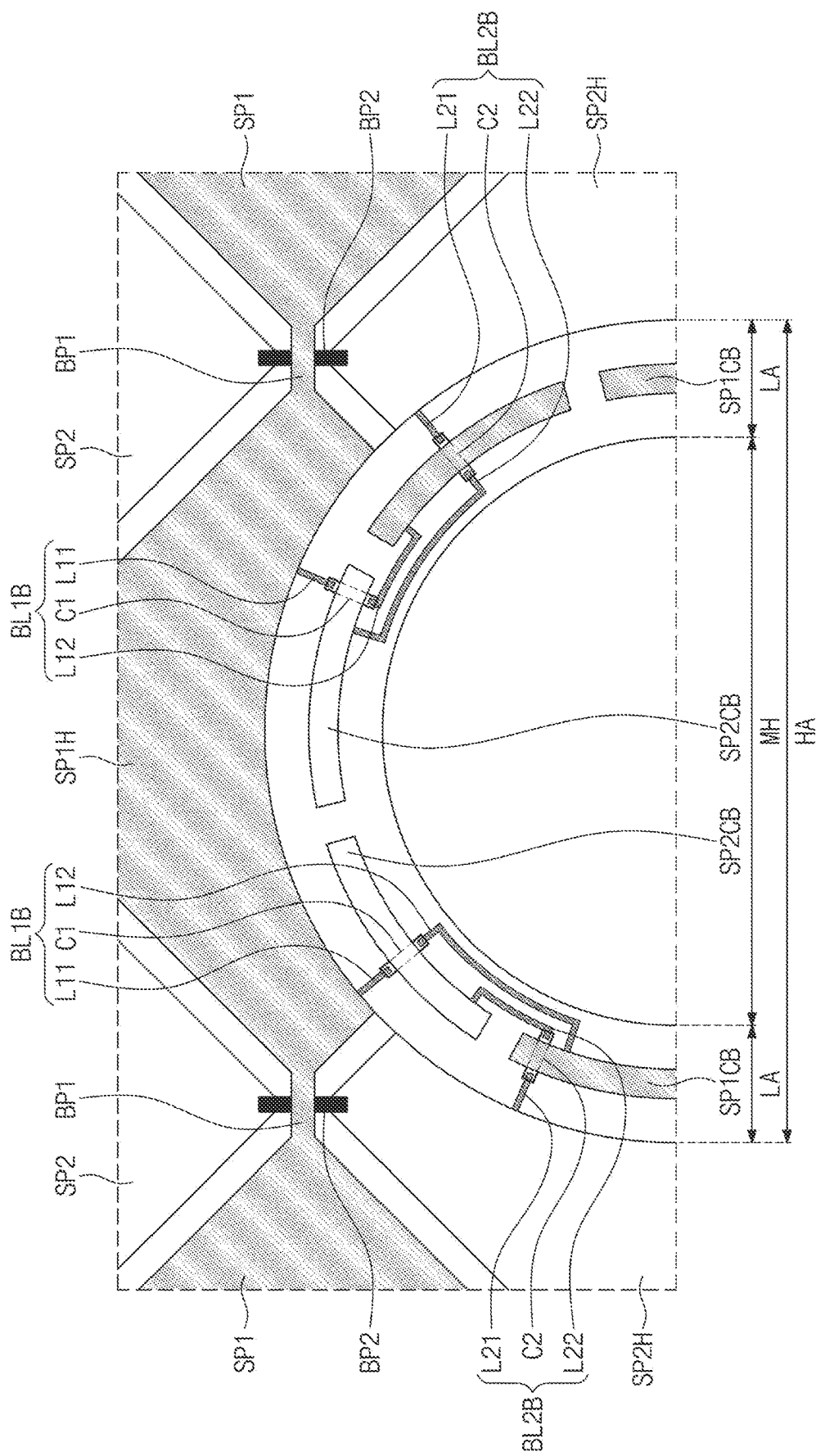
FIG. 8B is a plan view showing an enlarged partial area of FIG. 8A.

FIG. 8A is a plan view illustrating a portion of an electronic device according to an embodiment of the present disclosure. FIG. 8B is a plan view showing an enlarged partial area of FIG. 8A. For ease of explanation, FIG. 8A shows the area corresponding to FIG. 5A, and FIG. 8B shows the area corresponding to FIG. 5B.

FIG. 8A shows an input sensing unit 220-B including a first row sensing electrode TE11B and a second row sensing electrode TE12B spaced apart from each other in the second direction DR2 and a first column sensing electrode TE21B and a second column sensing electrode TE22B spaced from each other in the first direction DR1. Hereinafter, the present disclosure will be described with reference to FIGS. 8A and 8B. Moreover, components similar to those described in FIGS. 1A to 5C are given the same or similar reference numerals, and will be understood to have similar descriptions.

In the input sensing unit 220-B shown in FIGS. 8A and 8B, the first compensation pattern SP1CB and the second compensation pattern SP2CB may be partially adjacent to the first adjacent pattern SP1H or the second adjacent pattern SP2H. The first compensation pattern SP1CB may be partially adjacent to the first adjacent pattern SP1H. The first compensation pattern SP1CB is connected to the first adjacent pattern SP1H through the first connection line BL1B. The first compensation pattern SP1CB may face the second adjacent pattern SP2H forming the electrostatic capacitance, and also face the first adjacent pattern SP1H receiving the same signal.

In the same manner, the second compensation pattern SP2CB may be partially adjacent to the second adjacent pattern SP2H. Some of the second compensation patterns SP2CB face the first adjacent pattern SP1H and the second adjacent pattern SP2H, respectively. The second compensation pattern SP2CB may face the first adjacent pattern SP1H forming the electrostatic capacitance, and also face the second adjacent pattern SP2H receiving the same signal.

The first and second compensation patterns SP1CB and SP2CB according to the present embodiment may substantially correspond to an embodiment in which the first and second compensation patterns SP1C and SP2C shown in FIG. 5A are disposed at positions rotated by a set or predetermined angle along the counterclockwise direction. According to the present disclosure, the first and second compensation patterns SP1CB and SP2CB may be disposed at various positions. The input sensing unit 220-B connects the first and second compensation patterns SP1CB and SP2CB to the first and the second adjacent patterns SP1HB and SP2HB through the first and second connection lines BL1B and BL2B, so that it may easily provide the detection area in the hole area HA regardless of the positions of the first and second compensation patterns SP1CB and SP2CB.

Figure 9B:
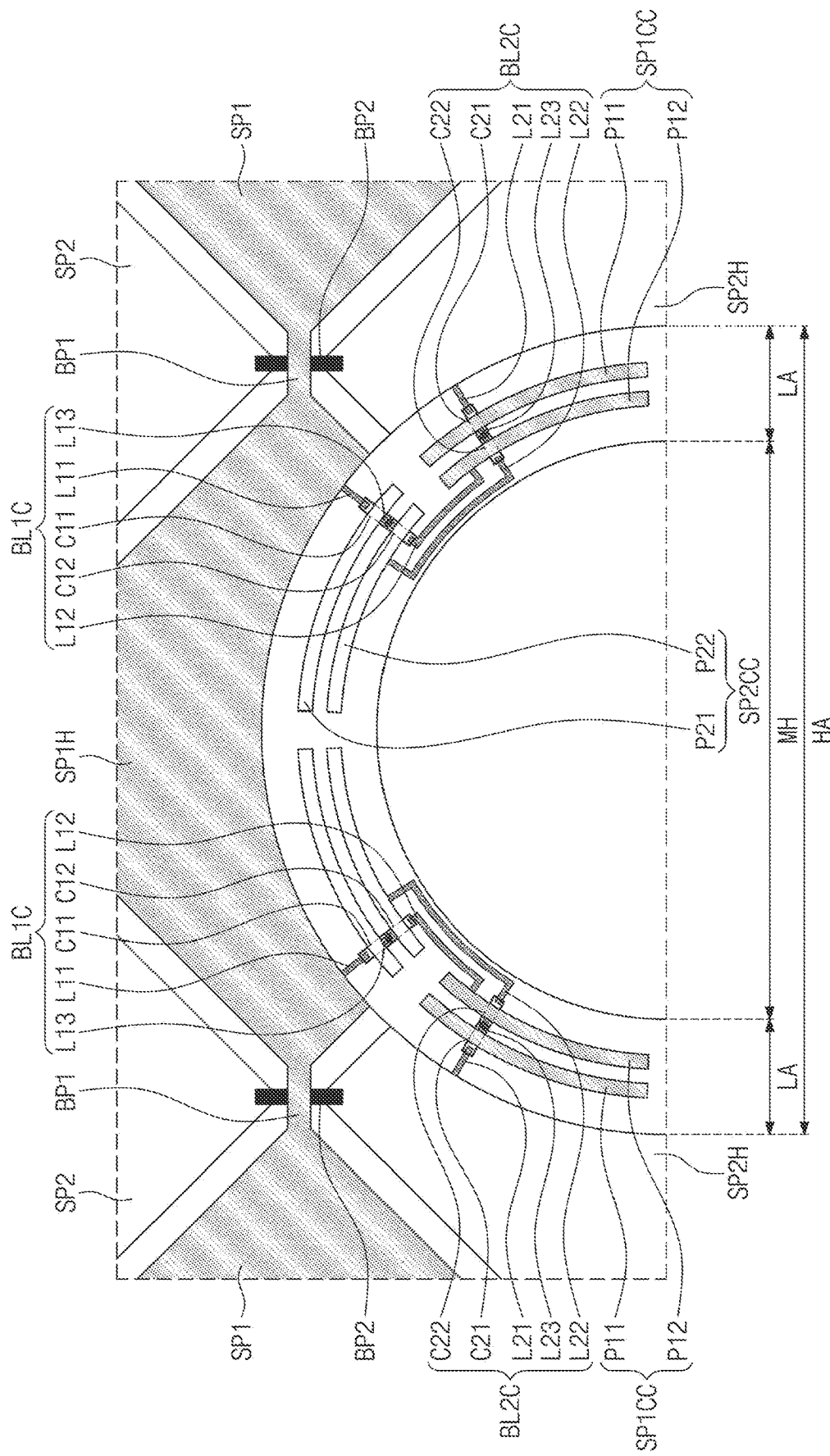
FIG. 9B is a plan view showing an enlarged partial area of FIG. 9A.

FIG. 9A is a plan view illustrating a portion of an electronic device according to an embodiment of the present disclosure. FIG. 9B is a plan view showing an enlarged partial area of FIG. 9A. For ease explanation, FIG. 9A shows the area corresponding to FIG. 5A, and FIG. 9B shows the area corresponding to FIG. 5B.

FIG. 9A shows an input sensing unit 220-C including a first row sensing electrode TE11C and a second row sensing electrode TE12C spaced apart from each other in the second direction DR2 and a first column sensing electrode TE21C and a second column sensing electrode TE22C spaced from each other in the first direction DR1. Hereinafter, the present disclosure will be described with reference to FIGS. 9A and 9B. Moreover, components similar to those described in FIGS. 1A to 5C are given the same reference numerals and will be understood to have similar descriptions.

In the input sensing unit 220-C shown in FIGS. 9A and 9B, each of the first and second compensation patterns SP1CC and SP2CC may include a plurality of patterns. The first compensation pattern SP1CC includes a first pattern P11 and a second pattern P12. Each of the first pattern P11 and the second pattern P12 extends along a portion of the edge of the hole MH. The first pattern P11 and the second pattern P12 may be spaced from each other in a direction crossing the extending direction of the first compensation pattern SP1CC (e.g., in a direction radial from the hole MH). The first pattern P11 and the second pattern P12 may be arranged along a direction away from the hole MH.

The second compensation pattern SP2CC includes a third pattern P21 and a fourth pattern P22. Each of the third pattern P21 and the fourth pattern P22 extends along a portion of the edge of the hole MH. The third pattern P21 and the fourth pattern P22 may be spaced from each other in a direction crossing the extending direction of the second compensation pattern SP2CC (e.g., in a direction radial from the hole MH). The third pattern P21 and the fourth pattern P22 may be arranged along a direction away from the hole MH.

The first compensation pattern SP1CC is connected to the first adjacent pattern SP1H through the first connection line BL1C. The first connection line BL1C may include a plurality of first line patterns L11, L12, and L13 and a plurality of connection patterns C11 and C12. The first line patterns L11, L12, and L13 are disposed in the hole area HA and are spaced apart from the first compensation pattern SP1CC and the second compensation pattern SP2CC in a plan view.

One of the first line patterns L11, L12, and L13 (L11, hereinafter referred to as a first adjacent line) is disposed between the first adjacent pattern SP1H and the second compensation pattern SP2CC. The first adjacent line L11 is connected to the first adjacent pattern SP1H.

Another one of the first line patterns L11, L12, and L13 (L12, hereinafter referred to as a first compensation line) is connected to the first compensation pattern SP1CC. The first compensation line L12 is disposed between the second compensation pattern SP2CC and the hole MH.

The remaining one of the first line patterns L11, L12, and L13 (L13, hereinafter referred to as a first intermediate line) is disposed between the third pattern P21 and the fourth pattern P22 of the second compensation pattern SP2CC. The first intermediate line L13 may extend along a direction crossing the extending direction of each of the third pattern P21 and the fourth pattern P22 (e.g., along a direction radial to the hole MH). The first intermediate line L13 is spaced apart from the third pattern P21 and the fourth pattern P22.

One of the first connection patterns C11 and C12 (for example, C11) overlaps the third pattern P21 in a plan view. Any one of the first connection patterns C11 and C12 (for example, C11) is disposed between the first adjacent line L11 and the first intermediate line L13 and connects the first adjacent line L11 and the first intermediate line L13.

The other one of the first connection patterns C11 and C12 (for example, C12) overlaps the fourth pattern P22 in a plan view. The other one of the first connection patterns C11 and C12 (for example, C12) is disposed between the first compensation line L12 and the first intermediate line L13 and connects the first compensation line L12 and the first intermediate line L13.

The first and second patterns P11 and P12 are connected to the first adjacent pattern SP1H through one first connection line BL1C. The first compensation pattern SP1CC including the first and second patterns P11 and P12 faces the second adjacent pattern SP2H while being adjacent to the second adjacent pattern SP2H. The first compensation pattern SP1CC forms a capacitance with the second adjacent pattern SP2H to form a detection area in the hole area HA.

The second compensation pattern SP2CC is connected to the second adjacent pattern SP2H through the second connection line BL2C. The second connection line BL2C may include a plurality of second line patterns L21, L22, and L23 and a plurality of second connection patterns C21 and C22. The second line patterns L21, L22, and L23 are disposed in the hole area HA and are spaced apart from the first compensation pattern SP1CC and the second compensation pattern SP2CC in a plan view.

The second line patterns L21, L22, and L23 correspond to the first line patterns L11, L12, and L13 and the second connection patterns C21 and C22 correspond to the first connection patterns C11 and C12. For example, the second line patterns L21, L22, and L23 include a second adjacent line L21, a second compensation line L22, and a second intermediate line L23, which are spaced apart from each other. The second connection patterns C21 and C22 are overlapped with the first pattern and the second pattern P11 and P12, respectively, so that they connect between the second adjacent line L21 and the second intermediate line L23 and between the second compensation line L22 and the second intermediate line L23.

The third and fourth patterns P21 and P22 are connected to the second adjacent pattern SP2H through one second connection line BL2C. The second compensation pattern SP2CC including the third and fourth patterns P21 and P22 faces the first adjacent pattern SP1H while being adjacent to the first adjacent pattern SP1H. The second compensation pattern SP2CC forms a capacitance with the first adjacent pattern SP1H to form a detection area in the hole area HA.

According to embodiments of the present disclosure, the first and second compensation patterns SP1CC and SP2CC disposed in the hole area HA may be designed in various forms. The number of patterns constituting each of the first and second compensation patterns SP1CC and SP2CC may be variously designed. The input sensing unit 220-C separates the first and second compensation patterns SP1CC and SP2CC into a plurality of patterns, so that the sensitivity in the hole area HA may be improved.

Figure 10A:
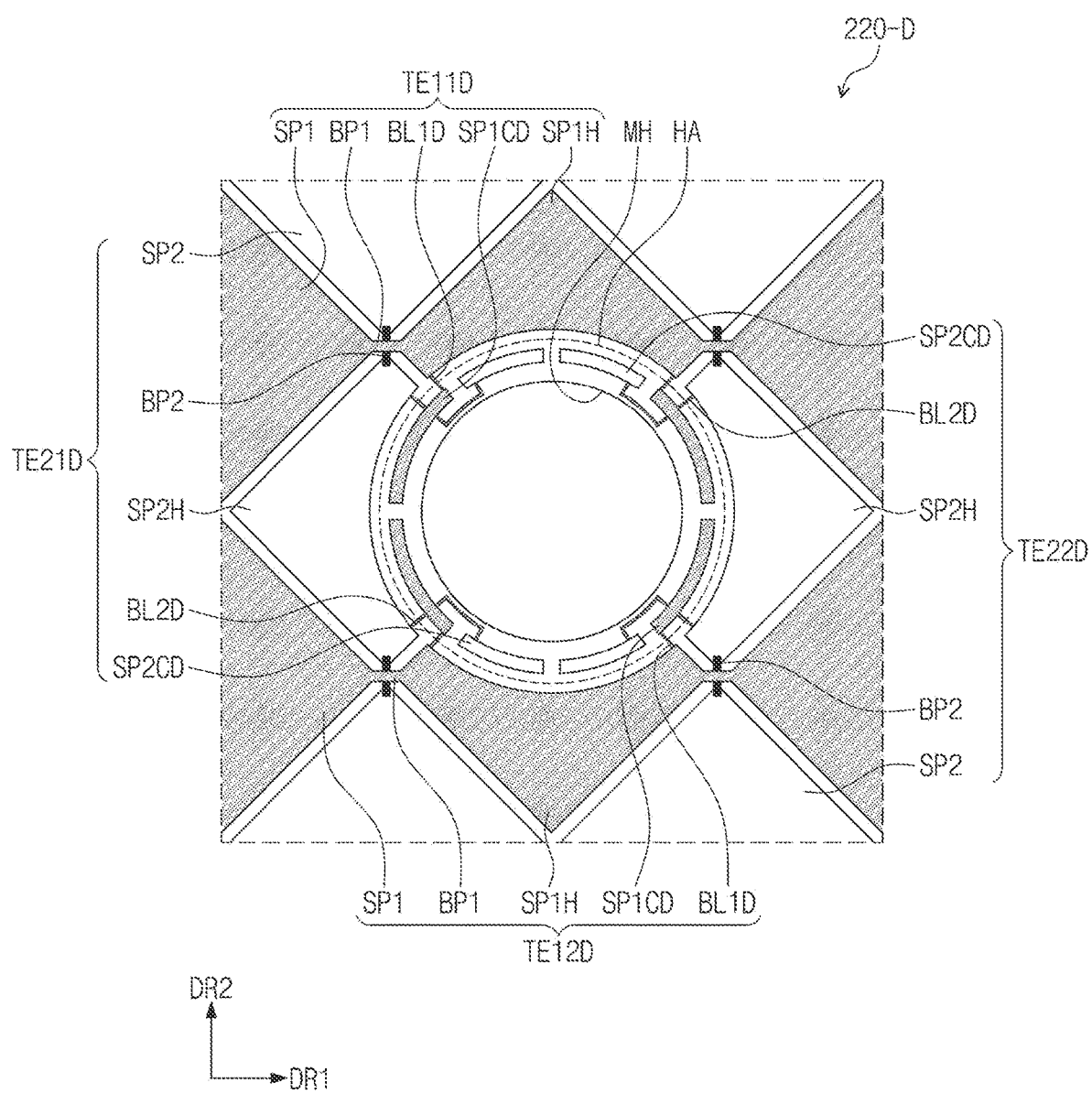
FIG. 10A is a plan view illustrating a portion of an electronic device according to an embodiment of the present disclosure.
Figure 10B:
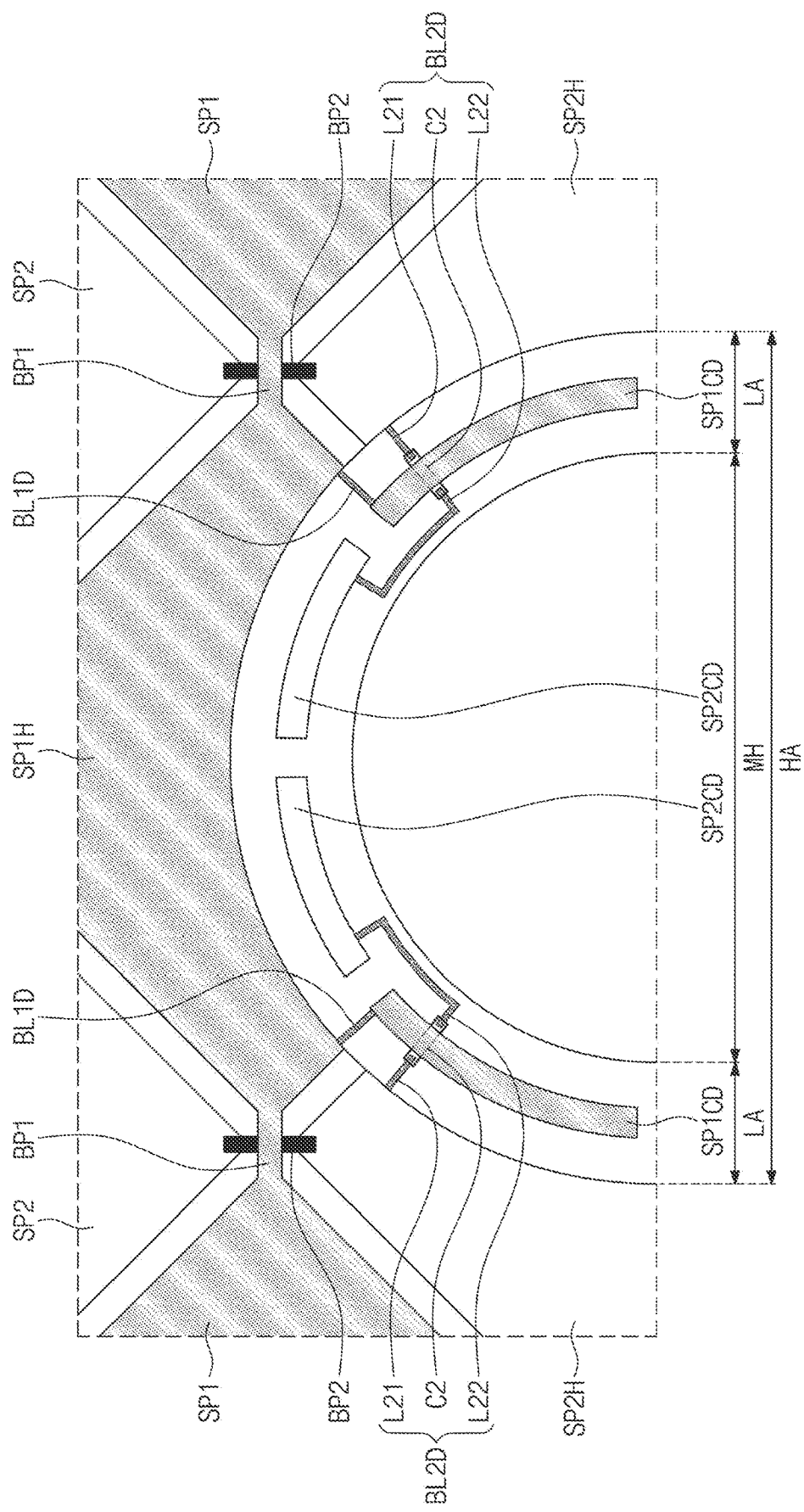
FIG. 10B is a plan view showing an enlarged partial area of FIG. 10A.

FIG. 10A is a plan view illustrating a portion of an electronic device according to an embodiment of the present disclosure. FIG. 10B is a plan view showing an enlarged partial area of FIG. 10A. For ease of explanation, FIG. 10A shows the area corresponding to FIG. 5A, and FIG. 10B shows the area corresponding to FIG. 5B.

FIG. 10A shows an input sensing unit 220-D including a first row sensing electrode TE11D and a second row sensing electrode TE12D spaced apart from each other in the second direction DR2, and a first column sensing electrode TE21D and a second column sensing electrode TE22D spaced from each other in the first direction DR1. Hereinafter, the present disclosure will be described with reference to FIGS. 10A and 10B. Moreover, components similar to those described in FIGS. 1A to 5C are given the same reference numerals and will be understood to have similar descriptions.

In the input sensing unit 220-D shown in FIGS. 10A and 10B, the first and second compensation patterns SP1CD and SP2CD may have different areas. In this embodiment, the first compensation pattern SP1CD is shown with an area (e.g., planar area) larger than that of the second compensation pattern SP2CD. When viewed from the hole MH, the first compensation pattern SP1CD may overlap the first adjacent pattern SP1H and the second adjacent pattern SP2H.

For example, the first compensation pattern SP1CD may have a length extending to face the second adjacent pattern SP2H and face at least a portion of the first adjacent pattern SP1H. The first compensation pattern SP1CD is electrically connected to the spaced first adjacent pattern SP1H through the first connection line BL1D and forms a capacitance with the facing second adjacent pattern SP2H.

In contrast, the second compensation pattern SP2CD may overlap only the first adjacent pattern SP1H when viewed from the hole MH. For example, the second compensation pattern SP2CD may have a length opposite to the first adjacent pattern SP1H and spaced from the second adjacent pattern SP2H. The second compensation pattern SP2CD is electrically connected to the spaced second adjacent pattern SP2H through the second connection line BL2D and forms a capacitance with the facing first adjacent pattern SP1H.

According to embodiments of the present disclosure, the first connection line BL1D may not overlap the second compensation pattern SP2CD in a plan view. The first connection line BL1D may be spaced apart from the second compensation pattern SP2CD and connected to the first adjacent pattern SP1H. The input sensing unit according to an embodiment of the present disclosure may be designed in various embodiments. For example, the first compensation pattern SP1CD may be provided with an area smaller than that of the second compensation pattern SP2CD. According to the present disclosure, by designing various area gradients of the first and second compensation patterns SP1CD and SP2CD disposed in the hole area HA, the sensitivity in the hole area HA may be uniformly maintained.

Figure 11A:
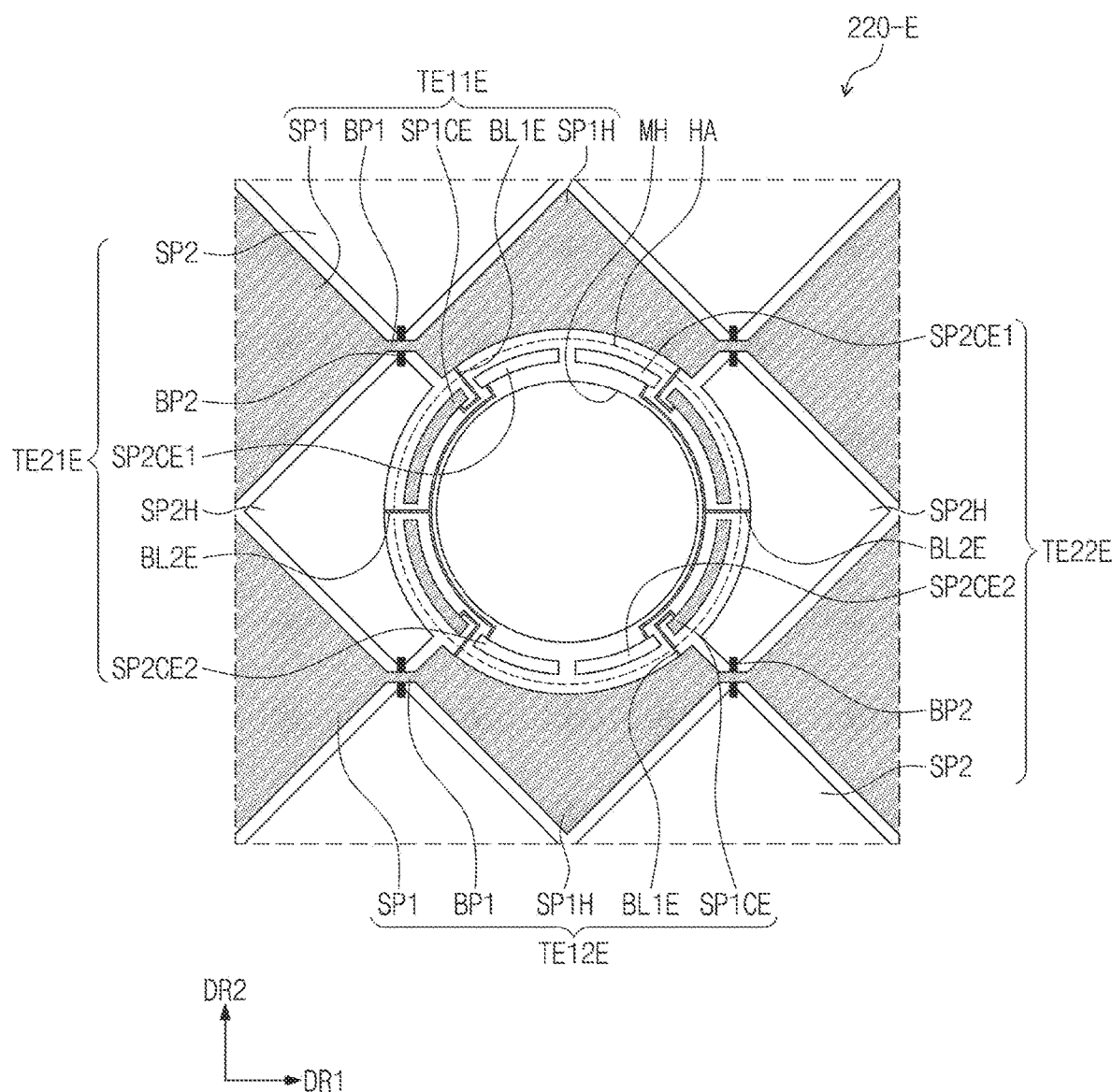
FIG. 11A is a plan view illustrating a portion of an electronic device according to an embodiment of the present disclosure.
Figure 11B:
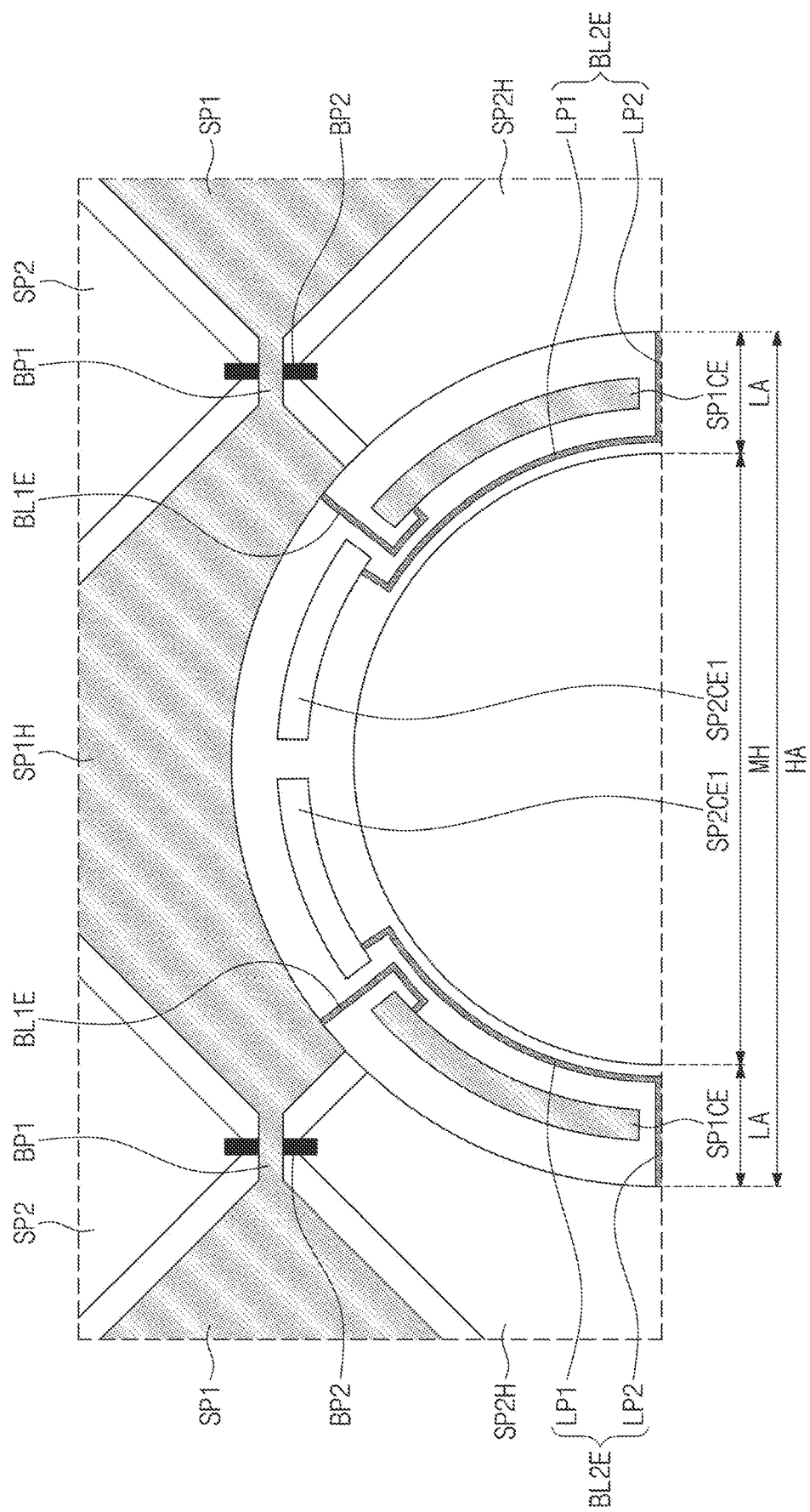
FIG. 11B is a plan view showing an enlarged partial area of FIG. 11A.

FIG. 11A is a plan view illustrating a portion of an electronic device according to an embodiment of the present disclosure. FIG. 11B is a plan view showing an enlarged partial area of FIG. 11A. For ease explanation, FIG. 11A shows the area corresponding to FIG. 5A, and FIG. 11B shows the area corresponding to FIG. 5B.

FIG. 11A shows an input sensing unit 220-E including a first row sensing electrode TE11E and a second row sensing electrode TE12E spaced apart from each other in the second direction DR2, and a first column sensing electrode TE21E and a second column sensing electrode TE22E spaced from each other in the first direction DR1. Hereinafter, embodiments of the present disclosure will be described with reference to FIGS. 11A and 11B. Moreover, components similar to those described in FIGS. 1A to 5C are given the same reference numerals and will be understood to have similar descriptions.

In the input sensing unit 220-E shown in FIGS. 11A and 11B, the first and second compensation patterns SP1CE and SP2CE (where SP2CE is divided into SP2CE1 and SP2CE2, collectively referred to as SP2CE) are shown with positions and shapes corresponding to the first and second compensation patterns SP1C and SP2C shown in FIG. 5A. Hereinafter, overlapping descriptions are omitted.

The first connection line BL1E connects the first compensation pattern SP1CE and the first adjacent pattern SP1H. In this embodiment, the first connection line BL1E and the second compensation pattern SP2CE may not overlap in a plan view. The first connection line BL1E may be spaced apart from the second compensation pattern SP2CE and connected to the first adjacent pattern SP1H.

The second connection line BL2E connects the second compensation pattern SP2CE and the second adjacent pattern SP2H. In this embodiment, the second connection line BL2E and the first compensation pattern SP1CE may not overlap in a plan view. The second connection line BL2E may be spaced apart from the first compensation pattern SP1CE and connected to the second adjacent pattern SP2H.

The second connection line BL2E according to the present embodiment may be connected to the plurality of second compensation patterns SP2CE. The second connection line BL2E includes a first line part LP1 and a second line part LP2. The first line part LP1 extends along a portion of the edge of the hole MH. The first line part LP1 may be a curve. The first line part LP1 may extend along the edge of the hole MH and may be connected to each of the plurality of second compensation patterns SP2CE.

The second line part LP2 is bent from the first line part LP1 and connected to the second adjacent pattern SP2H. The second line part LP2 may be disposed between the plurality of first compensation patterns SP1 CE.

According to embodiments of the present disclosure, the input sensing unit 220-E may connect one second adjacent pattern SP2H and two second compensation patterns SP2CE through one connection line BL2E. Thus, the design of the input sensing unit 220-E may be simplified. In addition, the number of connection lines BL1E and BL2E disposed in the hole area HA may be reduced so that unnecessary areas such as the margin area in the hole area HA may be reduced.

FIGS. 12A to 12E are plan views showing a portion of an input sensing unit according to an embodiment of the present disclosure. FIGS. 12A to 12E show areas corresponding to FIG. 5A. Hereinafter, the present disclosure will be described with reference to FIGS. 12A to 12E. Moreover, components similar to those described in FIGS. 1A to 3C are given by the same reference numerals and will be understood to have similar descriptions; and analogous components will be denoted with similar reference numerals (e.g., the terminal letter of similar element references in various devices will match that of the device) and will be understood to have similar descriptions.

Figure 12A:
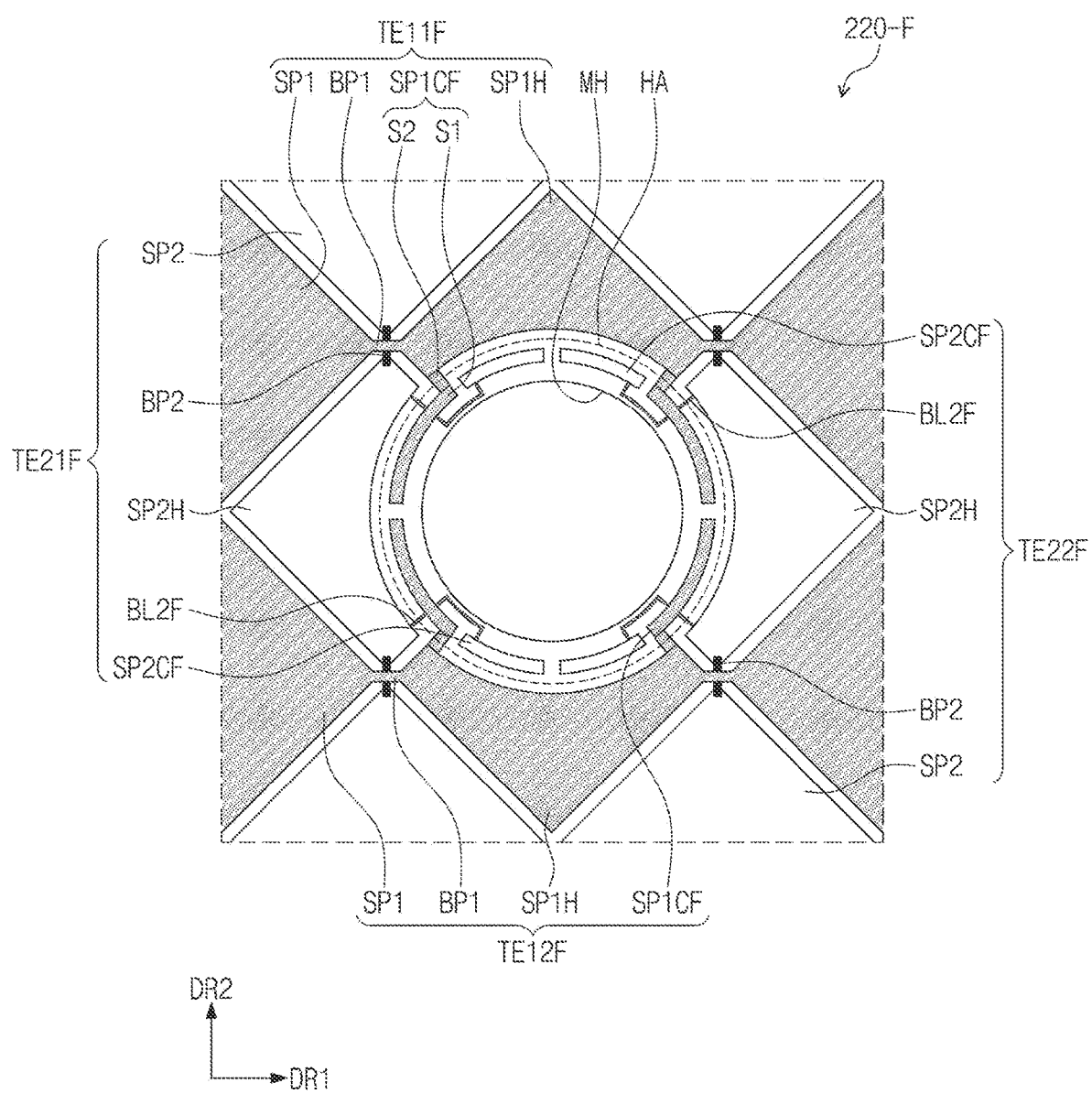
FIGS. 12A to 12E are plan views showing a portion of an input sensing unit according to various embodiments of the present disclosure.

As shown in FIG. 12A, in the input sensing unit 220-F, at least one of the first connection line and the second connection line may be omitted. In this embodiment, the first connection line is omitted and the first compensation pattern SP1CF may be directly connected to the first adjacent pattern SP1H.

The first compensation pattern SP1CF includes a first pattern portion S1 and a second pattern portion S2 protruding from the first pattern portion S1. The first pattern part S1 may be a pattern disposed in the hole area HA and extending along the edge of the hole MH. The first pattern part S1 may substantially correspond to the first compensation pattern SP1CD shown in FIG. 10B.

The second pattern part S2 is connected to the first pattern part S1. The second pattern part S2 may extend in the direction crossing the first pattern part S1 and may be connected to the first adjacent pattern SP1H. The second pattern part S2 may be disposed on the same layer as the first pattern part S1 and may have an integral shape connected to the first pattern part S1. The first pattern part S1 and the second pattern part S2 may have a mesh shape in which a plurality of opening parts are defined, or may have a curved or straight bar shape without an opening part. The first pattern part S1 and the second pattern part S2 may include a conductive material, and may be formed optically transparent or opaque, and are not limited to any one embodiment. The second pattern part S2 may be disposed on the same layer as the first adjacent pattern SP1H. The second pattern part S2 may have an integral shape with the first adjacent pattern SP1H or may be connected to the first adjacent pattern SP1H by directly contacting the upper or lower surface of the first adjacent pattern SP1H.

Meanwhile, in the present embodiment, the second pattern part S2 may extend along a direction parallel to the extension direction of the first pattern part S1. In this case, the second pattern part S2 may be designed in a shape not to be in contact with the first compensation pattern SP1CF and may be connected to the first adjacent pattern SP1H. If it is spaced apart from the first compensation pattern SP1CF and can be connected to the first pattern part S1 and the first adjacent pattern SP1H, the extending direction or shape of the second pattern part S2 may be provided in various ways. It is not limited to one embodiment.

It is shown that the second compensation pattern SP2CF is connected to the second adjacent pattern SP2H through the second connection line BL2F. As the second connection line BL2F includes the second connection pattern C2, even in an area that crosses the first compensation pattern SP1CF, it may stably connect the second adjacent pattern SP2H and the second compensation pattern SP2CF without interfering with the first compensation pattern SP1CF. This is illustrated by way of example. The second compensation pattern SP2CF may be directly connected to the second adjacent pattern SP2H, or the first and second compensation patterns SP1CF and SP2CF may be directly connected to the first and second adjacent patterns SP1H and SP2H respectively. They are not limited to any one embodiment. According to embodiments of the present disclosure, since the first compensation pattern SP1CF is directly connected to the first adjacent pattern SP1H, a separate first connection line may be omitted. Thus, the design and process of the input sensing unit 220-F may be simplified.

Figure 12B:
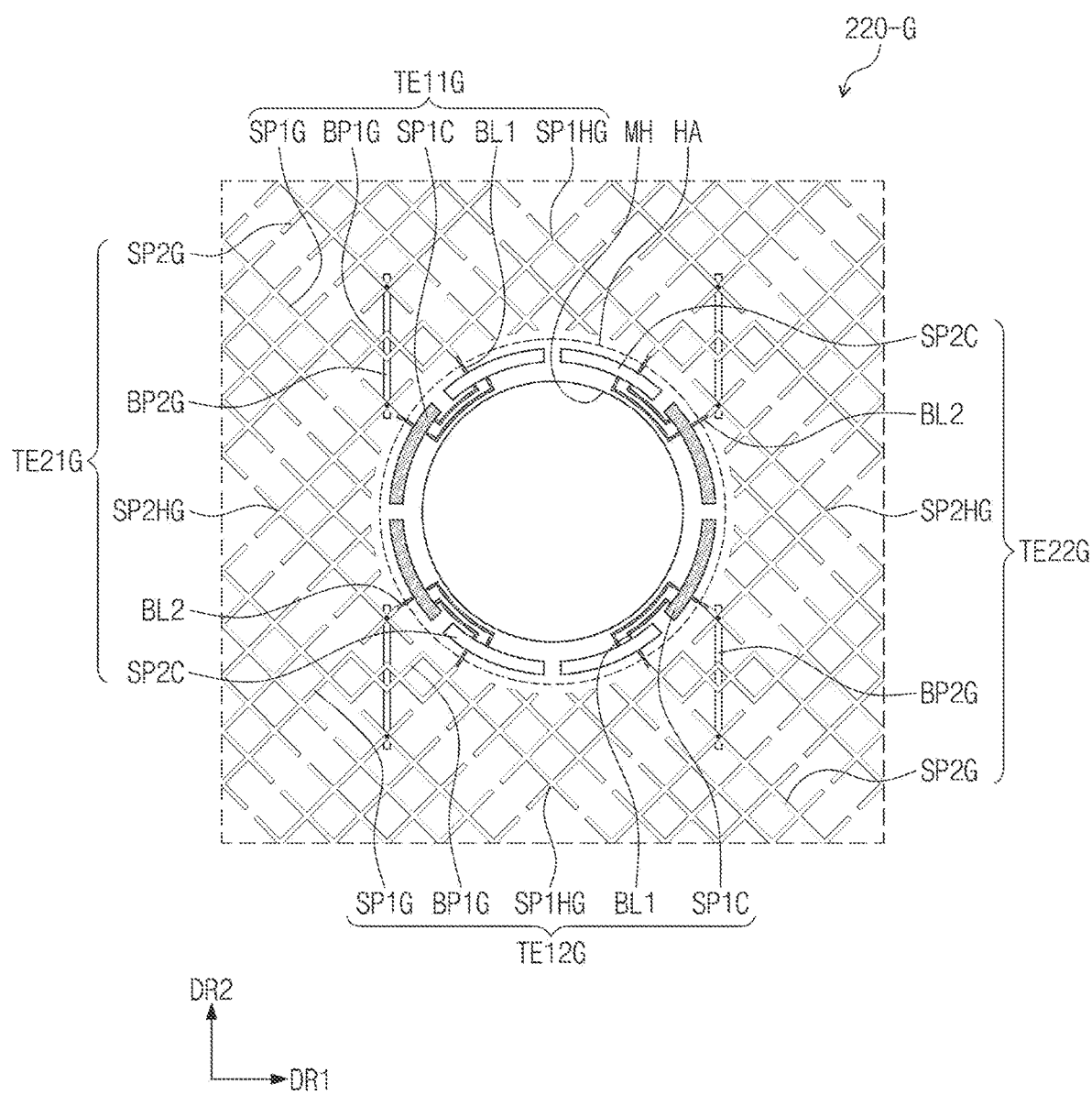

Referring to FIG. 12B, the input sensing unit 220-G may include sensing electrodes TE11G, TE12G, TE21G, and TE22G having a mesh shape. For example, the first and second main patterns SP1G and SP2G, the first connection pattern BP1G, the second connection pattern BP2G, and the first and second adjacent patterns SP1HG and SP2HG, which are disposed on the same layer, may be composed of a plurality of mesh lines crossing each other. The mesh lines may include a conductive material. For example, the mesh lines may be comprised of a metal, a conductive metal oxide, a conductive polymer, or a combination thereof. Accordingly, the detection unit 220-G may have improved flexibility and may have improved reliability against folding stress.

In an embodiment, the first and second compensation patterns SP1C and SP2C may have shapes different from the first and second adjacent patterns SP1HG and SP2HG. For example, instead of the mesh shape, the first and second compensation patterns SP1C and SP2C may have a curved bar shape extending along a portion of the edge of the hole MH. In some embodiments, the first and second compensation patterns SP1C and SP2C may have the same mesh shape as the first and second adjacent patterns SP1HG and SP2HG.

Figure 12C:
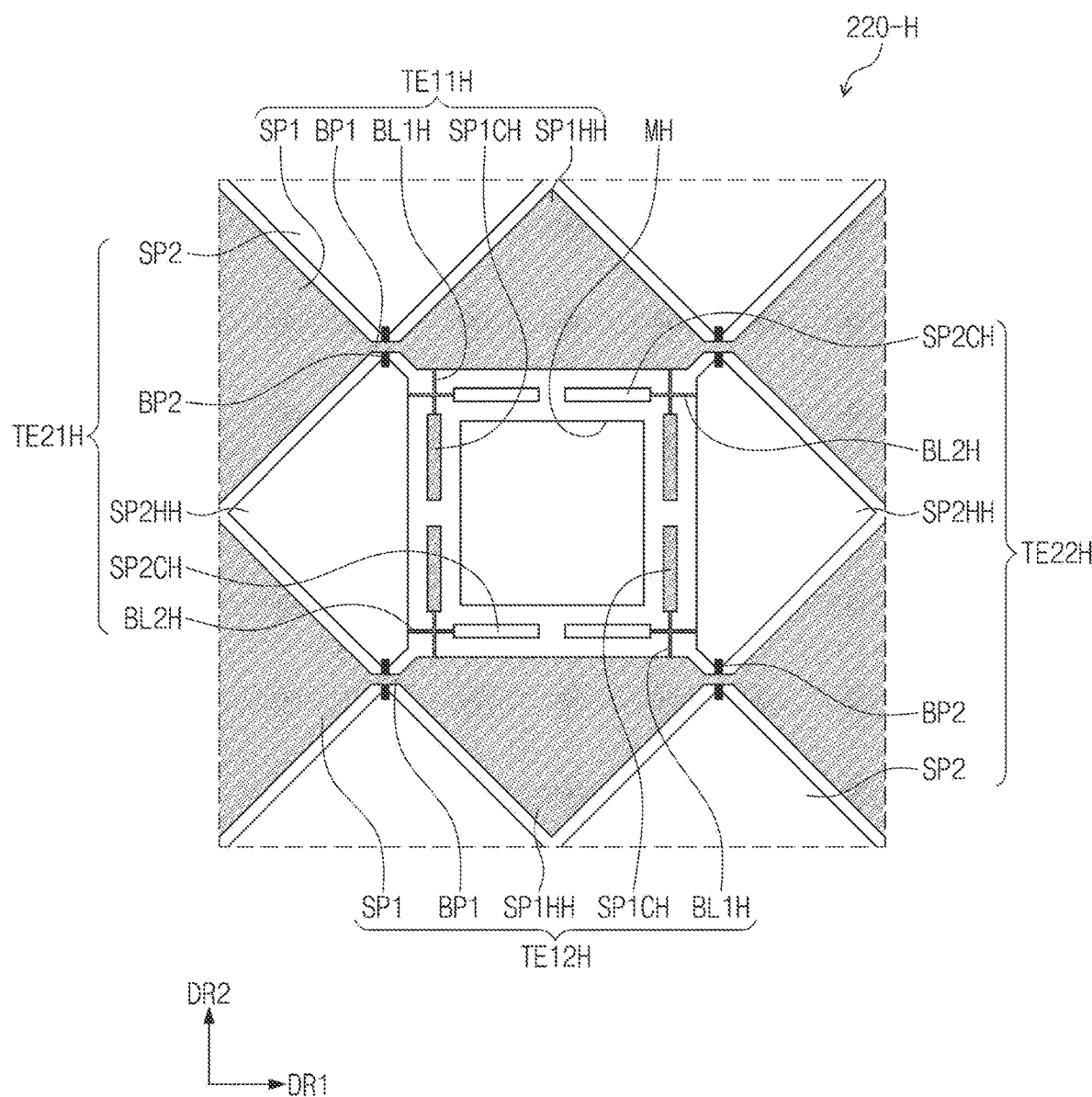

Referring to FIG. 12C, in the input sensing unit 220-H, the holes MH may have a polygonal shape in a plan view. In this embodiment, the holes MH are shown in a rectangular shape. The hole area HA is shown in a rectangular shape corresponding to the shape of the hole MH. In some embodiments, the hole area HA may be provided in a different shape from the shape of the hole MH, for example, a circle or an ellipse, and is not limited to any one embodiment.

Each of the first and second compensation patterns SP1CH and SP2CH may have a straight bar shape extending along the first direction DR1 or the second direction DR2. Each of the first and second connection lines BL1H and BL2H may have a linear shape extending along the first direction DR1 or the second direction DR2. In this embodiment, the first and second connection lines BL1H and BL2H may intersect or cross in a plan view. At this time, the first and second connection lines BL1H and BL2H are disposed on different layers, so that the first and second connection lines BL1H and BL2H may be free from electrical interference with each other. Alternatively, each of the first and second connection lines BL1H and BL2H may avoid electrical interference in the overlapping area through the connection pattern.

Figure 12D:
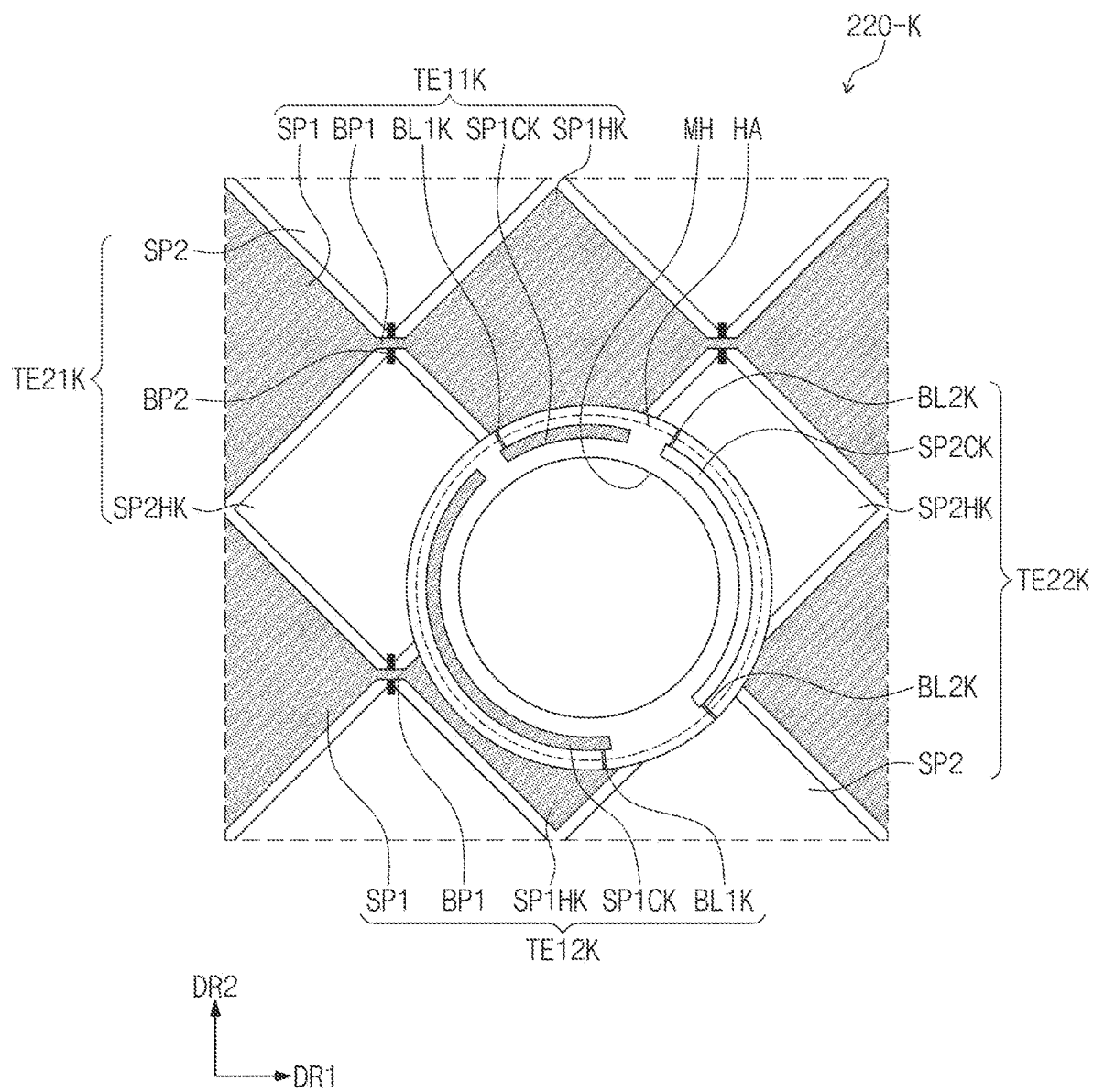

According to the present disclosure, although the holes MH are provided in various shapes, through the design of the first and second compensation patterns SP1CH and SP2CH and the first and second connection lines BL1H and BL2H, it is possible to prevent deterioration in sensitivity in the hole area HA having various shapes. Referring to FIG. 12D, in the input sensing unit 220-K, the position of the hole MH may be suitably changed. In FIG. 12D, the hole MH is shown as being defined in an area biased to the right side lower end part with respect to the hole MH shown in FIG. 5A. For example, the first adjacent pattern SP1HK and the second adjacent pattern SP2H may be provided as a group of three.

The compensation patterns may be provided in various numbers (e.g., multiplicity of sections). In this embodiment, three compensation patterns are shown provided in the hole area HA. The first compensation pattern SP1CK is provided as two sections or parts, which are each connected to one of two adjacent patterns among the three first adjacent patterns SP1HK. One of the two first compensation patterns SP1CK constitutes a first row sensing electrode TE11K and the other of the two first compensation patterns SP1CK constitutes a second row sensing electrode TE12K. The two first compensation patterns SP1CK may compensate for the area reduction of the three first adjacent patterns SP1HK.

The second compensation pattern SP2CK is provided as one pattern (section or part) and is connected to two second adjacent patterns SP2HK and SP2. The second compensation pattern SP2CK may constitute the second column sensing electrode TE22K. The second compensation pattern SP2CK may compensate for the area reduction of the three second adjacent patterns SP2HK and SP2.

According to embodiments of the present disclosure, the position of the hole MH may be variously changed. The input sensing unit 220-K may compensate for the area reduction of adjacent patterns generated according to the positions of the holes MH by changing the area and arrangement of the compensation patterns. Accordingly, the external input sensitivity in the hole area HA may be stably maintained.

Figure 12E:
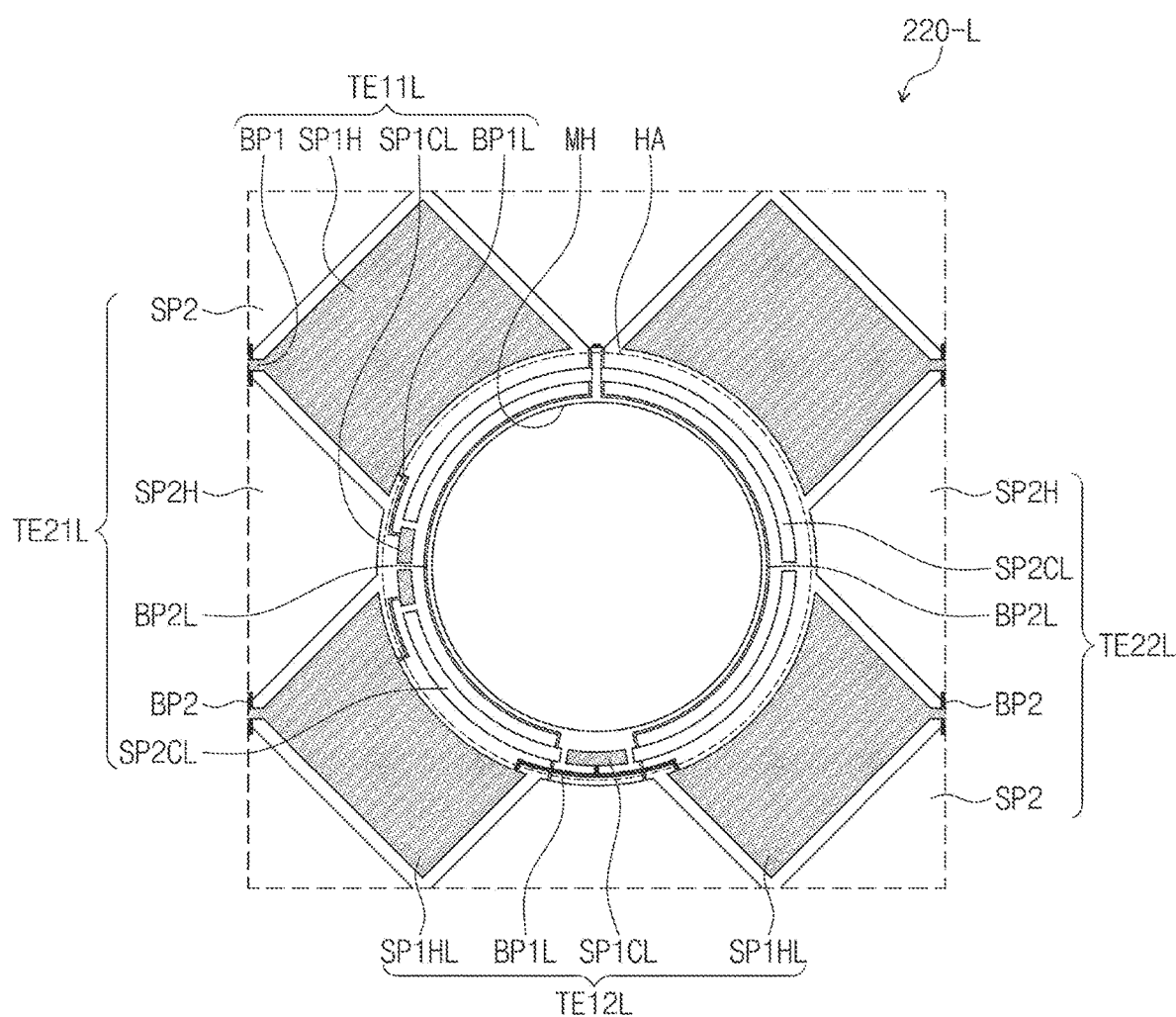

Referring to FIG. 12E, in an input sensing unit 220-L according to an embodiment of the present disclosure, connection lines may be omitted. In the first sensing electrodes TE11L and TE12L, the first adjacent pattern SP1HL and the first compensation pattern SP1CL may be connected through the first connection pattern BP1L. The first connection pattern BP1L connects the first adjacent patterns SP1HL spaced apart from each other with the holes area HA therebetween.

The first connection pattern BP1L connects adjacent first adjacent patterns SP1H L. The first connection pattern BP1L may be connected to the first compensation pattern SP1CL. That is, the first connection pattern BP1L may extend to the hole area HA, and the two first adjacent patterns SP1HL and the first compensation pattern SP1CL may be electrically connected through one first connection pattern BP1L.

Each of the second sensing electrodes TE21L and TE22L may include two second connection patterns BP2 and BP2L. One of the second connection patterns BP2 and BP2L may connect the second main pattern SP2 and the second adjacent pattern SP2H, or may connect the second main patterns SP2.

The other one BP2L of the second connection patterns BP2 and BP2L may connect the second main pattern SP2 and the second adjacent pattern SP2H spaced apart from each other with the hole MH therebetween. Thus, the second connection pattern BP2L is connected to the second main pattern SP2 and the second adjacent pattern SP2H through the hole area HA.

The second compensation pattern SP2CL may be connected to the second connection pattern BP2L. The second connection pattern BP2L may simultaneously or concurrently connect the second compensation pattern SP2CL, the second adjacent pattern SP2H, and the second main pattern SP2. The second connection pattern BP2L may be disposed to overlap or be adjacent to the second compensation pattern SP2CL, the second adjacent pattern SP2H, and the second main pattern SP2 on a plane. The second connection pattern BP2L may directly contact the second compensation pattern SP2CL, the second adjacent pattern SP2H, and the second main pattern SP2 or may be connected through a contact hole or the like.

In this embodiment, the first connection pattern BP1L may cross the second connection pattern BP2L to overlap the second connection pattern BP2L in a plan view. The second connection pattern BP2L and the first connection pattern BP1L may be disposed on different layers. Accordingly, even if the second connection pattern BP2L and the first connection pattern BP1L cross each other, interference between each other may be prevented or reduced.

According to embodiments of the present disclosure, an adjacent pattern, a main pattern, a compensation pattern, or two adjacent patterns and a compensation pattern may be simultaneously or concurrently connected through one connection pattern. Accordingly, it may be possible to stably maintain the electrical connection between the sensing electrodes spaced apart from each other with the hole MH therebetween without including additional connection lines.

Figure 13A:
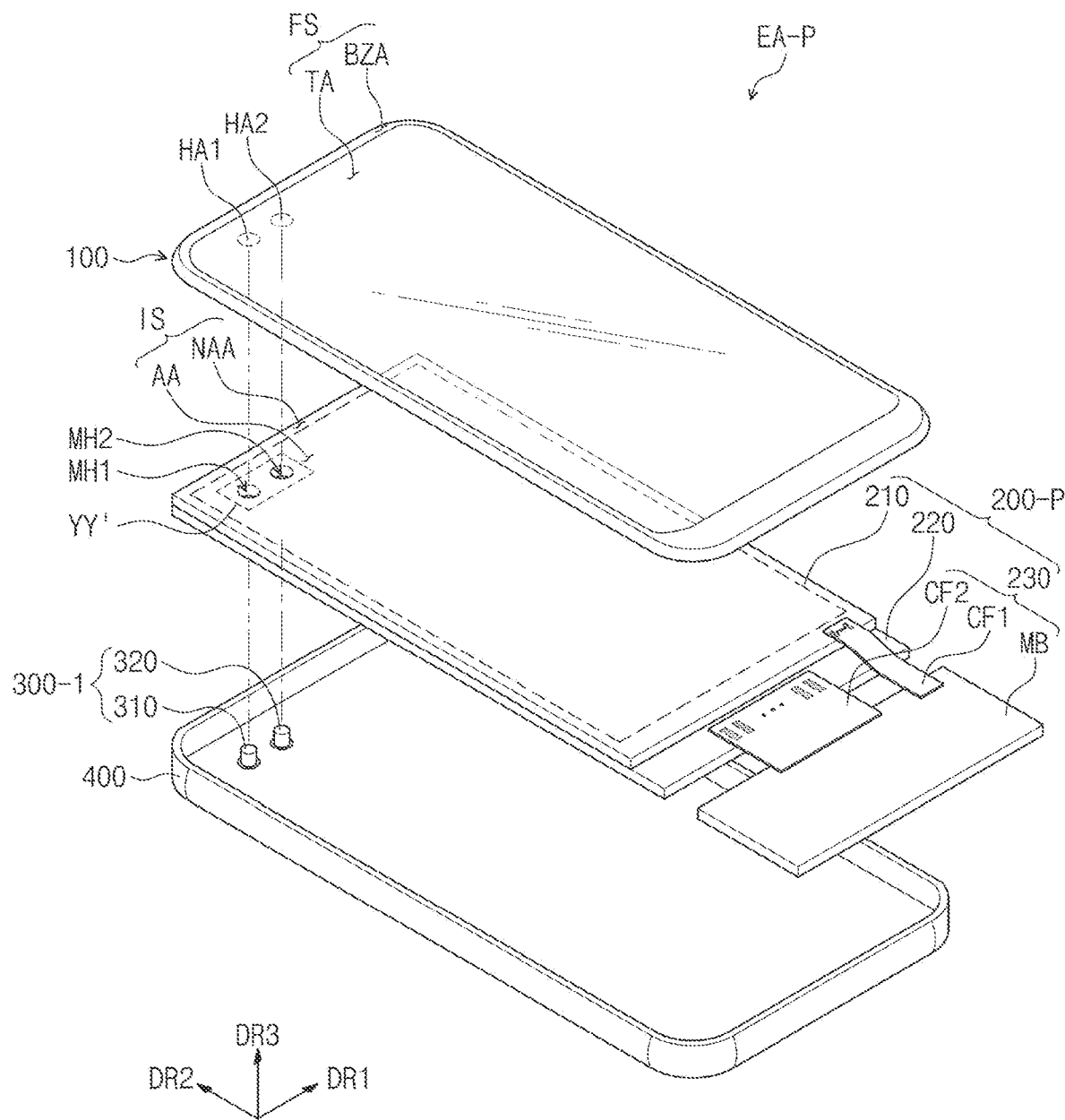
FIG. 13A is an exploded perspective view of an electronic device according to an embodiment of the present disclosure.
Figure 13B:
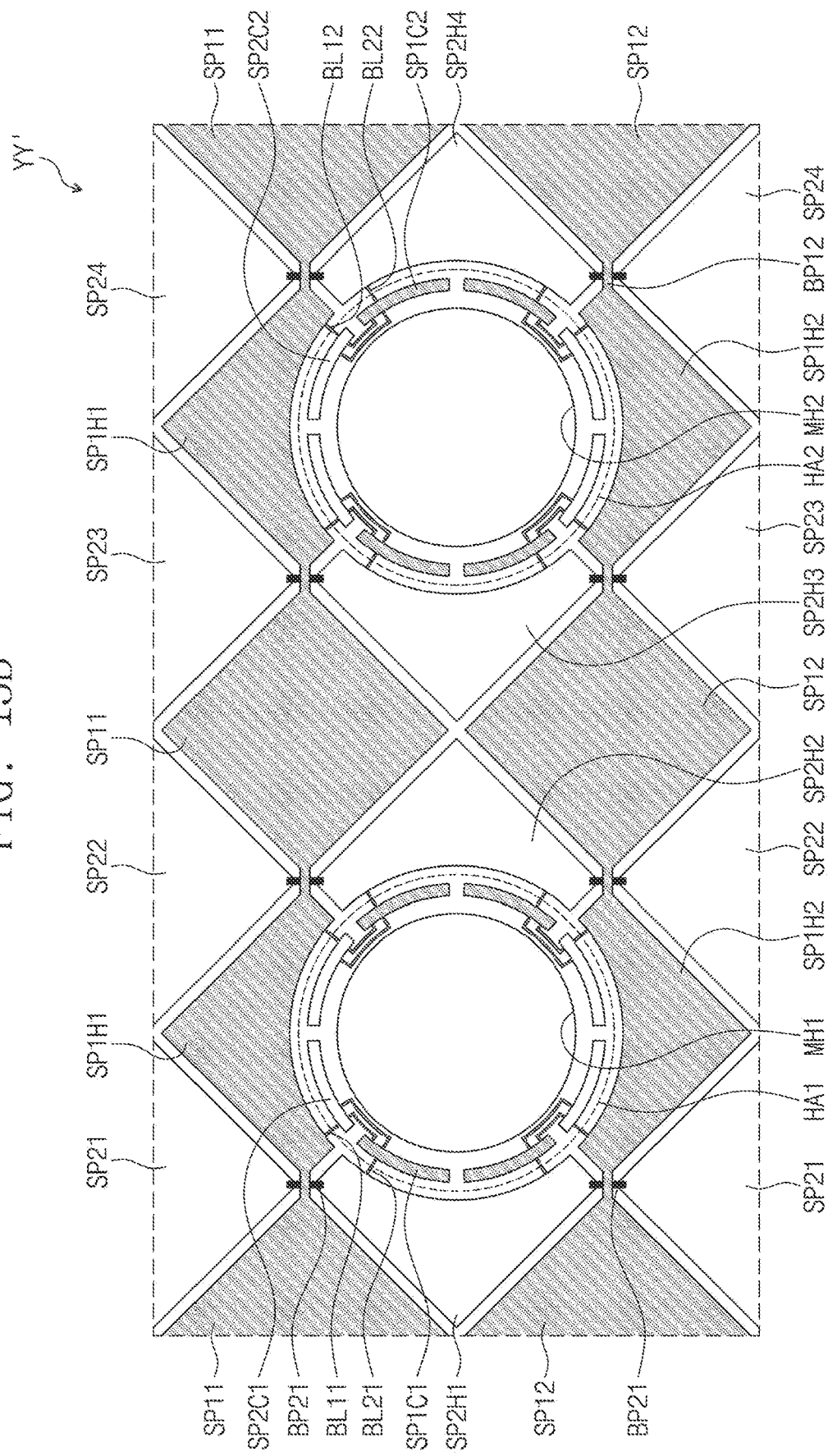
FIG. 13B is a plan view showing a partial configuration of FIG. 13A.

FIG. 13A is an exploded perspective view of an electronic device EA-P according to an embodiment of the present disclosure. FIG. 13B is a plan view showing a partial configuration of FIG. 13A FIG. 13B shows the YY' area shown in FIG. 13A for ease of explanation, and a portion of the configuration is omitted. Hereinafter, the present disclosure will be described with reference to FIGS. 13A and 13B. Moreover, components similar to those described in FIGS. 1A to 12E are given the same reference numerals and will be understood to have similar descriptions.

As shown FIG. 13A, the electronic device EA-P may include an electronic panel 200-P having a plurality of holes MH1, MH2 defined therein. The holes MH1 and MH2 include a first hole MH1 and a second hole MH2. The first hole MH1 and the second hole MH2 are shown as being spaced apart from each other in the first direction DR1.

The electronic module 300-1 may include a first module 310 and a second module 320. The first module 310 overlaps the first hole MH1 and the second module 320 overlaps the second hole MH2. Even though the first module 310 is disposed overlapping the active area AA, it may be exposed through the first hole MH1, so that it is possible to receive an external signal through the first hole area HA1 or to provide the processed signal to the outside. In addition, even though the second module 320 is disposed overlapping the active area AA, it may be exposed through the second hole MH2, so that it is possible to receive an external signal through the second hole area HA2 or to provide the processed signal to the outside.

In FIG. 13B, some configurations of the input sensing unit 220 in area YY' are shown. According to this embodiment, a plurality of first main patterns SP11 and SP12, a plurality of first adjacent patterns SP1H1 and SP1 H2, a plurality of first connecting patterns BP12, a plurality of first compensation patterns SP1C1 and SP1C2, and a plurality of first connection lines BL11 and BL12 constitute first sensing electrodes forming two rows. In addition, a plurality of second main patterns SP21, SP22, SP23, and SP24, a plurality of second adjacent patterns SP2H1, SP2H2, SP2H3, and SP2H4, a plurality of second connection patterns BP21, a plurality of second compensation patterns SP2C1 and SP2C2, and the plurality of second connection lines BL21 and BL22 constitute second sensing electrodes forming four columns.

In this embodiment, the first and second compensation patterns SP1C1 and SP1C2 are shown in the shape and arrangement corresponding to the first and second compensation patterns SP1C and SP2C shown in FIG. 5A. In some embodiments, the arrangement and shape of the compensation patterns arranged in the first hole area HA1 and the second hole area HA2 may be different from each other and are not limited to any one embodiment. According to the present disclosure, even though the holes MH1 and MH2 are provided, the detection areas detecting the external input through the compensation patterns SP1C1 and SP1C2 may be provided to the hole areas HA1 and HA2. Also, even if a portion of the area of the sensing electrodes is reduced by the holes MH1 and MH2 through the compensation patterns SP1C1 and SP1C2, it may be easily compensated. Accordingly, the electronic device EA-P may have even sensitivity over the entire active area AA.

Figure 14A:
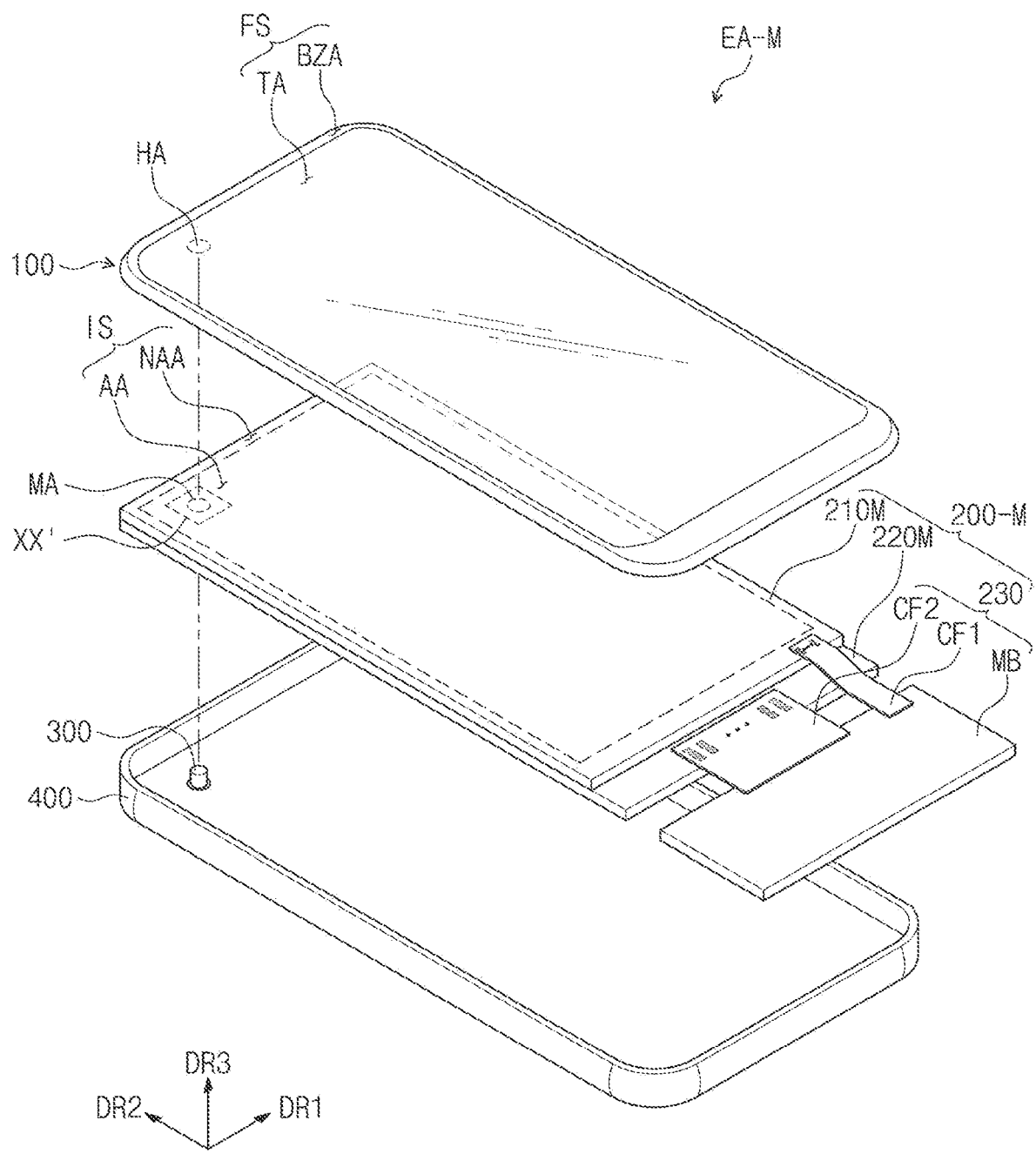
FIG. 14A is an exploded perspective view of an electronic device according to an embodiment of the present disclosure.
Figure 14B:
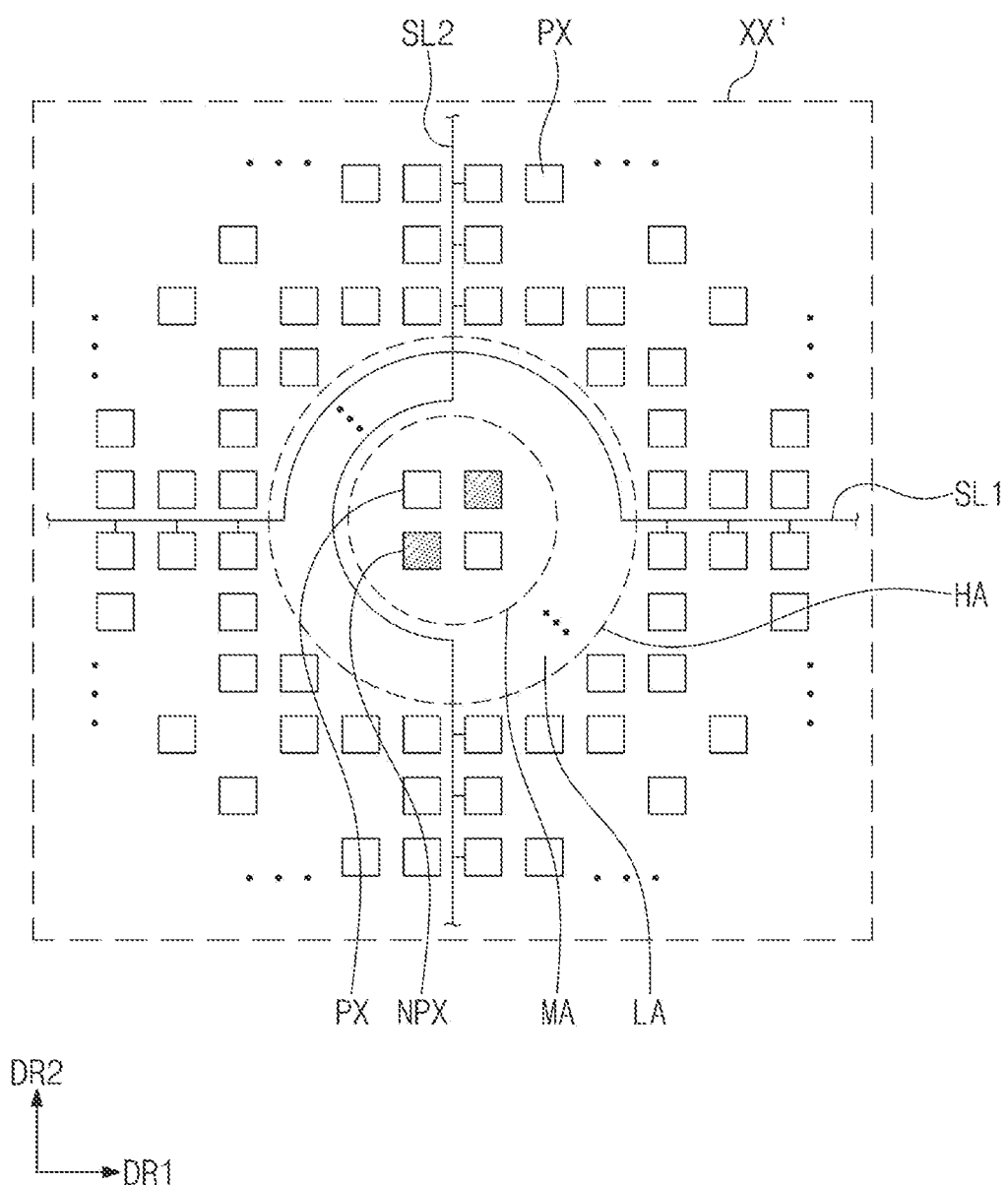
FIG. 14B is a plan view schematically showing an area XX' shown in FIG. 14A.
Figure 15A:
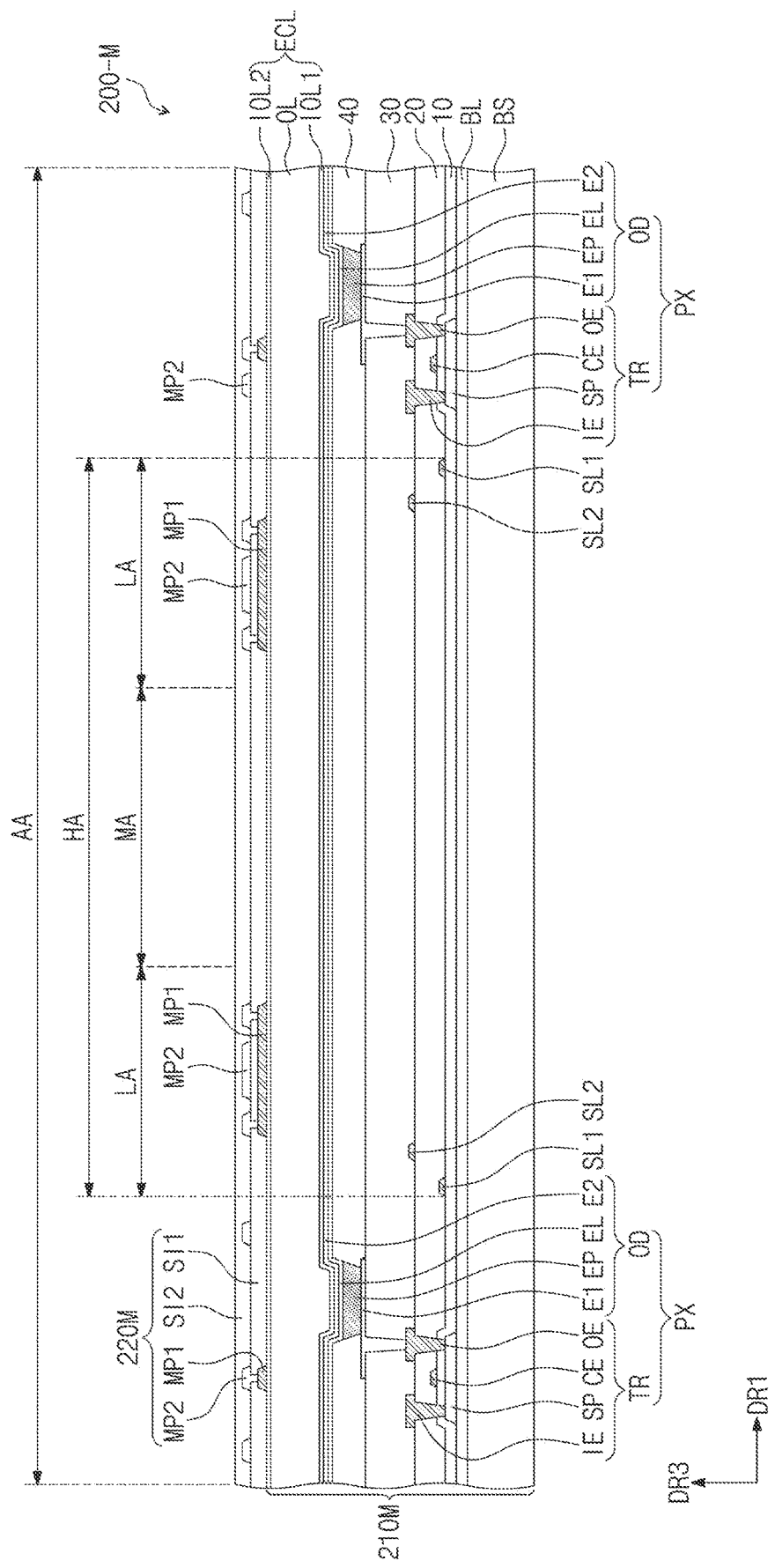
FIGS. 15A and 15B are cross-sectional views of an electronic panel according to an embodiment of the present disclosure.
Figure 15B:
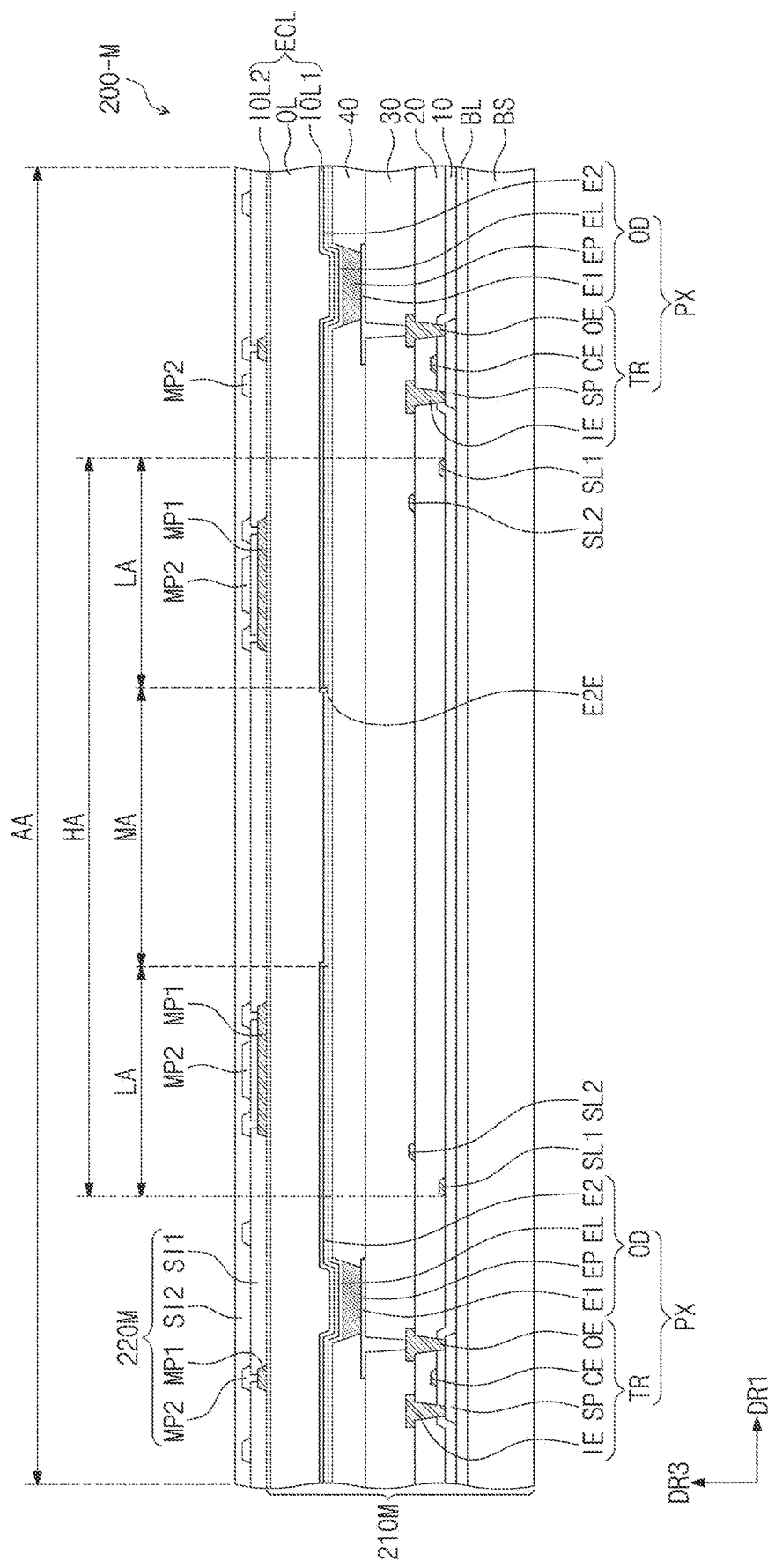

FIG. 14A is an exploded perspective view of an electronic device EA-M according to an embodiment of the present disclosure, and FIG. 14B is a plan view schematically illustrating an area XX' shown in FIG. 14A. FIGS. 15A and 15B are cross-sectional views of an electronic panel according to an embodiment of the present disclosure. FIGS. 15A and 15B show areas corresponding to FIG. 3B. Hereinafter, the present disclosure will be described with reference to FIGS. 14A to 15B. Moreover, components similar to those described in FIGS. 1A to 13B are given the same reference numerals and will be understood to have similar descriptions.

In an electronic device EA-M according to an embodiment of the present disclosure, the electronic panel 200-M may include a display unit 210M, a detection unit 220M, a drive circuit 230, and a module area MA overlapping the electronic module 300. In this embodiment, the module area MA is defined in the active area AA. The module area MA may overlap the hole area HA of the window member 100 described above.

The above-described wiring area LA may be defined along the edge of the module area MA. The wiring area LA may surround the edge of the module area MA. The hole area HA may correspond to an area including the module area MA and the wiring area LA.

In this embodiment, the module area MA may have a shape corresponding to the holes MH described above. For example, the module area MA may have any suitable shape, such as a circle, an ellipse, a polygon, or a polygon including curved sides on at least one side in a plan view, and is not limited to any one embodiment.

The module area MA may be an area having a relatively high transmittance as compared with an area in which the pixels PX are disposed in the active area AA. The electronic module 300 may detect an external object through the module area MA or may easily provide the outputted optical signal to the outside.

At least one non-light emitting pixel NPX may be disposed in the module area MA according to the present embodiment. FIG. 14B shows two non-light emitting pixels NPX and two pixels PX for ease of explanation. The non-light emitting pixel NPX may have a higher light transmittance than the pixel PX. The non-light emitting pixel NPX may be formed by removing at least a portion of the configuration of the pixel PX.

For example, the non-light emitting pixel NPX may be formed by removing the thin film transistor TR and the light emitting pattern EP from the pixel PX. Alternatively, the non-light emitting pixel NPX may be formed by removing only the light emitting pattern EP in the configuration of the pixel PX, or by removing a partial configuration of the thin film transistors TR or by removing only the first electrode E1. Alternatively, the non-light emitting pixel NPX may be formed by removing all the components of the pixel PX. At this time, the non-light emitting pixel NPX may be defined as a portion in which a plurality of insulating layers are stacked.

The non-light emitting pixel NPX according to an embodiment of the present disclosure may include various suitable embodiments as long as it has a higher transmittance than the pixel PX. Also, if the module area MA may have a relatively high transmittance relative to its surroundings, it may be composed of a plurality of pixels PX and one non-light emitting pixel NPX, or it may be filled with only a plurality of non-light emitting pixels NPX, but is not limited to any one embodiment.

For example, as shown in FIG. 15A, the module area MA may be formed by removing the thin film transistor TR, the first electrode E1, and the light emitting pattern EP of the pixel PX. In the module area MA, the insulating layers may be formed as continuously extending. The base substrate BS, the auxiliary layer BL, the first to fourth insulating layers 10, 20, 30, and 40, the organic layer EL, the sealing layer ECL, and the detection insulating layer SI1 and SI2 may overlap the module area MA without being disconnected in the hole area HA. The base substrate BS, the auxiliary layer BL, the first to fourth insulating layers 10, 20, 30, and 40, the control layer EL, the sealing layer ECL, and the detection insulating layer SI1 and SI2 may be formed on the front surface in the active area AA through the module area MA.

In the present embodiment, the second electrode E2 may also be formed overlapping the module area MA. When the second electrode E2 is formed of a transmissive or semi-transmissive electrode, even if the second electrode E2 overlaps the module area MA, the module area MA having a relatively high transmittance may be formed as compared with the area where the pixels PX are arranged.

In this embodiment, the insulating layers SI1 and SI2 of the detection unit 220M may overlap the module area MA. The insulating layers SI1 and SI2 cover the module area MA and may be provided in an integral shape on the front surface of the active area AA. The patterns constituting the compensation patterns SP1C and SP2C and the connection lines BL1 and BL2 among the conductive patterns MP1 and MP2 may be disposed in the wiring area LA and may surround the edge of the module area MA in a plan view. The conductive patterns MP1 and MP2 are disposed along the edge of the module area MA to improve the transmittance of the module area MA.

For example, as shown in FIG. 15B, the module area MA may be formed by removing the second electrode E2 of the configuration of the pixel PX. The second electrode E2 may be provided with an end part E2E defining an opening overlapping the module area MA.

Accordingly, even if the second electrode E2 is formed as a non-transmissive electrode, a module area MA having an improved transmittance may be provided. Further, even if the second electrode E2 is formed as a semi-transparent electrode, a module area MA having a relatively high transmittance as compared with the electronic panel shown in FIG. 15A may be provided.

According to embodiments of the present disclosure, a signal input/output between an electronic module that does not require high transmittance through the module area MA formed by removing the non-transparent structures, for example, an electronic module using infrared rays, may be easily performed. Even if the electronic module 300 is disposed overlapping the electronic panel 200-M, signal input/output with the outside may be stably performed. In addition, in relation to the electronic panel 200-M, the upper part of the electronic module 300 is covered by the electronic panel 200-M, so that the electronic module 300 may be stably protected from external shocks or contamination inflows.

According to the present disclosure, it is possible to prevent the sensitivity deterioration of the detection unit with respect to an external input by holes in an active area in which a predetermined hole is defined. Further, it is possible to provide a detection area having a uniform sensitivity over the entire active area including the holes.

As used herein, the terms "use", "using", and "used" may be considered synonymous with the terms "utilize", "utilizing", and "utilized", respectively. Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although example embodiments of the present disclosure have been described, it is understood that the present disclosure should not be limited to these example embodiments, but that various changes and modifications may be made by one having ordinary skill in the art within the spirit and scope of the present disclosure, as defined by the following claims and equivalents thereof.

What is claimed is:
1. An electronic device comprising:
   a base substrate defining an active area configured to display an image, and a hole area and a non-active area adjacent to the active area;
   a display element to display the image, the display element being on the base substrate;
   an encapsulation layer comprising inorganic layers, and an organic layer between the inorganic layers and covering the display element; and
   a sensing layer comprising first sensing electrodes and second sensing electrodes insulated from each other, the sensing layer being on the encapsulation layer;
   wherein an opening penetrates through the base substrate, the encapsulation layer, and the sensing layer, the opening overlapping the hole area, wherein the second sensing electrodes comprise adjacent second sensing electrodes crossing the opening, each of the adjacent second sensing electrodes comprising:
- a main pattern;
- an adjacent pattern adjacent to the opening and having an area smaller than that of the main pattern;
- a compensation pattern in the hole area and surrounding at least a portion of the opening; and
- a connection line connecting the adjacent pattern and the compensation pattern.

2. The electronic device of claim 1, wherein the compensation patterns of the adjacent second sensing electrodes are spaced from each other in the hole area and surround the opening.

3. The electronic device of claim 2, wherein each of the compensation patterns of the adjacent second sensing electrodes has a semicircular shape.

4. The electronic device of claim 2, wherein the compensation patterns of the adjacent second sensing electrodes are symmetrical about the opening.

5. The electronic device of claim 2, wherein areas of the compensation patterns of the adjacent second sensing electrodes are different from each other.

6. The electronic device of claim 1, wherein the main patterns, the adjacent patterns, the compensation patterns, and the connection lines of the adjacent second sensing electrodes are located at a same layer.

7. The electronic device of claim 6, wherein each of the first sensing electrodes comprises sensing patterns and bridge patterns between adjacent ones of the sensing patterns, and
the sensing patterns are a same layer as the compensation patterns of the adjacent second sensing electrodes, and
the bridge patterns are at a different layer from the compensation patterns of the adjacent second sensing electrodes.

8. The electronic device of claim 7, wherein the sensing layer further comprises:
- a first sensing insulating layer on which the bridge patterns are located, the first sensing insulating layer being in direct contact with the encapsulation layer; and
- a second sensing insulating layer on which the sensing patterns and the second sensing electrodes are located, the second sensing insulating layer being on the first sensing insulating layer.

9. The electronic device of claim 7, wherein each of the sensing patterns of the first sensing electrodes, the main patterns of the adjacent second sensing electrodes, and the adjacent patterns of the adjacent second sensing electrodes comprises a plurality of mesh lines.

10. The electronic device of claim 1, wherein the first sensing electrodes comprise adjacent first sensing electrodes crossing the opening, each of the adjacent first sensing electrodes comprising:
- a main pattern;
- an adjacent pattern adjacent to the opening and having an area smaller than that of the main pattern;
- a compensation pattern in the hole area and surrounding at least a portion of the opening; and
- a connection line connecting the adjacent pattern and the compensation pattern.

11. The electronic device of claim 10, wherein at least one of the compensation patterns of the adjacent first sensing electrodes and at least one of the compensation patterns of the adjacent second sensing electrodes surround the opening and are spaced from each other.

12. The electronic device of claim 10, wherein a portion of at least one of the connection lines of the adjacent first sensing electrodes and at least one of the compensation patterns of the adjacent second sensing electrodes overlap each other in a plan view, and
the at least one connection line of the adjacent first sensing electrodes and at least one of the connection lines of the adjacent second sensing electrodes are located at different layers.

13. The electronic device of claim 10, wherein a portion of at least one of the connection lines of the adjacent second sensing electrodes and at least one of the compensation patterns of the adjacent first sensing electrodes overlap each other in a plan view, and
the connection line of the adjacent first sensing electrodes and at least one of the connection lines of the adjacent second sensing electrodes are located at different layers.

14. The electronic device of claim 1, wherein the opening has a rectangular shape in a plan view, and the compensation patterns of the adjacent second sensing electrodes surround at least a portion of the opening.

15. The electronic device of claim 1, further comprising an electronic module that overlaps the opening,
wherein the electronic module comprises at least one selected from an image input module, an image output module, an optical detection module, and an optical output module.

* * * * *